(12) United States Patent
Yamazaki et al.

(10) Patent No.: US 8,912,541 B2
(45) Date of Patent: Dec. 16, 2014

(54) SEMICONDUCTOR DEVICE AND METHOD FOR MANUFACTURING THE SAME

(75) Inventors: Shunpei Yamazaki, Setagaya (JP); Junichiro Sakata, Atsugi (JP); Miyuki Hosoba, Isehara (JP); Eriko Nishida, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 539 days.

(21) Appl. No.: 12/848,397

(22) Filed: Aug. 2, 2010

(65) Prior Publication Data
US 2011/0031497 A1    Feb. 10, 2011

(30) Foreign Application Priority Data

Aug. 7, 2009 (JP) ................................. 2009-185315

(51) Int. Cl.
*H01L 29/12* (2006.01)
*H01L 27/12* (2006.01)
*H01L 29/45* (2006.01)

(52) U.S. Cl.
CPC ............ *H01L 29/45* (2013.01); *H01L 27/1214* (2013.01); *H01L 27/1225* (2013.01)
USPC .......... 257/59; 257/43; 257/72; 257/E33.002; 257/E33.013

(58) Field of Classification Search
USPC ........... 257/43, 49, 51, 52, 53, 57, 59, 61, 66, 257/70, 71, 72, 80, 288, 290, 291, 292, 390, 257/391, 392, E33.002, E33.013
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 001399161 | 2/2003 |
| CN | 001892387 | 1/2007 |

(Continued)

OTHER PUBLICATIONS

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

(Continued)

*Primary Examiner* — Eduardo A Rodela
(74) *Attorney, Agent, or Firm* — Eric J. Robinson; Robinson Intellectual Property Law Office, P.C.

(57) ABSTRACT

One object of the present invention is to increase an aperture ratio of a semiconductor device. A pixel portion and a driver circuit are provided over one substrate. The first thin film transistor (TFT) in the pixel portion includes: a gate electrode layer over the substrate; a gate insulating layer over the gate electrode layer; an oxide semiconductor layer over the gate insulating layer; source and drain electrode layers over the oxide semiconductor layer; over the gate insulating layer, the oxide semiconductor layer, the source and drain electrode layers, a protective insulating layer which is in contact with part of the oxide semiconductor layer; and a pixel electrode layer over the protective insulating layer. The pixel portion has light-transmitting properties. Further, a material of source and drain electrode layers of a second TFT in the driver circuit is different from a material of those of the first TFT.

20 Claims, 45 Drawing Sheets

(56) References Cited

U.S. PATENT DOCUMENTS

| | | | |
|---|---|---|---|
| 6,261,881 B1 * | 7/2001 | Yamazaki et al. | 438/161 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,738,109 B2 * | 5/2004 | Jeon | 349/43 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,092,047 B2 | 8/2006 | Jeon | |
| 7,105,868 B2 | 9/2006 | Nause et al. | |
| 7,151,276 B2 * | 12/2006 | Gerlach et al. | 257/40 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 * | 3/2010 | Akimoto et al. | 438/104 |
| 7,704,859 B2 | 4/2010 | Sato | |
| 7,719,185 B2 | 5/2010 | Jin et al. | |
| 7,732,819 B2 | 6/2010 | Akimoto et al. | |
| 7,745,798 B2 | 6/2010 | Takahashi | |
| 7,872,259 B2 | 1/2011 | Den et al. | |
| 7,910,490 B2 | 3/2011 | Akimoto et al. | |
| 7,932,521 B2 | 4/2011 | Akimoto et al. | |
| 8,212,252 B2 | 7/2012 | Den et al. | |
| 8,232,551 B2 * | 7/2012 | Kim et al. | 257/43 |
| 8,232,552 B2 | 7/2012 | Yano et al. | |
| 8,274,077 B2 | 9/2012 | Akimoto et al. | |
| 8,461,583 B2 | 6/2013 | Yano et al. | |
| 8,466,463 B2 | 6/2013 | Akimoto et al. | |
| 8,629,069 B2 | 1/2014 | Akimoto et al. | |
| 8,669,550 B2 | 3/2014 | Akimoto et al. | |
| 8,723,175 B2 | 5/2014 | Yano et al. | |
| 2001/0030323 A1 | 10/2001 | Ikeda | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0232421 A1 | 11/2004 | Ono et al. | |
| 2005/0017302 A1 | 1/2005 | Hoffman | |
| 2005/0179964 A1 * | 8/2005 | Izumi | 358/483 |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0002199 A1 | 1/2007 | Fujikawa et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0057261 A1 | 3/2007 | Jeong et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252145 A1 | 11/2007 | Toyota et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0057631 A1 | 3/2008 | Cheng et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0157081 A1 | 7/2008 | Huh | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0246033 A1 * | 10/2008 | Huh et al. | 257/59 |
| 2008/0254569 A1 | 10/2008 | Hoffman et al. | |
| 2008/0258139 A1 | 10/2008 | Ito et al. | |
| 2008/0258140 A1 * | 10/2008 | Lee et al. | 257/43 |
| 2008/0258141 A1 | 10/2008 | Park et al. | |
| 2008/0258143 A1 | 10/2008 | Kim et al. | |
| 2008/0291350 A1 | 11/2008 | Hayashi et al. | |
| 2008/0296568 A1 | 12/2008 | Ryu et al. | |
| 2008/0308796 A1 | 12/2008 | Akimoto et al. | |
| 2008/0308797 A1 | 12/2008 | Akimoto et al. | |
| 2008/0308805 A1 | 12/2008 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0140438 A1 | 6/2009 | Yamazaki et al. | |
| 2009/0152506 A1 | 6/2009 | Umeda et al. | |
| 2009/0152541 A1 | 6/2009 | Maekawa et al. | |
| 2009/0189155 A1 | 7/2009 | Akimoto | |
| 2009/0189156 A1 | 7/2009 | Akimoto | |
| 2009/0225251 A1 * | 9/2009 | Kaitoh et al. | 349/46 |
| 2009/0278122 A1 | 11/2009 | Hosono et al. | |
| 2009/0280600 A1 | 11/2009 | Hosono et al. | |
| 2009/0283762 A1 | 11/2009 | Kimura | |
| 2009/0305461 A1 | 12/2009 | Akimoto et al. | |
| 2010/0044696 A1 * | 2/2010 | Cheng et al. | 257/40 |
| 2010/0044701 A1 | 2/2010 | Sano et al. | |
| 2010/0059751 A1 | 3/2010 | Takahashi et al. | |
| 2010/0065844 A1 | 3/2010 | Tokunaga | |
| 2010/0084648 A1 | 4/2010 | Watanabe | |
| 2010/0092800 A1 | 4/2010 | Itagaki et al. | |
| 2010/0109002 A1 | 5/2010 | Itagaki et al. | |
| 2010/0136743 A1 | 6/2010 | Akimoto et al. | |
| 2011/0012112 A1 | 1/2011 | Yamazaki et al. | |
| 2011/0012116 A1 | 1/2011 | Yamazaki et al. | |
| 2011/0017928 A1 * | 1/2011 | Den et al. | 257/59 |
| 2011/0031492 A1 | 2/2011 | Yamazaki et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2013/0313548 A1 | 11/2013 | Yano et al. | |

FOREIGN PATENT DOCUMENTS

| | | |
|---|---|---|
| CN | 101057333 | 10/2007 |
| CN | 101335274 | 12/2008 |
| EP | 1737044 A | 12/2006 |
| EP | 1770788 A | 4/2007 |

(56) References Cited

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-037268 A | 2/2003 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-150158 A | 6/2007 |
| JP | 2007-163467 | 6/2007 |
| JP | 2007-171932 | 7/2007 |
| JP | 2007-316110 A | 12/2007 |
| JP | 2008-243928 A | 10/2008 |
| JP | 2008-281988 A | 11/2008 |
| JP | 2009-075385 A | 4/2009 |
| JP | 2009-158940 A | 7/2009 |
| JP | 2009-265271 | 11/2009 |
| JP | 2010-098280 | 4/2010 |
| WO | WO 2004/114391 | 12/2004 |
| WO | WO-2006/051994 | 5/2006 |
| WO | WO-2008/105347 | 9/2008 |
| WO | WO-2008-126879 | 10/2008 |
| WO | WO-2009/081885 | 7/2009 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Kimizuka et al., "Spinel, YbFe2O4, and Yb2Fe3O7 Types of Structures for Compounds in the In2O3 and Sc2O3-A2O3-BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.

(56) References Cited

OTHER PUBLICATIONS

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System," Journal of Solid State Chemistry, Apr. 1, 1995, vol. 116, No. 1, pp. 170-178.

Nakamura et al., "The Phase Relations in the $In_2O_3$—$Ga_2ZnO_4$—$ZnO$ System at 1350° C.," Journal of Solid State Chemistry, Aug. 1, 1991, vol. 93, No. 2, pp. 298-315.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Lee et al., "Current Status of, Challenges to, and Perspective View of AM-OLED," IDW '06: Proceedings of the 13th International Display Workshops, Dec. 7, 2006, pp. 663-666.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Tsuda et al., "Ultra Low Power Consumption Technologies for Mobile TFT-LCDs," IDW '02: Proceedings of the 9th International Display Workshops, Dec. 4, 2002, pp. 295-298.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Ikeda et al., "Full-Functional System Liquid Crystal Display Using CG-Silicon Technology," SID Digest '04: SID International Symposium Digest of Technical Papers, 2004, vol. 35, pp. 860-863.

Kurokawa et al., "UHF RFCPUs on Flexible and Glass Substrates for Secure RFID Systems," Journal of Solid-State Circuits, 2008, vol. 43, No. 1, pp. 292-299.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Hirao et al., "Novel Top-Gate Zinc Oxide Thin-Film Transistors (ZnO TFTs) for AMLCDs," Journal of the SID, 2007, vol. 15, No. 1, pp. 17-22.

Lee et al., "World's Largest (15-inch) XGA AMLCD Panel using IGZO Oxide TFT," SID Digest '08: SID International Symposium Digest of Technical Papers, May 20, 2008, vol. 39, pp. 625-628.

Park et al., "Challenge to Future Displays: Transparent AM-OLED Driven by PEALD Grown ZnO TFT," IMID '07 Digest, 2007, pp. 1249-1252.

Park et al., "Amorphous Indium—Gallium—Zinc Oxide TFTs and their Application for Large Size AMOLED," AM-FPF '08 Digest of Technical Papers, Jul. 2, 2008, pp. 275-277.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Cho et al., "21.2: AI and Sn-doped Zinc Indium Oxide Thin Film Transistors for AMOLED Back-Plane," SID Digest '09: SID International Symposium Digest of Technical Papers, May 31, 2009, pp. 280-283.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Kitzerow et al., "Observation of Blue Phases in Chiral Networks," Liquid Crystals, 1993, vol. 14, No. 3, pp. 911-916.

Kikuchi et al., "Polymer-Stabilized Liquid Crystal Blue Phases," Nature Materials, Sep. 2, 2002, vol. 1, pp. 64-68.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Park et al., "High performance amorphous oxide thin film transistors with self-aligned top-gate structure," IEDM 09: Technical Digest of International Electron Devices Meeting, Dec. 7, 2009, pp. 191-194.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Dembo et al., "RFCPUs on Glass and Plastic Substrates Fabricated by TFT Transfer Technology," IEDM 05: Technical Digest of International Electron Devices Meeting, Dec. 5, 2005, pp. 1067-1069.

Prins et al., "A Ferroelectric Transparent Thin-Film Transistor," Appl. Phys. Lett. (Applied Physics Letters), Jun. 17, 1996, vol. 68, No. 25, pp. 3650-3652.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Godo et al. "P-9: Numerical analysis on Temperature Dependence of Characteristics of Amorphous In—Ga—Zn—Oxide TFT," SID Digest '09: SID International Symposium Digest of Technical Papers, May 31, 2009, pp. 1110-1112.

Osada et al., "Development of Driver-Integrated Panel using Amorphous In—Ga—Zn—Oxide TFT," AM-FPD '09 Digest of Technical Papers, Jul. 1, 2009, pp. 33-36.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Sakata et al., "Development of 4.0-In AMOLED Display with Driver Circuit Using Amorphous In—Ga—Zn—Oxide TFTs," IDW '09: Proceedings of the 16th International Display Workshops, 2009, pp. 689-692.

Transparent Circuit,, Nikkei Electronics, Aug. 27, 2007, No. 959, pp. 39-52.

Chinese Office Action (Application No. 201010248853.9) Dated Mar. 4, 2014.

* cited by examiner

FIG. 1A1
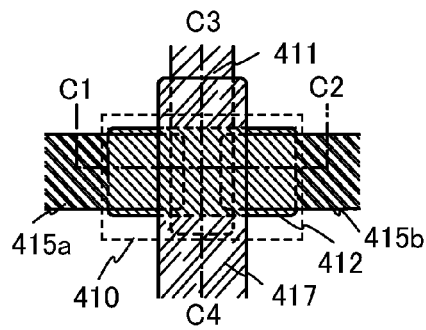
FIG. 1A2
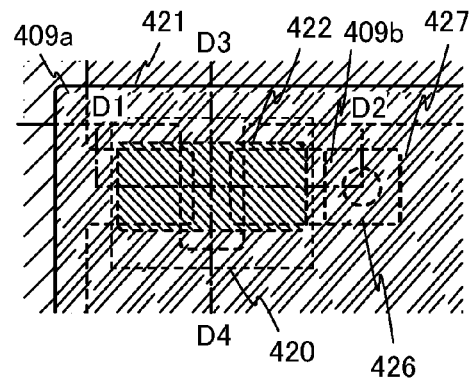
FIG. 1B1
FIG. 1B2
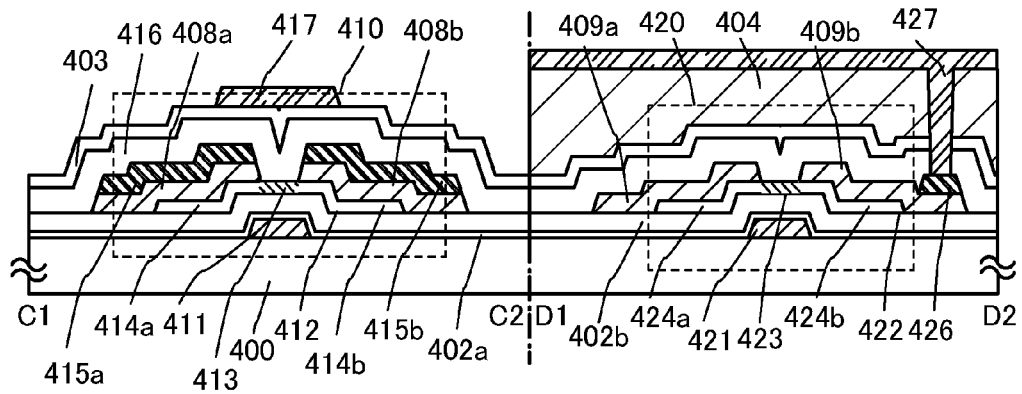
FIG. 1C1
FIG. 1C2
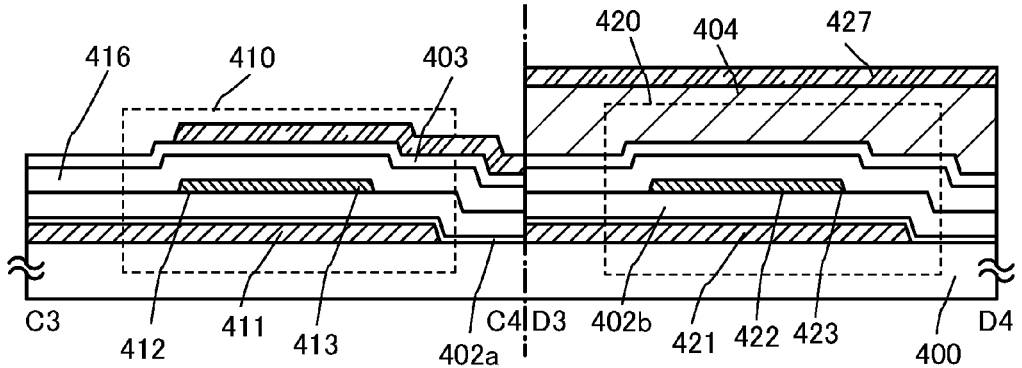

FIG. 6A1
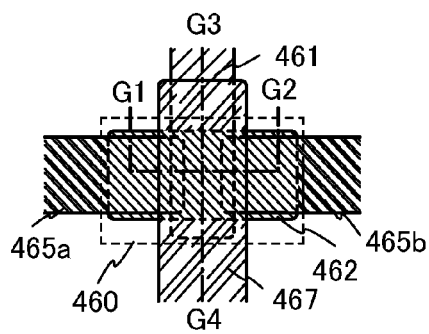
FIG. 6A2
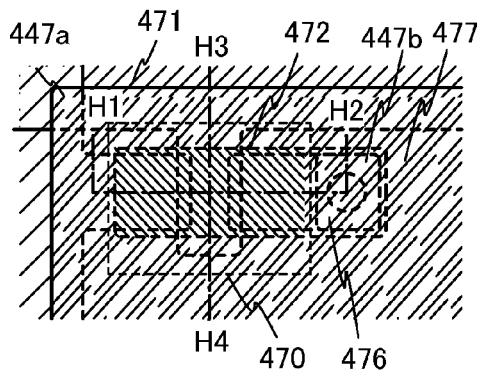
FIG. 6B1
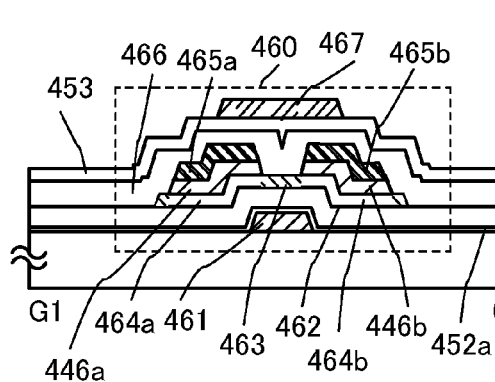
FIG. 6B2
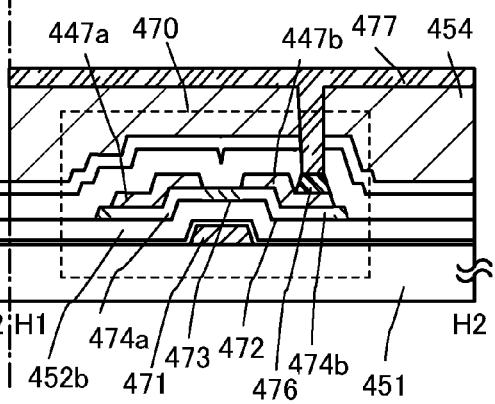
FIG. 6C1
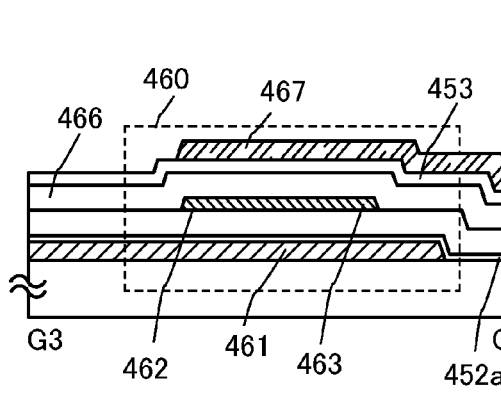
FIG. 6C2
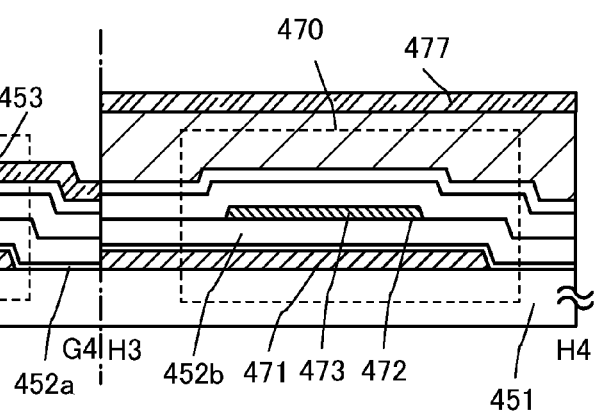

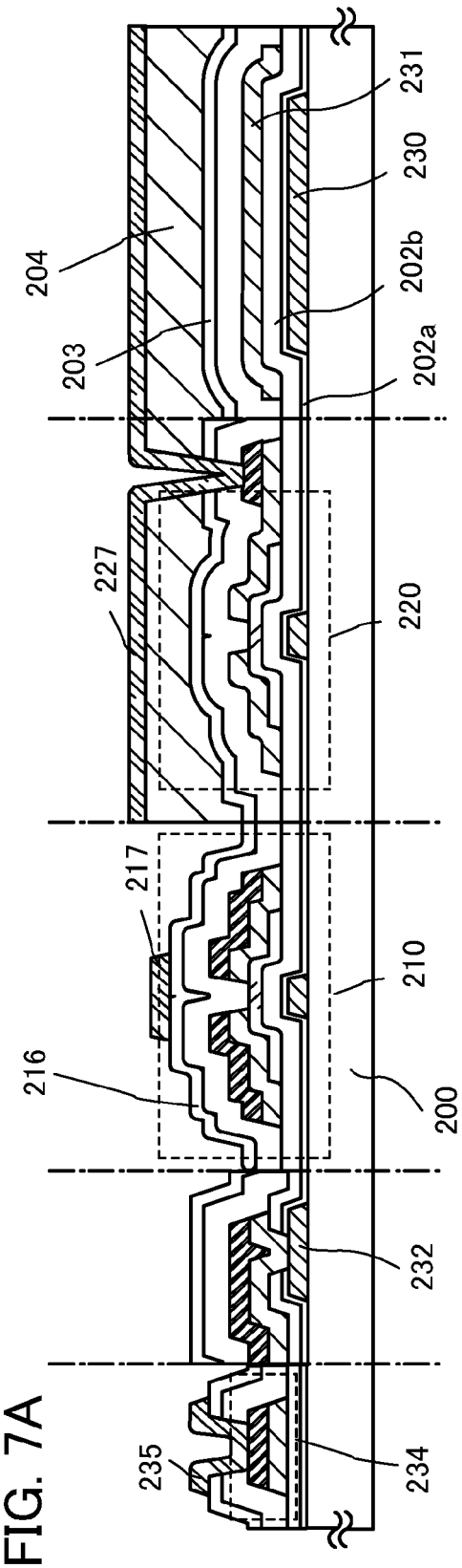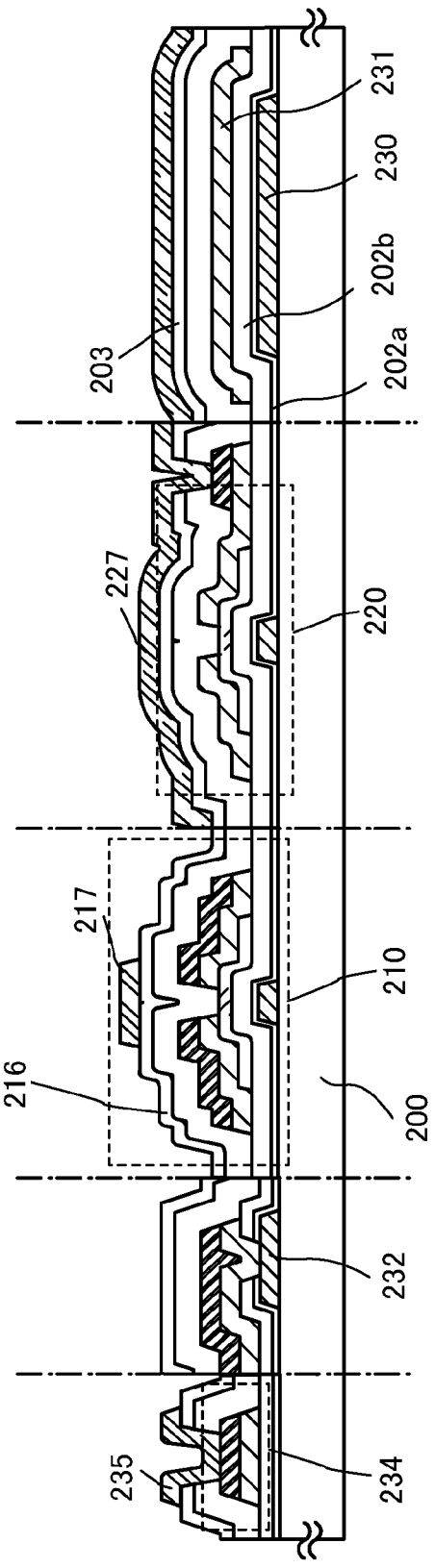

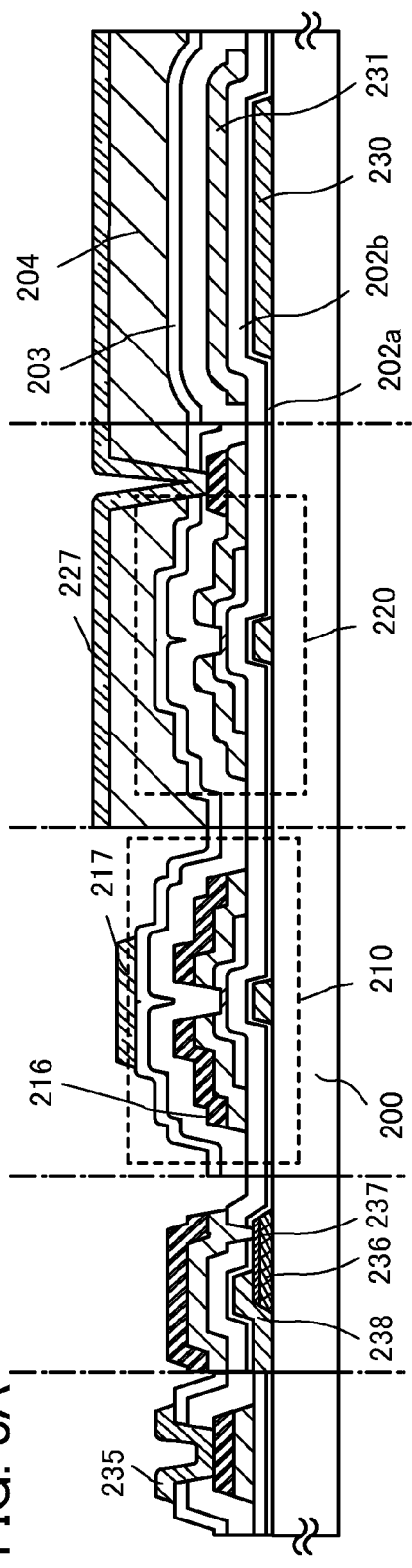
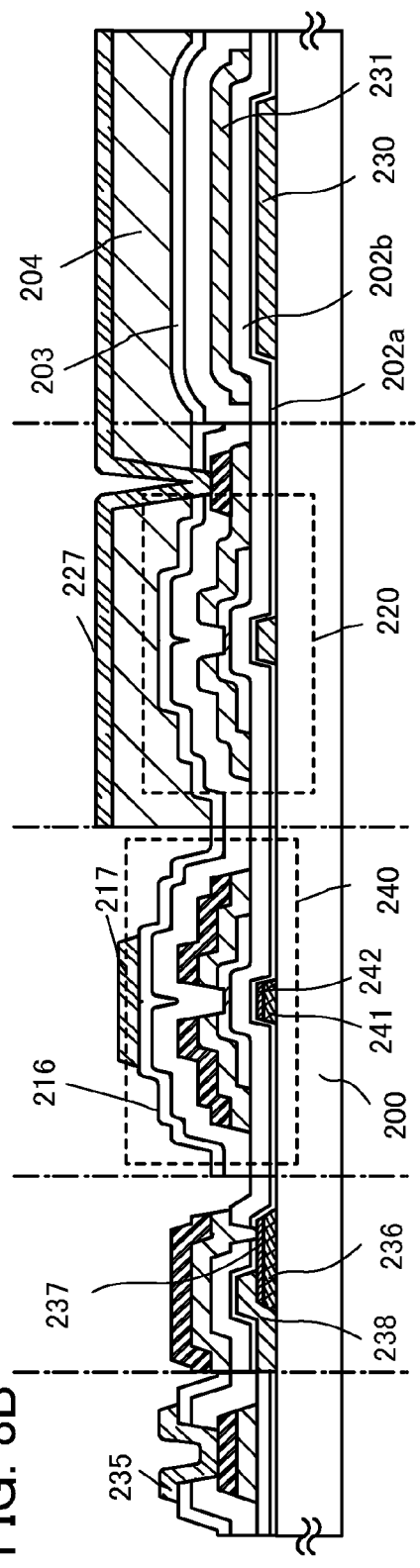
FIG. 8A
FIG. 8B

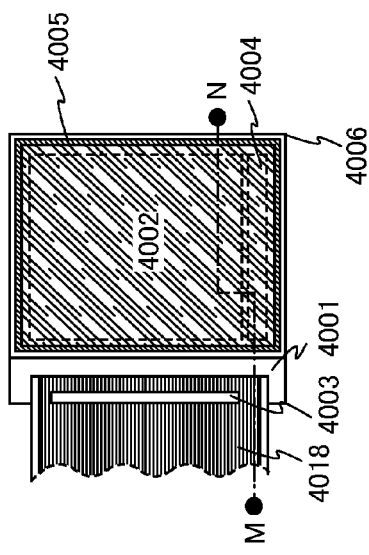
FIG. 10A1
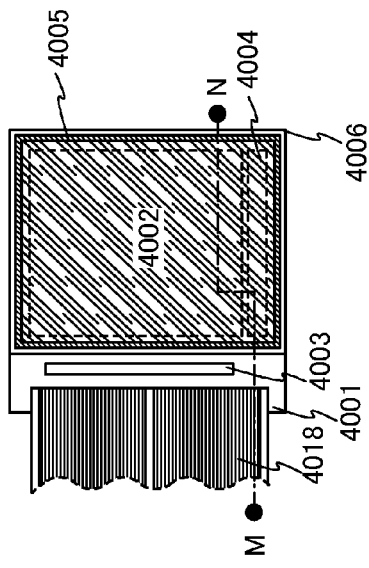
FIG. 10A2
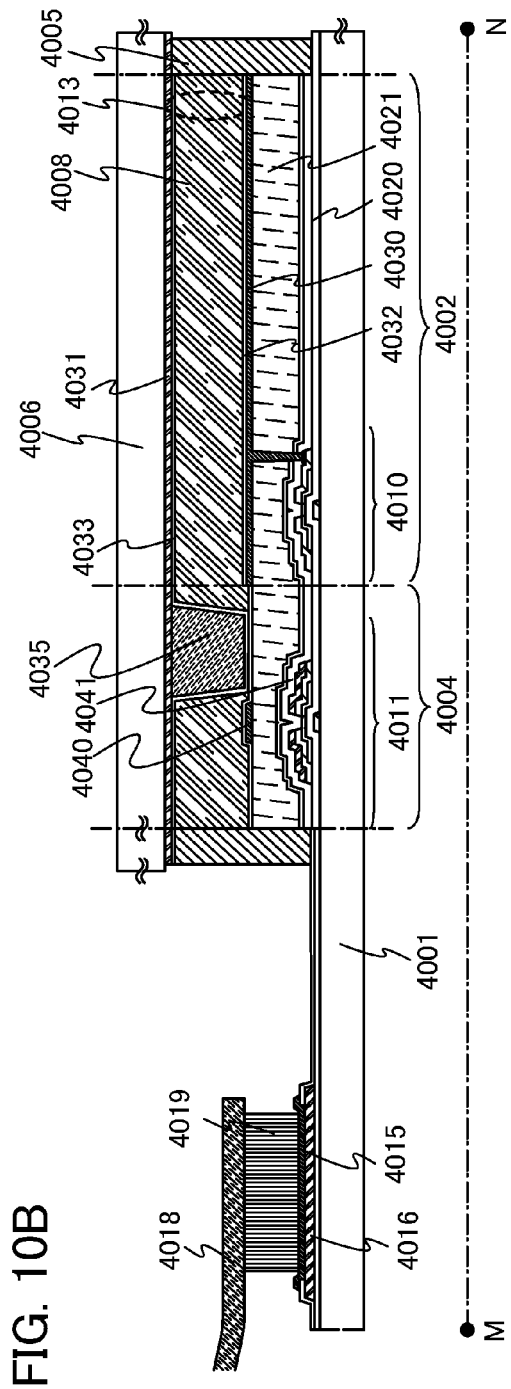
FIG. 10B

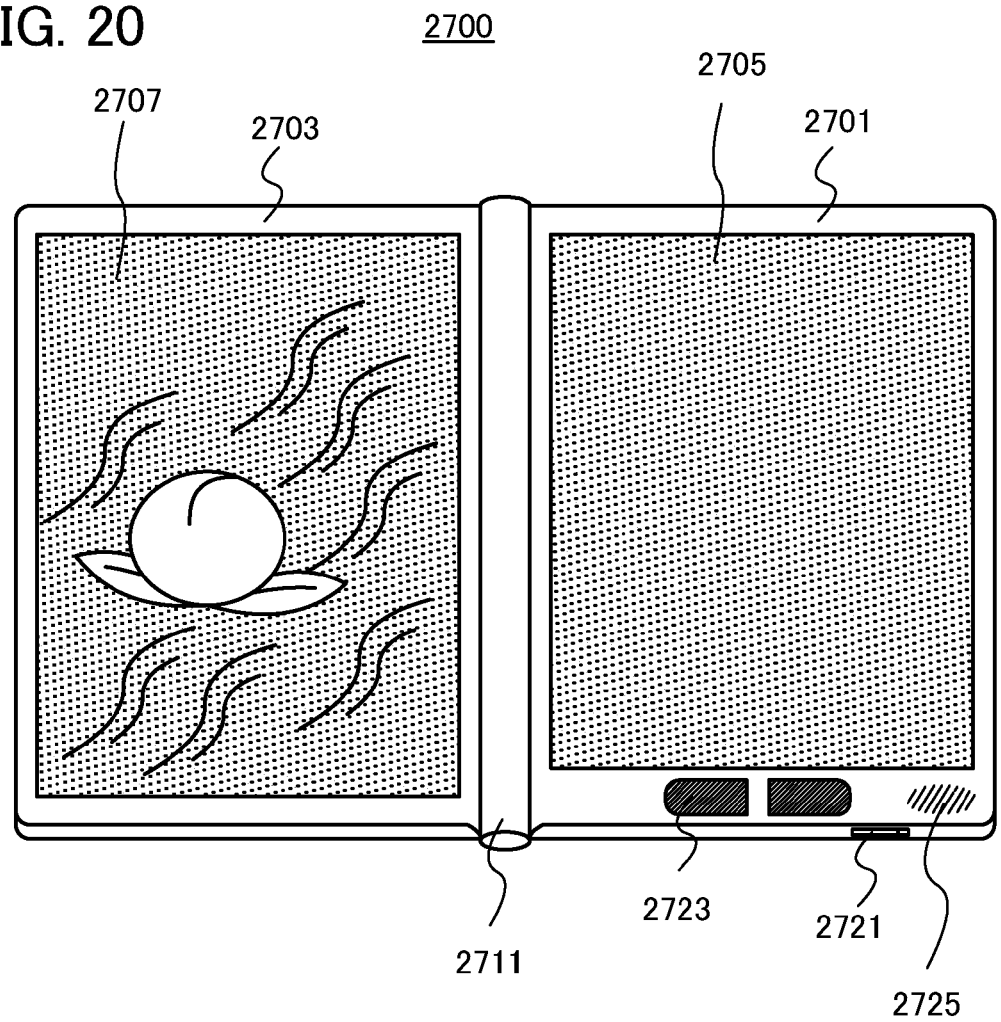

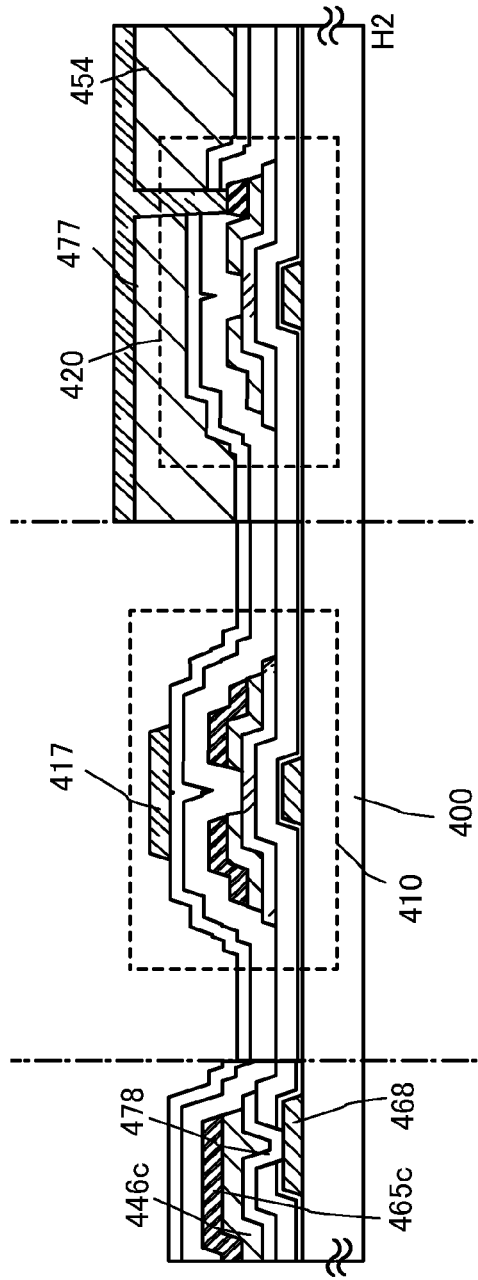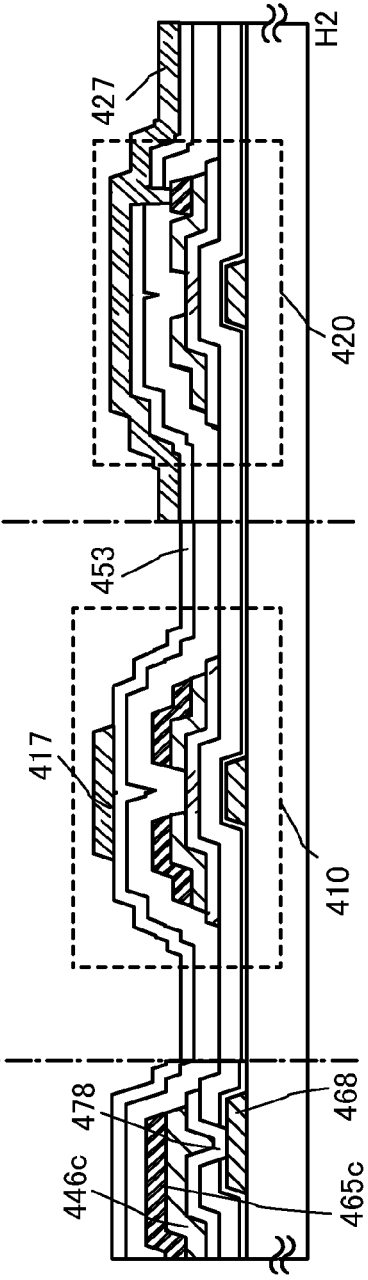

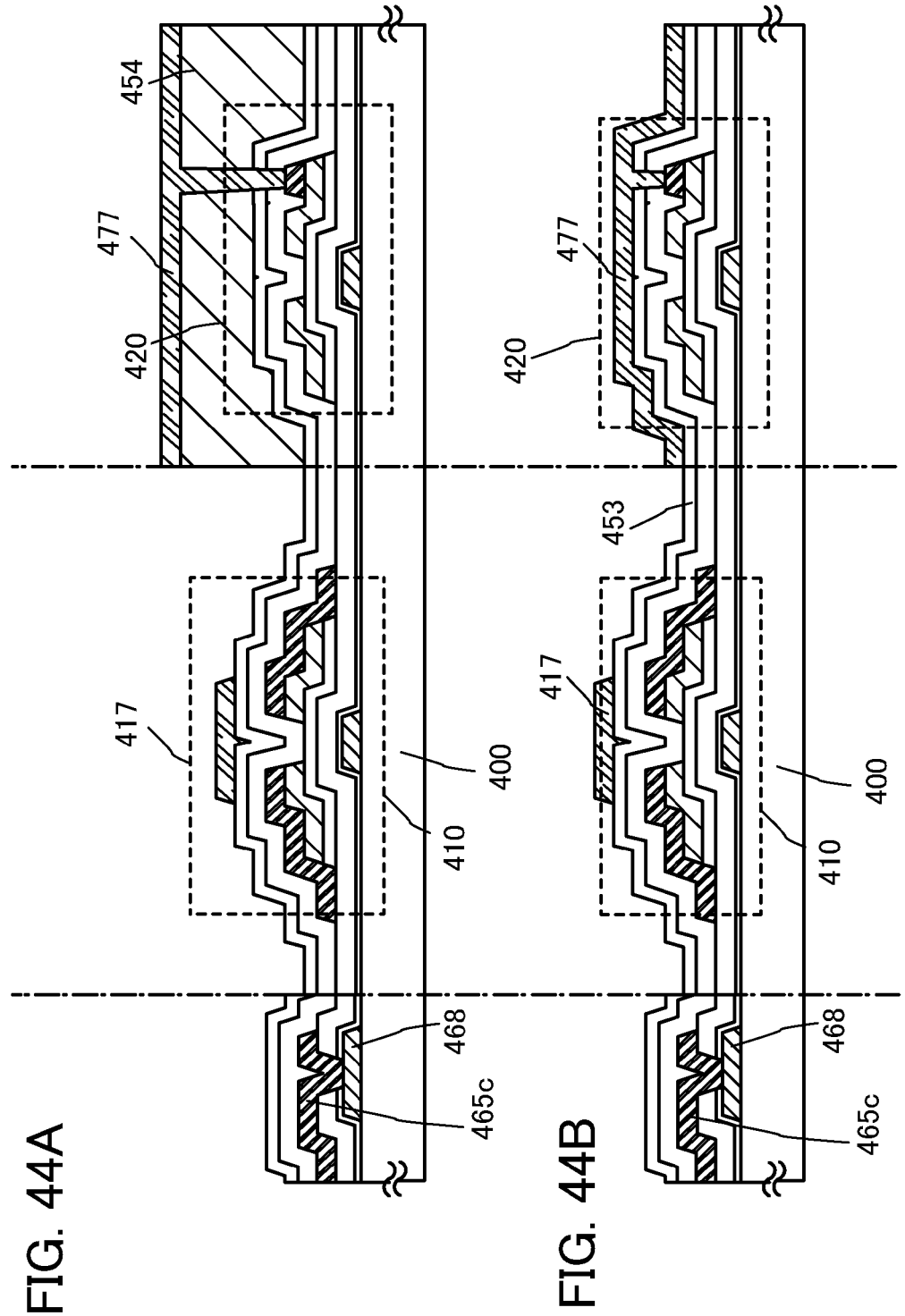

SEMICONDUCTOR DEVICE AND METHOD FOR MANUFACTURING THE SAME

BACKGROUND OF THE INVENTION

1. Field of the Invention

The present invention relates to a semiconductor device including an oxide semiconductor and a method for manufacturing the same.

Note that in this specification, a semiconductor device refers to all devices that can function by utilizing semiconductor properties, and electro-optic devices such as display devices, semiconductor circuits, and electronic devices are all semiconductor devices.

2. Description of the Related Art

A light-transmitting metal oxide is used in a semiconductor device. For example, a conductive metal oxide (hereinafter referred to as an oxide conductor) such as an indium tin oxide (ITO) is used as a transparent electrode material needed in a display device such as a liquid crystal display.

In addition, a light-transmitting metal oxide has been attracting attention as a material having semiconductor properties. For example, an In—Ga—Zn—O-based oxide and the like are expected to be used as a semiconductor material needed in a display device such as a liquid crystal display. In particular, they are expected to be used for a channel layer of a thin film transistor (hereinafter also referred to as a TFT).

A TFT which includes a metal oxide having semiconductor properties (hereinafter referred to as an oxide semiconductor) can be formed through a low-temperature process. Thus, expectations for the oxide semiconductor as a material which replace or surpass amorphous silicon used in a display device and the like have been increased.

Further, both the oxide conductor and the oxide semiconductor have light-transmitting properties. Thus, when a TFT is manufactured using the oxide conductor and the oxide semiconductor, the TFT can have light-transmitting properties (for example, see Non-Patent Document 1).

Further, the TFT in which the oxide semiconductor is used has high field effect mobility. Thus, a driver circuit in a display device or the like can be formed using the TFT (for example, see Non-Patent Document 2).

[Reference]

Non-Patent Document 1: T. Nozawa. "Transparent Circuitry", *Nikkei Electronics* No. 959, Aug. 27, 2007, pp. 39-52.

Non-Patent Document 2: T. Osada et al., "Development of Driver-Integrated Panel using Amorphous In—Ga—Zn—Oxide TFT", *Proc. SID '09 Digest*, 2009, pp. 184-187.

SUMMARY OF THE INVENTION

An object of one embodiment of the present invention is to reduce manufacturing costs of a semiconductor device.

An object of one embodiment of the present invention is to increase an aperture ratio of a semiconductor device.

An object of one embodiment of the present invention is to increase the resolution of an image displayed on a display portion of a semiconductor device.

An object of one embodiment of the present invention is to provide a semiconductor device capable of high-speed operation.

One embodiment of the present invention is a semiconductor device including a driver circuit portion and a display portion (also referred to as a pixel portion) over one substrate. The driver circuit portion includes a driver circuit thin film transistor and a driver circuit wiring. A source electrode (also referred to as a source electrode layer) and a drain electrode (also referred to as a drain electrode layer) of the driver circuit thin film transistor are formed using a metal, and a channel layer of the driver circuit thin film transistor is formed using an oxide semiconductor. The driver circuit wiring is formed using a metal. The display portion includes a pixel thin film transistor and a display portion wiring. A source electrode layer and a drain electrode layer of the pixel thin film transistor are formed using an oxide conductor, and a semiconductor layer of the pixel thin film transistor is formed using an oxide semiconductor. The display portion wiring is formed using an oxide conductor.

An inverted staggered thin film transistor having a bottom-gate structure is used as each of the pixel thin film transistor and the driver circuit thin film transistor. The pixel thin film transistor and the driver circuit thin film transistor are each a thin film transistor in which an oxide insulating film which is in contact with part of a semiconductor layer, which is exposed between a source electrode layer and a drain electrode layer.

Note that a specific manufacturing process of a TFT, a specific structure of another element (e.g., capacitor) included in a semiconductor device, and the like are not disclosed in Non-Patent Document 1. In addition, there is no description on manufacture in which a driver circuit and a light-transmitting TFT are formed over one substrate.

In a semiconductor device according to one embodiment of the present invention, a driver circuit portion including a driver circuit TFT and a display portion including a pixel TFT are formed over one substrate. Thus, the manufacturing costs of the semiconductor device can be reduced.

In a semiconductor device according to one embodiment of the present invention, a display portion includes a pixel TFT and a display portion wiring. A source electrode and a drain electrode of the pixel TFT are formed using an oxide conductor. A semiconductor layer of the pixel TFT is formed using an oxide semiconductor. The display portion wiring is formed using an oxide conductor. In other words, in the semiconductor device, a region where the pixel TFT and the pixel wiring are formed can be an opening. Thus, the aperture ratio of the semiconductor device can be increased.

In a semiconductor device according to one embodiment of the present invention, a display portion includes a pixel TFT and a display portion wiring. A source electrode and a drain electrode of the pixel TFT are formed using an oxide conductor, and a semiconductor layer of the pixel TFT is formed using an oxide semiconductor. The display portion wiring is formed using an oxide conductor. In other words, in the semiconductor device, the pixel size can be determined without limitation by the size of the pixel TFT. Thus, the resolution of an image displayed on the display portion of the semiconductor device can be increased.

In a semiconductor device according to one embodiment of the present invention, a driver circuit portion includes a driver circuit TFT and a driver circuit wiring. A source electrode and a drain electrode of the driver circuit TFT are formed using a metal, and a channel layer of the driver circuit TFT is formed using an oxide semiconductor. The driver circuit wiring is formed using a metal. In other words, in the semiconductor device, a driver circuit includes the TFT having high field effect mobility and the wiring having low resistance. Thus, the semiconductor device is capable of high-speed operation.

As an oxide semiconductor used in this specification, a thin film of a material expressed by $InMO_3(ZnO)_m$ (m>0) is formed, and a thin film transistor including the thin film as an oxide semiconductor layer is manufactured. Note that M denotes one or more metal elements selected from Ga, Fe, Ni, Mn, and Co. For example, M might be Ga or might be Ga and the above metal element other than Ga, for example, M might be Ga and Ni or Ga and Fe. Further, in the oxide semiconductor, in some cases, a transition metal element such as Fe or Ni or an oxide of the transition metal is contained as an impurity element in addition to the metal element contained as M. In this specification, among oxide semiconductor layers whose composition formulae are expressed by $InMO_3(ZnO)_m$ (m>0), an oxide semiconductor which contains Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides can be used in addition to the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. A silicon oxide may be contained in the oxide semiconductor layer formed using the above metal oxide.

In the case where heat treatment is performed in an atmosphere of an inert gas such as nitrogen or a rare gas (e.g., argon or helium), an oxide semiconductor layer is changed into an oxygen-deficient oxide semiconductor layer by the heat treatment to be a low-resistance oxide semiconductor layer, i.e., an n-type (e.g., $n^-$-type) oxide semiconductor layer. Then, the oxide semiconductor layer is made to be in an oxygen excess state by the formation of an oxide insulating film which is to be in contact with the oxide semiconductor layer. Accordingly, part of the oxide semiconductor layer is changed into a high-resistance oxide semiconductor layer, i.e., an i-type oxide semiconductor layer. Thus, it is possible to manufacture and provide a semiconductor device including a highly reliable thin film transistor with favorable electrical characteristics.

In the case where heat treatment is performed in an atmosphere of an inert gas such as nitrogen or a rare gas (e.g., argon or helium), an oxide semiconductor layer is changed into an oxygen-deficient oxide semiconductor layer by the heat treatment to be a low-resistance oxide semiconductor layer, i.e., an n-type (e.g., $n^-$-type or $n^+$-type) oxide semiconductor layer. Then, the oxide semiconductor layer is made to be in an oxygen excess state by the formation of an oxide insulating film which is to be in contact with the oxide semiconductor layer. Accordingly, part of the oxide semiconductor layer is changed into a high-resistance oxide semiconductor layer, i.e., an i-type oxide semiconductor layer. Thus, it is possible to manufacture and provide a semiconductor device including a highly reliable thin film transistor with favorable electrical characteristics.

For dehydration or dehydrogenation, heat treatment is performed at a temperature which is higher than or equal to 350° C., preferably higher than or equal to 400° C. and lower than the strain point of a substrate in an atmosphere of an inert gas such as nitrogen or a rare gas (e.g., argon or helium), whereby impurities such as moisture contained in the oxide semiconductor layer can be reduced.

The oxide semiconductor layer is subjected to dehydration or dehydrogenation under such a heat treatment condition that two peaks of water or at least one peak of water at around 300° C. is not detected even if TDS (thermal desorption spectroscopy) is performed at up to 450° C. on the oxide semiconductor layer subjected to the dehydration or dehydrogenation. Thus, even if TDS is performed at up to 450° C. on a thin film transistor including an oxide semiconductor layer subjected to the dehydration or dehydrogenation, at least the peak of water at around 300° C. is not detected.

In addition, it is important not to expose the oxide semiconductor layer to the air and not to mix water and hydrogen into the oxide semiconductor layer in the manufacturing process of the semiconductor device. When a thin film transistor is formed using an oxide semiconductor layer obtained by changing an oxide semiconductor layer into a low-resistance oxide semiconductor layer, i.e., an n-type (e.g., $n^-$-type or $n^+$-type) oxide semiconductor layer by dehydration or dehydrogenation and then by supplying oxygen to the low-resistance oxide semiconductor layer so as to change the layer into a high-resistance oxide semiconductor layer to be an i-type oxide semiconductor layer, the threshold voltage of the thin film transistor can be a positive voltage, whereby a so-called normally-off switching element can be realized. It is preferable that a channel in a display device be formed with a positive threshold voltage which is as close to 0 V as possible in a thin film transistor. Note that if the threshold voltage of the thin film transistor is negative, the thin film transistor tends to be normally-on; in other words, current flows between a source electrode and a drain electrode even when the gate voltage is 0 V. In an active matrix display device, the electrical characteristics of a thin film transistor included in a circuit are important and influence the performance of the display device. Among the electrical characteristics of the thin film transistor, the threshold voltage ($V_{th}$) is particularly important. When the threshold voltage is high or negative even when the field effect mobility is high, it is difficult to control the circuit. In the case where a thin film transistor has a high threshold voltage and a large absolute value of its threshold voltage, the thin film transistor cannot perform a switching function as the TFT and might be a load when the TFT is driven at a low voltage. In the case of an n-channel thin film transistor, it is preferable that a channel be formed and drain current flow only after a positive voltage is applied as a gate voltage. A transistor in which a channel is not formed unless driving voltage is raised and a transistor in which a channel is formed and drain current flows even when a negative voltage is applied are unsuitable as a thin film transistor used in a circuit.

In addition, the gas atmosphere in which the temperature is lowered from the heating temperature T may be switched to a gas atmosphere which is different from the gas atmosphere in which the temperature is raised to the heating temperature T. For example, after dehydration or dehydrogenation is performed in a furnace, cooling is performed with the furnace filled with a high-purity oxygen gas or a high-purity $N_2O$ gas without exposure to the air.

The electrical characteristics of a thin film transistor are improved using an oxide semiconductor film cooled slowly (or cooled) in an atmosphere which does not contain moisture (having a dew point of −40° C. or lower, preferably −60° C. or lower) after moisture contained in the film is reduced by heat treatment for dehydration or dehydrogenation, and high-performance thin film transistors which can be mass-produced are realized.

In this specification, heat treatment performed in an atmosphere of an inert gas such as nitrogen or a rare gas (e.g., argon or helium) is referred to as "heat treatment for dehydration or dehydrogenation". In this specification, "dehydrogenation" does not indicate elimination of only $H_2$ by this heat treatment. For convenience, elimination of H, $OH^-$, and the like is referred to as "dehydration or dehydrogenation".

In the case where heat treatment is performed in an atmosphere of an inert gas such as nitrogen or a rare gas (e.g., argon or helium), an initially i-type oxide semiconductor layer is changed into an oxygen-deficient oxide semiconductor layer by the heat treatment to be a low-resistance oxide semiconductor layer, i.e., an n-type (e.g., n$^-$-type) oxide semiconductor layer. After that, a region overlapping with a drain electrode layer is formed as a high-resistance drain region (also referred to as an HRD region) which is an oxygen-deficient region.

Specifically, the carrier concentration of the high-resistance drain region is higher than or equal to $1\times10^{17}/cm^3$ and is at least higher than the carrier concentration of a channel formation region (lower than $1\times10^{17}/cm^3$). Note that the carrier concentration in this specification is carrier concentration obtained by Hall effect measurement at room temperature.

A low-resistance drain region (also referred to as an LRN region) may be formed between the oxide semiconductor layer and the drain electrode layer formed using a metal material. Specifically, the carrier concentration of the low-resistance drain region is higher than that of the high-resistance drain region (the HRD region); for example, it is higher than or equal to $1\times10^{20}/cm^3$ and lower than or equal to $1\times10^{21}/cm^3$.

Then, at least part of the oxide semiconductor layer subjected to dehydration or dehydrogenation is made to be in an oxygen excess state so as to be a high-resistance oxide semiconductor layer, i.e., an i-type oxide semiconductor layer, whereby a channel formation region is formed. Note that as the treatment for making the oxide semiconductor layer subjected to dehydration or dehydrogenation in an oxygen excess state, deposition of an oxide insulating film which is to be in contact with the oxide semiconductor layer subjected to dehydration or dehydrogenation by a sputtering method; heat treatment after the deposition of the oxide insulating film; heat treatment in an oxygen atmosphere; cooling treatment in an oxygen atmosphere or in ultra-dry air (having a dew point of $-40°$ C. or lower, preferably $-60°$ C. or lower) after heat treatment in an inert gas atmosphere; or the like is performed.

Further, in order to make at least part of the oxide semiconductor layer subjected to dehydration or dehydrogenation (a portion overlapping with a gate electrode (also referred to as a gate electrode layer)) serve as the channel formation region, the oxide semiconductor layer is selectively made to be in an oxygen excess state so as to be a high-resistance oxide semiconductor layer, i.e., an i-type oxide semiconductor layer. The channel formation region can be formed in such a manner that a source electrode layer and a drain electrode layer formed using metal electrodes of Ti or the like are formed on and in contact with the oxide semiconductor layer subjected to dehydration or dehydrogenation and an exposed region which does not overlap with the source electrode layer and the drain electrode layer is selectively made to be in an oxygen excess state. In the case where the exposed region is selectively made to be in an oxygen excess state, a first high-resistance drain region overlapping with the source electrode layer and a second high-resistance drain region overlapping with the drain electrode layer are formed, and the channel formation region is formed between the first high-resistance drain region and the second high-resistance drain region. In other words, the channel formation region is formed between the source electrode layer and the drain electrode layer in a self-aligned manner.

Thus, it is possible to manufacture and provide a semiconductor device including a highly reliable thin film transistor with favorable electrical characteristics.

Note that by the formation of the high-resistance drain region in part of the oxide semiconductor layer, which overlaps with the drain electrode layer (and the source electrode layer), reliability at the time when a driver circuit is formed can be improved. Specifically, by the formation of the high-resistance drain region, a structure can be obtained in which conductivity can be varied from the drain electrode layer to the channel formation region via the high-resistance drain region. Thus, in the case where operation is performed with the drain electrode layer connected to a wiring for supplying a high power supply potential VDD, the high-resistance drain region serves as a buffer, and thus a high electric field is not applied locally even when the high electric field is applied between the gate electrode layer and the drain electrode layer, which leads to an increase in the withstand voltage of the transistor.

In addition, by the formation of the high-resistance drain region in part of the oxide semiconductor layer, which overlaps with the drain electrode layer (and the source electrode layer), the amount of leakage current in the channel formation region at the time when the driver circuit is formed can be reduced. Specifically, by the formation of the high-resistance drain region, the leakage current of the transistor, which flows between the drain electrode layer and the source electrode layer, flows from the drain electrode layer through the high-resistance drain region on the drain electrode layer side, the channel formation region, and the high-resistance drain region on the source electrode layer side to the source electrode layer. In this case, in the channel formation region, leakage current flowing from the high-resistance drain region on the drain electrode layer side to the channel formation region can be concentrated in the vicinity of an interface between the channel formation region and a gate insulating layer which has high resistance when the transistor is off. Thus, the amount of leakage current in a back channel portion (part of a surface of the channel formation region, which is apart from the gate electrode layer) can be reduced.

Further, the high-resistance drain region overlapping with the source electrode layer and the high-resistance drain region overlapping with the drain electrode layer overlap with part of the gate electrode layer with the gate insulating layer therebetween depending on the width of the gate electrode layer, and the intensity of an electric field in the vicinity of an edge portion of the drain electrode layer can be reduced more effectively.

One embodiment of the present invention is a semiconductor device including, over one substrate, a pixel portion having a first thin film transistor and a driver circuit having a second thin film transistor. The first thin film transistor includes: a gate electrode layer over the substrate; a gate insulating layer over the gate electrode layer; an oxide semiconductor layer over the gate insulating layer; a first source electrode layer and a first drain electrode layer over the oxide semiconductor layer; a conductive layer on and in contact with part of the first source electrode layer or part of the first drain electrode layer; over the gate insulating layer, the oxide semiconductor layer, the first source electrode layer, and the first drain electrode layer, a protective insulating layer in contact with part of the oxide semiconductor layer; and over the protective insulating layer, a pixel electrode layer which is electrically connected to the conductive layer. The gate electrode layer, the gate insulating layer, the oxide semiconductor layer, the first source electrode layer, the first drain electrode layer, the protective insulating layer, and the pixel electrode layer of the first thin film transistor have light-transmitting properties. Further, a material of a second source electrode layer and a second drain electrode layer of the second thin film transistor is different from a material of the first source electrode layer and the first drain electrode layer of the first thin film transistor and is a conductive material having a lower resistance than the first source electrode layer and the first drain electrode layer of the first thin film transistor.

Note that in the above structure, each of the source electrode layer and the drain electrode layer of the second thin film transistor includes a material containing an element selected from Al, Cr, Cu, Ta, Ti, Mo, and W as its main component, or a stack film formed by an alloy containing the above elements. Further, the conductive layer of the first thin film transistor includes a material containing an element selected from Al, Cr, Cu, Ta, Ti, Mo, and W as its main component, or a stack film formed by an alloy containing the above elements.

Further, in the above structure, each of the source electrode layer, the drain electrode layer, and the pixel electrode layer of the first thin film transistor may contain an indium oxide, an indium oxide-tin oxide alloy, an indium oxide-zinc oxide alloy, or an zinc oxide.

In the above structure, the semiconductor device may also include a capacitor portion over the same substrate. In addition, the capacitor portion may have a capacitor wiring and a capacitor electrode layer which overlaps with the capacitor wiring, and the capacitor wiring and the capacitor electrode layer may have light-transmitting properties.

In addition, the semiconductor device may also include, over the protective insulating layer of the second thin film transistor, a conductive layer which overlaps with the gate electrode layer.

In the above structure, a low-resistance drain region may be provided between the oxide semiconductor layer of the second thin film transistor and the source electrode layer and between the oxide semiconductor layer and the drain electrode layer, and the low-resistance drain region may contain the same material as the source electrode layer and the drain electrode layer of the first thin film transistor.

In the above structure, the low-resistance drain region of the oxide semiconductor layer which overlaps with the source electrode layer or the drain electrode layer of the second thin film transistor may have a lower resistance than a channel formation region of the oxide semiconductor layer of the second thin film transistor.

Another embodiment of the present invention is a manufacturing method of a semiconductor device including, over one substrate, a pixel portion having a first thin film transistor and a driver circuit having a second thin film transistor. The manufacturing method includes the steps of: forming a first gate electrode layer which is a gate electrode layer of the first thin film transistor and a second gate electrode layer which is a gate electrode layer of the second thin film transistor by forming a light-transmitting conductive film over the substrate and selectively removing the light-transmitting conductive film in a first photolithography step; forming a gate insulating layer over the first gate electrode layer and the second gate electrode layer; forming a first oxide semiconductor layer and a second oxide semiconductor layer which are island-shaped oxide semiconductor layers by forming an oxide semiconductor film over the gate insulating layer and selectively removing the oxide semiconductor film in a second photolithography step; dehydrating or dehydrogenating the first oxide semiconductor layer and the second oxide semiconductor layer; forming a first source electrode layer and a first drain electrode layer which are a source electrode layer and a drain electrode layer of the first thin film transistor over the first oxide semiconductor layer by sequentially forming an oxide conductive film and a conductive film over the first oxide semiconductor layer subjected to dehydration or dehydrogenation and the second oxide semiconductor layer subjected to dehydration or dehydrogenation and selectively removing the oxide conductive film and the conductive film in a third photolithography step and a fourth photolithography step; forming a second source electrode layer and a second drain electrode layer which are a source electrode layer and a drain electrode layer of the second thin film transistor by forming a conductive layer in contact with part of the first source electrode layer or part of the first drain electrode layer, a pair of low-resistance drain regions over the second oxide semiconductor layer, and a pair of conductive layers over the pair of low-resistance drain regions; forming a protective insulating layer in contact with part of the first oxide semiconductor layer and part of the second oxide semiconductor layer, over the gate insulating layer, the first oxide semiconductor layer, the second oxide semiconductor layer, the first source electrode layer, the first drain electrode layer, the conductive layer in contact with part of the first source electrode layer or part of the first drain electrode layer, the second source electrode layer, and the second drain electrode layer; and forming a pixel electrode layer over the protective insulating layer.

Another embodiment of the present invention is a manufacturing method of a semiconductor device including, over one substrate, a pixel portion having a first thin film transistor and a driver circuit having a second thin film transistor. The manufacturing method includes the steps of: forming a first gate electrode layer which is a gate electrode layer of the first thin film transistor and a second gate electrode layer which is a gate electrode layer of the second thin film transistor by forming a light-transmitting conductive film over the substrate and selectively removing the light-transmitting conductive film in a first photolithography step; forming a gate insulating layer over the first gate electrode layer and the second gate electrode layer; forming an oxide semiconductor film over the gate insulating layer; dehydrating or dehydrogenating the oxide semiconductor film; forming a first source electrode layer and a first drain electrode layer which are a source electrode layer and a drain electrode layer of the first thin film transistor over the first oxide semiconductor layer by sequentially forming an oxide conductive film and a conductive film over the oxide semiconductor film subjected to dehydration or dehydrogenation and selectively removing the oxide semiconductor film, the oxide conductive film and the conductive film in a second photolithography step and a third photolithography step; forming a second source electrode layer and a second drain electrode layer which are a source electrode layer and a drain electrode layer of the second thin film transistor by forming a conductive layer in contact with part of the first source electrode layer or part of the first drain electrode layer, a pair of low-resistance drain regions over the second oxide semiconductor layer, and a pair of conductive layers over the pair of low-resistance drain regions; forming a protective insulating layer in contact with part of the first oxide semiconductor layer and part of the second oxide semiconductor layer, over the gate insulating layer, the first oxide semiconductor layer, the second oxide semiconductor layer, the first source electrode layer, the first drain electrode layer, the conductive layer in contact with part of the first source electrode layer or part of the first drain electrode layer, the second source electrode layer, and the second drain electrode layer; and forming a pixel electrode layer over the protective insulating layer.

In one embodiment of the present invention, a multi-tone mask may be used in the third photolithography step.

In this specification, a film refers to what is formed over an entire surface and is not patterned. In addition, a layer refers to what is patterned into a desired shape with a resist mask or the like. Note that this distinction between "film" and "layer" is for convenience, and they are used without any distinction in some cases. Also as for each layer of a stacked film, a film and a layer are used without any distinction in some cases.

Note that the ordinal numbers such as "first" and "second" in this specification are used for convenience and do not denote the order of steps and the stacking order of layers. In addition, the ordinal numbers in this specification do not denote particular names which specify the present invention.

As a display device including a driver circuit, a light-emitting display device in which a light-emitting element is used and a display device in which an electrophoretic display element is used, which is also referred to as "electronic paper", are given in addition to a liquid crystal display device.

In a light-emitting display device in which a light-emitting element is used, a pixel portion includes a plurality of thin film transistors. The pixel portion includes a region where a gate electrode of one thin film transistor is connected to a source wiring (also referred to as a source wiring layer) or a drain wiring (also referred to as a drain wiring layer) of another thin film transistor. In addition, in a driver circuit of the light-emitting display device in which a light-emitting element is used, there is a region where a gate electrode of a thin film transistor is connected to a source wiring or a drain wiring of the thin film transistor.

A thin film transistor having stable electrical characteristics can be manufactured and provided. Thus, a semiconductor device which includes highly reliable thin film transistors with favorable electrical characteristics can be provided.

BRIEF DESCRIPTION OF THE DRAWINGS

In the accompanying drawings:
FIGS. 1A1, 1A2, 1B1, 1B2, 1C1, and 1C2 illustrate a semiconductor device;
FIGS. 6A1, 6A2, 6B1, 6B2, 6C1, and 6C2 illustrate a semiconductor device;
FIGS. 7A and 7B each illustrate a semiconductor device;
FIGS. 8A and 8B each illustrate a semiconductor device;
FIGS. 10A1, 10A2, and 10B illustrate a semiconductor device;
FIG. 20 is an external view illustrating an example of e-book reader;
FIGS. 43A and 43B each illustrate a semiconductor device;
FIGS. 44A and 44B each illustrate a semiconductor device.

DETAILED DESCRIPTION OF THE INVENTION

Figure 2A:
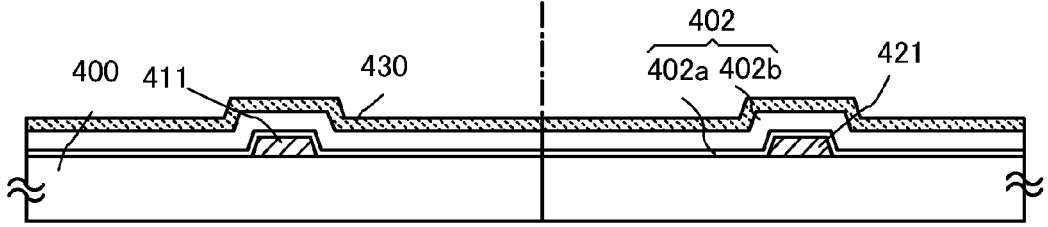
FIGS. 2A to 2E illustrate a method for manufacturing a semiconductor device.

Embodiments will be described in detail with reference to the accompanying drawings. Note that the present invention is not limited to the following description, and it can be easily understood by those skilled in the art that the mode and the detail can be changed variously without departing from the sprit and scope of the present invention. Therefore, the present invention is not construed as being limited to the description of the following embodiments. In the structures to be given below, the same portions or portions having similar functions are denoted by the same reference numerals in different drawings, and explanation thereof will not be repeated.

(Embodiment 1)

In this embodiment, a semiconductor device and a method for manufacturing a semiconductor device are described with reference to FIGS. 1A1 to 1C2, FIGS. 2A to 2E, FIGS. 3A to 3E, and FIGS. 41A and 41B. In FIGS. 1B1 and 1B2, cross-sectional structures of two thin film transistors formed over one substrate are illustrated as examples. A thin film transistor 410 and a thin film transistor 420 which are illustrated in FIGS. 1B1 and 1B2 are each a kind of bottom-gate transistor.

FIG. 1A1 is a plan view of the thin film transistor 410 provided in a driver circuit and FIG. 1B1 is a cross-sectional view taken along line C1-C2 in FIG. 1A1. Further, FIG. 1C1 is a cross-sectional view taken along line C3-C4 in FIG. 1A1.

Over a substrate 400 having an insulating surface, the thin film transistor 410 provided in the driver circuit includes: a gate electrode layer 411; a first gate insulating layer 402a; a second gate insulating layer 402b; an oxide semiconductor layer 412 having at least a channel formation region 413, a high-resistance drain region 414a and a high-resistance drain region 414b; a low-resistance drain region 408a and a low-resistance drain region 408b; a source electrode layer 415a; and a drain electrode layer 415b. Further, an oxide insulating film 416 which covers the thin film transistor 410 and is in contact with the channel formation region 413 is provided.

Note that the high-resistance drain region has a smaller resistance value than the channel formation region, and the low-resistance drain region has a smaller resistance value than the high-resistance drain region.

The high-resistance drain region 414a is formed in contact with a bottom surface of the low-resistance drain region 408a in a self-aligned manner. The high-resistance drain region 414b is formed in contact with a bottom surface of the low-resistance drain region 408b in a self-aligned manner. Further, the channel formation region 413 is in contact with the oxide insulating film 416, and has a higher resistance than the high-resistance drain region 414a and the high-resistance drain region 414b; that is, the channel formation region 413 is an i-type region.

It is preferable that a metal material be used for the source electrode layer 415a and the drain electrode layer 415b so that a wiring of the thin film transistor 410 has a reduced resistance.

The gate electrode layer 411 of the thin film transistor 410 can be formed to have a single-layer structure or a stacked-layer structure of a light-transmitting conductive film or to have a stacked-layer structure of a light-transmitting conductive layer and a conductive layer containing a metal material.

In addition, when a pixel and a driver circuit are formed over one substrate in a liquid crystal display device, in the driver circuit, only either positive polarity or negative polarity is applied between the source and drain electrodes in a thin film transistor for constituting a logic gate such as an inverter circuit, a NAND circuit, a NOR circuit, or a latch circuit or a thin film transistor for constituting an analog circuit such as a sense amplifier, a constant voltage generating circuit, or a VCO. Therefore, one of the high-resistance drain regions 414a and 414b, which requires high withstand voltage, may be designed to have a larger width than the other. Alternatively, the width of portions of the high-resistance drain regions 414a and 414b which overlap with the gate electrode layer 411 may be increased.

Note that although a thin film transistor having a single gate structure is described as the thin film transistor 410 which is provided in the driver circuit, a thin film transistor having a multi-gate structure in which a plurality of channel formation regions is included may be alternatively formed if necessary.

By providing the low-resistance drain region 408a and the low-resistance drain region 408b, the thin film transistor 410 can be operated more stably also in terms of heat than a thin film transistor with a Schottky junction. In this manner, an ohmic contact is formed by intentionally providing the low-resistance drain region which has a higher carrier-concentration than the oxide semiconductor layer.

A conductive layer 417 is formed above the channel formation region 413 so as to overlap with the channel formation region 413. When the conductive layer 417 and the gate electrode layer 411 are electrically connected and set to be the same electric potential, gate voltage can be applied to the oxide semiconductor layer 412 from both the gate electrode layer 411 and the conductive layer 417 over and below the oxide semiconductor layer 412. In the case where the gate electrode layer 411 and the conductive layer 417 have different electric potentials, for example, one of them has a fixed electric potential, a GND potential, or 0 V, electric characteristics of a TFT, such as a threshold voltage, can be controlled.

Further, a protective insulating layer 403 is provided between the conductive layer 417 and the oxide insulating film 416.

Further, the protective insulating layer 403 is preferably in contact with the first gate insulating layer 402a provided below the protective insulating layer 403 or an insulating film serving as a base and blocks entry of impurities such as moisture, a hydrogen ion, and $OH^-$ from a side surface of the substrate. The above structure is effective particularly when a silicon nitride film is used for the first gate insulating layer 402a or the insulating film serving as a base, which is in contact with the protective insulating layer 403.

FIG. 1A2 is a plan view of a thin film transistor 420 provided in a pixel, and FIG. 1B2 is a cross-sectional view taken along line D1-D2 in FIG. 1A2. FIG. 1C2 is a cross-sectional view taken along line D3-D4 in FIG. 1A2.

Over the substrate 400 having an insulating surface, the thin film transistor 420 provided in the pixel includes: a gate electrode layer 421; the first gate insulating layer 402a; the second gate insulating layer 402b; an oxide semiconductor layer 422 having at least a channel formation region 423, a high-resistance drain region 424a and a high-resistance drain region 424b; a source electrode layer 409a; and a drain electrode layer 409b. The oxide insulating film 416 which covers the thin film transistor 420 and is in contact with an upper surface of the oxide semiconductor layer 422 is provided.

Note that an AC drive is performed in a liquid crystal display device in order to prevent deterioration of liquid crystal. Through the AC drive, the polarity of a signal potential applied to a pixel electrode layer is inverted to be negative or positive at regular intervals of time. In a thin film transistor connected to a pixel electrode layer, one of a pair of electrodes serves as a source electrode layer and a drain electrode layer in turn. In this specification, one of the pair of electrodes of the thin film transistor in the pixel is called a source electrode layer and the other is called a drain electrode layer for convenience; however, in practice, one of the electrodes serves as a source electrode layer and a drain electrode layer in turn through an AC drive. Further, the gate electrode layer of the thin film transistor 420 provided in the pixel may have a smaller width than that of the thin film transistor 410 provided in the driver circuit, so that leakage current can be reduced. In addition, the gate electrode layer of the thin film transistor 420 provided in the pixel may be designed not to overlap with the source electrode layer or the drain electrode layer, so that leakage current can be reduced.

A conductive layer 426 is provided over part of the drain electrode layer 409b so that the pixel electrode layer 427 is electrically connected to the drain electrode layer 409b via the conductive layer 426. By providing the conductive layer 426 over the drain electrode layer, contact resistance can be reduced.

The high-resistance drain region 424a is formed in contact with a bottom surface of the source electrode layer 409a in a self-aligned manner. The high-resistance drain region 424b is formed in contact with a bottom surface of the drain electrode layer 409b in a self-aligned manner. Further, the channel formation region 423 is in contact with the oxide insulating film 416, and has a higher resistance than the high-resistance drain region 424a and the high-resistance drain region 424b; that is, the channel formation region 423 is an i-type region.

After an oxide semiconductor film is formed, heat treatment (heat treatment for dehydration or dehydrogenation) for reducing moisture and the like which are impurities is performed. When the oxide insulating film in contact with the oxide semiconductor layer is formed after the heat treatment for dehydration or dehydrogenation and slow cooling are performed, the carrier concentration of the oxide semiconductor layer is reduced, which leads to improvement in electric characteristics and the reliability of the thin film transistor 420.

Note that the oxide semiconductor layer 412 is formed below the source electrode layer 415a and the drain electrode layer 415b and partly overlaps therewith. The oxide semiconductor layer 412 overlaps with the gate electrode layer 411 with the first gate insulating layer 402a and the second gate insulating layer 402b therebetween. Note also that the oxide semiconductor layer 422 is formed below the source electrode layer 409a and the drain electrode layer 409b and partly overlaps therewith. Further, the oxide semiconductor layer 422 overlaps with the gate electrode layer 421 with the first gate insulating layer 402a and the second gate insulating layer 402b therebetween.

For realizing a display device having a high aperture ratio, the source electrode layer 409a and the drain electrode layer 409b are formed using a light-transmitting conductive film so that the thin film transistor 420 can serve as a light-transmitting transistor. Further, the gate electrode layer 421 of the thin film transistor 420 is also formed using a light-transmitting conductive film.

In the pixel where the thin film transistor 420 is provided, a conductive film that transmits visible light is used for a pixel electrode layer 427, another electrode layer (such as a capacitor electrode layer), or another wiring layer (such as a capacitor wiring layer), whereby a display device having a high aperture ratio is realized. Needless to say, it is preferable that a conductive film that transmits visible light be used also for the first gate insulating layer 402a, the second gate insulating layer 402b, or the oxide insulating film 416.

In addition, the protective insulating layer 403 and a planarizing insulating layer 404 are stacked between the pixel electrode layer 427 and the oxide insulating film 416.

In this specification, a film that transmits visible light refers to a film with a thickness which realizes a visible light transmittance of 75% to 100%. When the film has conductivity, it is also called a transparent conductive film. A conductive film which is semitransparent to visible light may be used for a metal oxide for the gate electrode layer, the source electrode layer, the drain electrode layer, the pixel electrode layer, another electrode layer, or another wiring layer. When a conductive film is semitransparent to visible light, it has a transmittance of visible light of 50% to 75%.

Hereinafter, a manufacturing process of the thin film transistor 410 and the thin film transistor 420 over one substrate is described with reference to FIGS. 2A to 2E and FIGS. 3A to 3E.

First, a light-transmitting conductive film is formed over the substrate 400 having an insulating surface and then the gate electrode layers 411 and 421 are formed in a first photolithography step. Further, in the pixel portion, a capacitor wiring (which is also referred to as a capacitor wiring layer) is formed in the same first photolithography step using the same material as the gate electrode layers 411 and 421. In the case where a capacitor is needed not only in the pixel portion but also in the driver circuit, a capacitor wiring is formed in the driver circuit, too. Note that a resist mask may be formed by an ink-jet method. A photomask is not used when the resist mask is formed by an ink-jet method, which results in a reduction in the manufacturing cost.

Although there is no particular limitation on a substrate which can be used as the substrate 400 having an insulating surface, it is necessary that the substrate have at least enough heat resistance to heat treatment to be performed later. As the substrate 400 having an insulating surface, a glass substrate formed of barium borosilicate glass, aluminoborosilicate glass, or the like can be used.

As the substrate 400 having an insulating surface, a glass substrate whose strain point is higher than or equal to 730° C. may be used when the temperature of the heat treatment to be performed is high. Further, as a material of the substrate 400, for example, a glass material such as aluminosilicate glass, aluminoborosilicate glass, or barium borosilicate glass is used. Note that by containing a larger amount of a barium oxide (BaO) than boric acid, a glass substrate is heat-resistant and of more practical use. Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used instead of the glass substrate 400. Alternatively, crystallized glass or the like may be used.

An insulating film serving as a base film may be provided between the substrate 400 and the gate electrode layers 411 and 421. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

As the material of the gate electrode layers 411 and 421, a conductive material that transmits visible light such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; a Zn—O-based metal oxide; and an In—Sn—O-based metal oxide. As a deposition method of a metal oxide film used for the gate electrode layers 411 and 421, a sputtering method, a vacuum evaporation method (an electron beam evaporation method or the like), an arc discharge ion plating method or a spray method is used. In the case of using a sputtering method, film deposition may be performed using a target containing $SiO_2$ at 2 to 10 percent by weight inclusive and SiOx (x>0) which inhibits crystallization may be contained in the metal oxide film. In this manner, the metal oxide film can be prevented from being crystallized at the time of the heat treatment for dehydration or dehydrogenation which is performed in a later step.

The gate electrode layers 411 and 421 can be formed using an element selected from Al, Cr, Ta, Ti, Mo, and W, an alloy containing any of these elements, an alloy film containing a combination of any of these elements, or the like.

The thickness of the gate electrode layers 411 and 421 can be appropriately selected to be in the range of 50 nm to 300 nm. In this embodiment, the gate electrode layers 411 and 421 are formed using a light-transmitting conductive material; however, the present invention is not limited thereto. For example, the gate electrode layer of the transistor provided in the driver circuit can be formed to have a stacked-layer structure of a film which contains a light-transmitting conductive material and a metal film, and the gate electrode layer of the transistor provided in the pixel portion can be formed using a film which contains a light-transmitting conductive material.

A gate insulating layer 402 is formed over the gate electrode layers 411 and 421.

The gate insulating layer 402 can be formed using a single layer or stacked layers of any of a silicon oxide film, a silicon nitride film, a silicon oxynitride film, a silicon nitride oxide film, an aluminum oxide film, and an aluminum oxynitride film by a plasma CVD method, a sputtering method, or the like. For example, a silicon oxynitride film may be formed by a plasma CVD method using $SiH_4$, oxygen, and nitrogen as a film-formation gas. Alternatively, for instance, a silicon oxide film may be formed using a silicon target doped with boron, whereby a higher barrier property against water or hydrogen can be obtained. The gate insulating layer 402 is formed to a thickness greater than or equal to 100 nm and less than or equal to 500 nm; for example, in the case where the gate insulating layer 402 has a stacked-layer structure, a first gate insulating layer with a thickness greater than or equal to 50 nm and less than or equal to 200 nm and a second gate insulating layer with a thickness greater than or equal to 5 nm and less than or equal to 300 nm are stacked thereover.

In this embodiment, the gate insulating layer 402 is a stack of the first gate insulating layer 402*a* with a thickness greater than or equal to 50 nm and less than or equal to 200 nm and the second gate insulating layer 402*b* with a thickness greater than or equal to 50 nm and less than or equal to 300 nm. As the first gate insulating layer 402*a*, a silicon nitride film or a silicon nitride oxide film with a thickness of 100 nm is used. As the second gate insulating layer 402*b*, a silicon oxynitride film with a thickness of 100 nm is used.

Then, an oxide semiconductor film 430 is formed to a thickness greater than or equal to 2 nm and less than or equal to 200 nm over the second gate insulating layer 402*b*. In order to be amorphous even after the heat treatment for dehydration or dehydrogenation which follows the formation of the oxide semiconductor film 430, the oxide semiconductor film preferably has a small thickness of less than or equal to 50 nm. By making the thickness of the oxide semiconductor film small, crystallization in the oxide semiconductor film can be suppressed when heat treatment is performed after the formation of the oxide semiconductor film.

Note that before the oxide semiconductor film 430 is formed by a sputtering method, dust attached to a surface of the second gate insulating layer 402*b* is preferably removed by reverse sputtering in which an argon gas is introduced and plasma is generated. The reverse sputtering refers to a method in which, without application of voltage to a target side, an RF power supply is used for application of voltage to a substrate side in an argon atmosphere to generate plasma in the vicinity of the substrate to modify a surface. Note that instead of an argon atmosphere, nitrogen, helium, oxygen or the like may be used.

The oxide semiconductor film 430 can be formed using an In—Ga—Zn—O-based non-single-crystal film, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, an In—O-based material, a Sn—O-based material, a Zn—O-based material or an In—Sn—O-based material. In this embodiment, the oxide semiconductor film 430 is formed by a sputtering method with use of an In—Ga—Zn—O-based oxide semiconductor target. The oxide semiconductor film 430 can be formed by a sputtering method in a rare gas (typically argon) atmosphere, an oxygen atmosphere, or an atmosphere of a rare gas (typically argon) and oxygen. In the case of using a sputtering method, film deposition may be performed using a target containing $SiO_2$ at 2 to 10 percent by weight inclusive and SiOx (x>0) which inhibits crystallization may be contained in the oxide semiconductor film 430. In this manner, the oxide semiconductor film 430 can be prevented from being crystallized at the time of the heat treatment for dehydration or dehydrogenation which is performed in a later step.

Here, film deposition is performed using an oxide semiconductor target containing In, Ga, and Zn ($In_2O_3$:$Ga_2O_3$:ZnO=1:1:1 [mol %], In:Ga:Zn=1:1:0.5 [at %], and In:Ga:Zn=1:1:4 [at %]). The deposition condition is set as follows: the distant between the substrate and the target is 100 mm, the pressure is 0.2 Pa, the direct current (DC) power supply is 0.5 kW, and the atmosphere is a mixed atmosphere of argon and oxygen (argon:oxygen=30 sccm:20 sccm and the oxygen flow rate is 40%). Note that a pulse direct current (DC) power supply is preferable because dust can be reduced and the film thickness can be uniform. The thickness of the In—Ga—Zn—O-based non-single-crystal film is greater than or equal to 5 nm and less than or equal to 200 nm.

In this embodiment, as the oxide semiconductor film 430, an In—Ga—Zn—O-based non-single-crystal film with a thickness of 20 nm is formed using the In—Ga—Zn—O-based oxide semiconductor target by a sputtering method.

Examples of a sputtering method include an RF sputtering method in which a high-frequency power supply is used as a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering method in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

Next, the oxide semiconductor film 430 is processed into island-shaped oxide semiconductor layers in a second photolithography step. A resist mask for forming the island-shaped oxide semiconductor layers may be formed by an ink-jet method. A photomask is not used when the resist mask is formed by an ink-jet method, which results in a reduction in the manufacturing cost.

Next, the first oxide semiconductor layers are dehydrated or dehydrogenated. A temperature of first heat treatment for the dehydration or dehydrogenation is higher than or equal to 400° C. and lower than the strain point of the substrate, for example, higher than or equal to 400° C. and lower than or equal to 700° C. A preferable temperature is higher than or equal to 425° C. Note that the heat treatment may be performed for one hour or shorter when the temperature thereof is higher than or equal to 425° C., although the heat treatment is preferably performed for longer than one hour when the temperature is lower than 425° C. Here, an oxide semiconductor layer 431 and an oxide semiconductor layer 432 are obtained in such a manner that: the substrate is introduced into an electric furnace that is a kind of heat treatment apparatus; the oxide semiconductor layers are subjected to the heat treatment in a nitrogen atmosphere; and the layers are prevented from being exposed to the air and thus water and hydrogen are prevented from entering the oxide semiconductor layers (see FIG. 2B). In this embodiment, slow cooling is performed from the heating temperature T at which the oxide semiconductor layers are dehydrated or dehydrogenated to a temperature low enough to prevent water from coming in, specifically to a temperature more than 100° C. lower than the heating temperature T, in a nitrogen atmosphere in one furnace. The present invention is not limited to a nitrogen atmosphere and alternatively the dehydration or dehydrogenation may be performed in a rare gas atmosphere such as helium, neon, argon, or the like.

Note that in the first heat treatment, it is preferable that water, hydrogen, and the like be not contained in the atmosphere of nitrogen or a rare gas such as helium, neon, or argon. Alternatively, it is preferable that nitrogen or a rare gas such as helium, neon, or argon introduced into the heat treatment apparatus have purity of 4N (99.99%) or more, more preferably, 6N (99.9999%) or more; that is, the impurity concentration is set to 20 ppm or lower, more preferably, 1 ppm or lower.

Note that the oxide semiconductor layers are crystallized and changed into a microcrystalline film or a polycrystalline film in some cases depending on the condition of the first heat treatment or the material of the oxide semiconductor layers.

Alternatively, the first heat treatment may be performed on the oxide semiconductor film 430 which has not yet been processed into the island-shaped oxide semiconductor layers. In that case, after the first heat treatment, the substrate is taken out of the heat treatment apparatus and a photolithography step is performed.

Before the oxide semiconductor film 430 is formed, heat treatment (at higher than or equal to 400° C. and lower than the strain point of the substrate) may be performed in an inert gas atmosphere (e.g., nitrogen, or helium, neon, or argon), or an oxygen atmosphere, thereby removing impurities such as hydrogen and water contained in the gate insulating layer 402.

Next, an oxide conductive film is formed over the oxide semiconductor layers 431 and 432 and the second gate insulating layer 402b and then a metal conductive film is formed over the oxide conductive film. After that, in a third photolithography step, a resist mask 433a and a resist mask 433b are formed and selective etching is performed so as to form an oxide conductive layer 406, an oxide conductive layer 407, a conductive layer 434, and a conductive layer 435 (see FIG. 2C).

As the material of the oxide conductive film, a conductive material that transmits visible light such as the following materials can be employed: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; a Zn—O-based metal oxide; and an In—Sn—O-based metal oxide. The thickness of the oxide conductive film is selected as appropriate to be within the range of 50 nm to 300 nm. In the case of using a sputtering method, film deposition may be performed using a target containing $SiO_2$ at 2 to 10 percent by weight inclusive and $SiO_x$ (x>0) which inhibits crystallization may be contained in the oxide conductive film. In this manner, the oxide conductive film can be prevented from being crystallized at the time of the second heat treatment which is performed in a later step.

As the material of the metal conductive film, there are an element selected from Al, Cr, Cu, Ta, Ti, Mo, and W, an alloy containing any of these elements as a component, an alloy containing these elements in combination, and the like. The metal conductive film preferably has a three-layer structure in which an aluminum layer is stacked over a titanium layer and a titanium layer is stacked over the aluminum layer, or a three-layer structure in which an aluminum layer is stacked over the molybdenum layer and a molybdenum layer is stacked over the aluminum layer. Needless to say, the metal conductive film may have a single-layer structure, a two-layer structure, or a stacked-layer structure including four or more layers.

The resist masks for forming the conductive layers 434 and 435 may be formed by an ink-jet method. A photomask is not used when the resist mask is formed by an ink-jet method, which results in a reduction in the manufacturing cost.

Figure 2B:
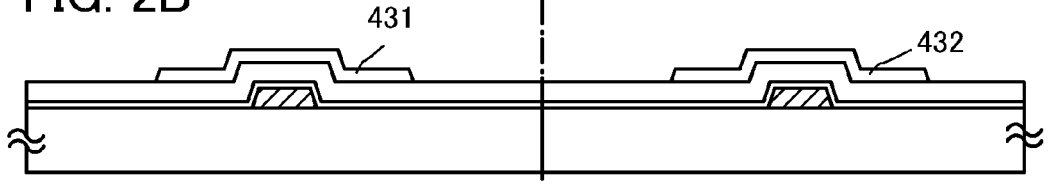
Figure 2C:
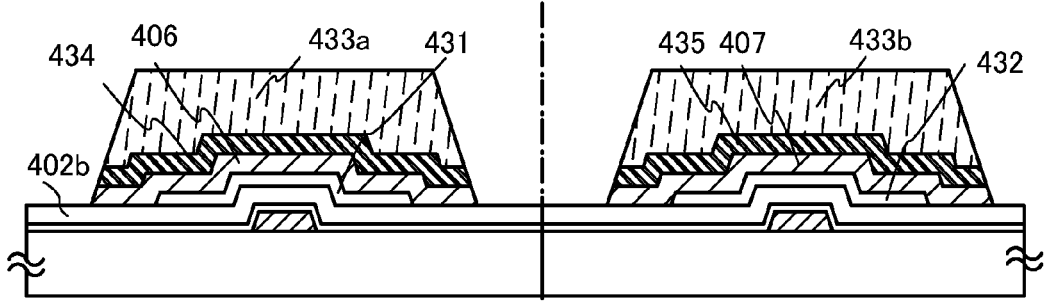
Figure 2D:
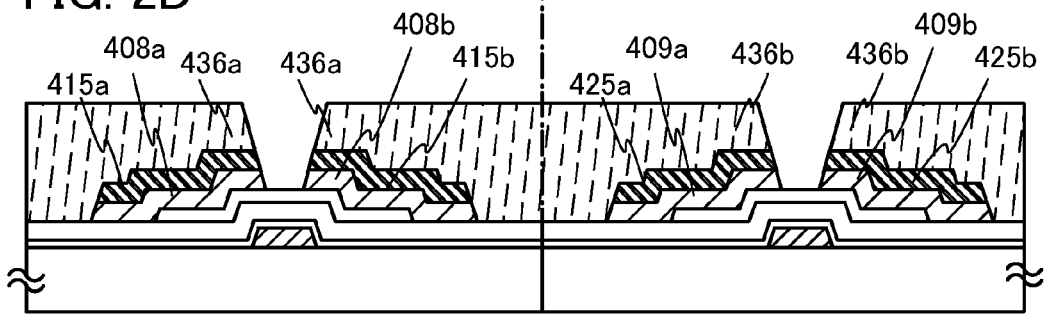
Figure 2E:
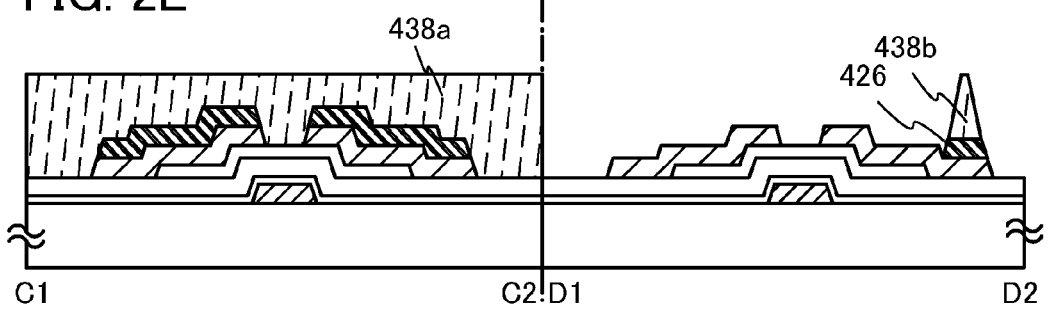

Then, after the resist masks 433a and 433b are removed, in a fourth photolithography step, a resist mask 436a and a resist mask 436b are formed and selective etching is performed so as to form the source electrode layer 415a and the drain electrode layer 415b, the low-resistance drain region 408a, the low-resistance drain region 408b, the source electrode layer 409a and the drain electrode layer 409b, a conductive layer 425a, a conductive layer 425b (see FIG. 2D). Note that the resist masks for the fourth photolithography step may be formed by an ink-jet method. A photomask is not used when the resist mask is formed by an ink-jet method, which results in a reduction in the manufacturing cost.

By utilizing a gap between the etching rate of the oxide semiconductor layers 431 and 432 and that of the oxide conductive layers 406 and 407, etching treatment is performed so as to divide each of the oxide conductive layers 406 and 407 and to form a channel region. The etching rate of the oxide conductive layers 406 and 407 is higher than that of the oxide semiconductor layers 431 and 432, which results in selective etching of the oxide conductive layers 406 and 407 over the oxide semiconductor layers 431 and 432.

It is preferable that the oxide conductive layers 406 and 407 be layers not containing an indium oxide but containing a zinc oxide as a component. As examples of a material which can be used for the oxide conductive layers 406 and 407, there are a zinc oxide, a zinc aluminum oxide, a zinc aluminum oxynitride, a zinc gallium oxide and the like.

The oxide conductive layers 406 and 407 can be etched using the source electrode layer 415a and the drain electrode layer 415b which are formed thereover using masks. The oxide conductive layers 406 and 407 can be easily etched with an alkaline solution such as a resist stripper when they contain a zinc oxide as a component.

As described above, the island-shaped oxide semiconductor layers 431 and 432 are formed by etching the oxide semiconductor film 430; then, the oxide conductive layers 406 and 407 and the metal film are stacked thereover; and a wiring pattern including the source electrodes and the drain electrodes is formed by the etching treatment using the same masks, whereby the oxide conductive layers 406 and 407 can be left below the wiring patterns formed using the metal films.

Then, after the resist mask 436a and the resist mask 436b are removed, a fifth photolithography step is performed so that a resist mask 438a and a resist mask 438b are formed and selective etching is performed to remove the conductive layer 425a and part of the conductive layer 425b over which the resist mask 438b is not formed. By removing part of the conductive layer 425b over which the resist mask 438b is not formed, the conductive layer 426 can be formed (see FIG. 2E).

Note that since the conductive layers which overlap with the source electrode layer 409a and the drain electrode layer 409b are selectively etched in the fifth photolithography step, materials for the oxide semiconductor layer 432, the source electrode layer 409a, and the drain electrode layer 409b and etching conditions are appropriately adjusted so that they are not removed at the time of etching the conductive layers.

In the fifth photolithography step, only part of the conductive layer, which is on and in contact with the oxide semiconductor layer, is selectively etched. Thus, when an ammonia peroxide mixture (hydrogen peroxide:ammonia:water=5:2:2) or the like as an alkaline etchant is used in order to selectively remove only part of the conductive layer, which is on and in contact with the oxide semiconductor layer, the metal conductive film can be selectively removed so that the oxide semiconductor layer containing an In—Ga—Zn—O-based oxide semiconductor can be left.

The conductive layer 426 is provided over part of the drain electrode layer 409b, whereby the pixel electrode layer 427 is electrically connected to the drain electrode layer 409b via the conductive layer 426. In this manner, by providing the conductive layer 426 over the drain electrode layer 409b, contact resistance can be reduced.

Then, the oxide insulating film 416 which is a protective insulating film is formed to be in contact with the oxide semiconductor layer 431 and the oxide semiconductor layer 432.

The oxide insulating film 416 can be formed as appropriate using a sputtering method or the like that is a method by which impurities such as water and hydrogen are not mixed into the oxide insulating film 416, to have a thickness at least greater than or equal to 1 nm. The oxide insulating film 416 which is formed in contact with the low-resistance oxide semiconductor layer is formed using an inorganic insulating film that does not contain impurities such as moisture, hydrogen ions, and OH⁻ and blocks entry of such impurities from the outside, typically a silicon oxide film, a silicon nitride oxide film, an aluminum oxide film, or an aluminum oxynitride film. In this embodiment, a silicon oxide film is formed to a thickness of 300 nm as the oxide insulating film 416 by a sputtering method. The substrate temperature in the film formation may be higher than or equal to room temperature and lower than or equal to 300° C., and is set at 100° C. in this embodiment. The formation of the silicon oxide film by a sputtering method can be performed in a rare gas (typically, argon) atmosphere, an oxygen atmosphere, or an atmosphere containing a rare gas (typically, argon) and oxygen. As a target, a silicon oxide target or a silicon target can be used. Alternatively, a silicon oxide film may be formed using a silicon target doped with boron, whereby a higher barrier property against water or hydrogen can be obtained. For example, the silicon oxide film can be formed using a silicon target by a sputtering method in an atmosphere containing oxygen and nitrogen (see FIG. 3A).

Next, second heat treatment in an inert gas atmosphere or an oxygen gas atmosphere (preferably at a temperature higher than or equal to 200° C. and lower than or equal to 400° C., for example, higher than or equal to 250° C. and lower than or equal to 350° C.) is performed. For example, the second heat treatment is performed in a nitrogen atmosphere at 250° C. for one hour. By the second heat treatment, the oxide semiconductor layer 431 and the oxide semiconductor layer 432 are heated while being in contact with the oxide insulating film 416.

In this manner, the silicon oxide film as a protective film on the back channel side is formed by a sputtering method and then the heat treatment at 250° C. to 350° C. inclusive is performed, whereby oxygen is introduced into and diffused in the oxide semiconductor layer 431 and the oxide semiconductor layer 432 from exposed parts of the oxide semiconductor layer 431 and the oxide semiconductor layer 432. By being formed by a sputtering method, the silicon oxide film can be made to be in an oxygen excess state, which enables the oxygen to be introduced into and diffused in the oxide semiconductor layers 431 and 432 by the heat treatment. When oxygen is introduced into and diffused in the oxide semiconductor layers 431 and 432, the channel formation regions can be changed into high-resistance channel formation regions, i.e., i-type channel formation regions. Thus, a normally-off thin film transistor can be obtained. In addition, by the heat treatment which makes the oxygen to be introduced into and diffused in the oxide semiconductor layers 431 and 432, the oxide semiconductor layers 431 and 432 formed as a source region and a drain region can be crystallized and can have an improved conductivity.

Further, the oxide semiconductor film after being deposited is subjected to heat treatment for dehydration or dehydrogenation so as to have a reduced resistance and to be a high-resistance drain region (an HRD region). Part of the high-resistance drain region is selectively made to be in an oxygen excess state. As a result, the channel formation region 413 which overlaps with the gate electrode layer 411 becomes i-type; the channel formation region 423 overlapping with the gate electrode layer 421 becomes i-type; the high-resistance drain region 414a which overlaps with the source electrode layer 415a and the high-resistance drain region 414b which overlaps with the drain electrode layer 415b are formed in a self-aligned manner; and the high-resistance drain region 424a which overlaps with the source electrode layer 409a and the high-resistance drain region 424b which overlaps with the drain electrode layer 409b are formed in a self-aligned manner (see FIG. 3A).

By the formation of the high-resistance drain region 414b (or the high-resistance drain region 414a) in part of the oxide semiconductor layer, which overlaps with the drain electrode layer 415b (and the source electrode layer 415a), reliability at the time when a driver circuit is formed can be improved. Specifically, by the formation of the high-resistance drain region 414b, a structure can be obtained in which conductivity can be varied from the drain electrode layer 415b to the channel formation region 413 via the high-resistance drain region 414b. Thus, in the case where operation is performed with the drain electrode layer 415b connected to a wiring for supplying a high power supply potential VDD, the high-resistance drain region 414b serves as a buffer, and thus a high electric field is not applied locally even when the high electric field is applied between the gate electrode layer 411 and the drain electrode layer 415b, which leads to an increase in the withstand voltage of the transistor.

In addition, by the formation of the high-resistance drain region 414b (or the high-resistance drain region 414a) in part of the oxide semiconductor layer, which overlaps with the drain electrode layer 415b (or the source electrode layer 415a), the amount of leakage current in the channel formation region 413 at the time when the driver circuit is formed can be reduced.

Further, by the formation of the high-resistance drain region 424b (or the high-resistance drain region 424a) in part of the oxide semiconductor layer, which overlaps with the drain electrode layer 409b (or the source electrode layer 409a), reliability at the time when a pixel is formed can be improved. Specifically, by the formation of the high-resistance drain region 424b, a structure can be obtained in which conductivity can be varied from the drain electrode layer 409b to the channel formation region 423 via the high-resistance drain region 424b. Thus, in the case where operation is performed with the drain electrode layer 409b connected to a wiring for supplying a high power supply potential VDD, the high-resistance drain region 424b serves as a buffer, and thus a high electric field is not applied locally even when the high electric field is applied between the gate electrode layer 421 and the drain electrode layer 409b, which leads to an increase in the withstand voltage of the transistor.

In addition, by the formation of the high-resistance drain region 424b (or the high-resistance drain region 424a) in part of the oxide semiconductor layer 412, which overlaps with the drain electrode layer 409b (or the source electrode layer 409a), the amount of leakage current in the channel formation region 423 at the time when the pixel is formed can be reduced.

Further, by providing the oxide conductive layer between the oxide semiconductor layer 412 and the source and drain electrode layers 415a and 415b, resistance between the oxide semiconductor layer 412 and the source electrode layer 415a, and between the oxide semiconductor layer 412 and the drain electrode layer 415b can be reduced, and high-speed operation of the transistor can be realized.

Using the low-resistance drain regions 408a and 408b which are formed using the oxide conductive layer is effective in improving the frequency characteristics of the peripheral circuit (driver circuit). This is because contact resistance can be reduced more in the case where a metal electrode (formed using titanium or the like) is in contact with the oxide conductive layer (the low-resistance drain regions 408a and 408b) than in the case where a metal electrode (formed using titanium or the like) is in contact with the oxide semiconductor layer 412. Further, in a case of using molybdenum (for example, a stacked-layer structure of a molybdenum film, an aluminum film, and a molybdenum film), a high contact resistance between the molybdenum and the oxide semiconductor layer 412 has been problematic. This is because molybdenum is not readily oxidized when compared with titanium and thus extracts a small amount of oxygen from the oxide semiconductor layer 412, which does not allow the interface between the molybdenum and the oxide semiconductor layer 412 to be n-type. However, even in that case, by interposing the low-resistance drain region 408a (or a low-resistance drain region 408b) which is formed using the oxide conductive layer between the oxide semiconductor layer 412 and the source electrode layer 415a (or the drain electrode layer 415b), the contact resistance can be reduced and the frequency characteristics of the peripheral circuit (driver circuit) can be improved. The channel length of the thin film transistor is determined by etching of the oxide conductive layers 406 and 407 and thus can be much smaller.

Figure 3A:
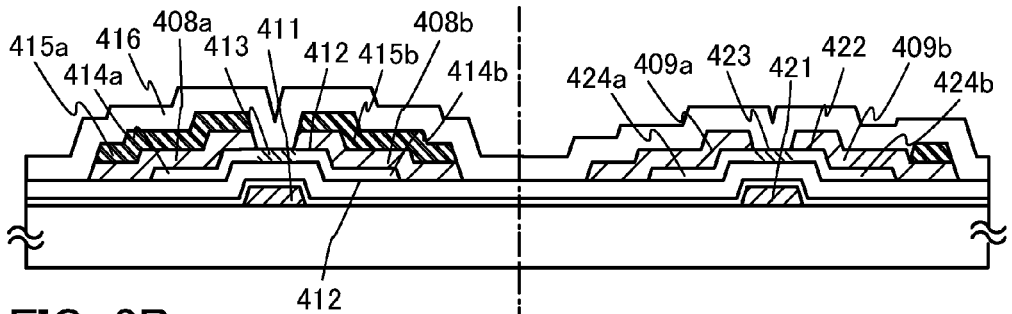
FIGS. 3A to 3E illustrate a method for manufacturing the semiconductor device.
Figure 3B:
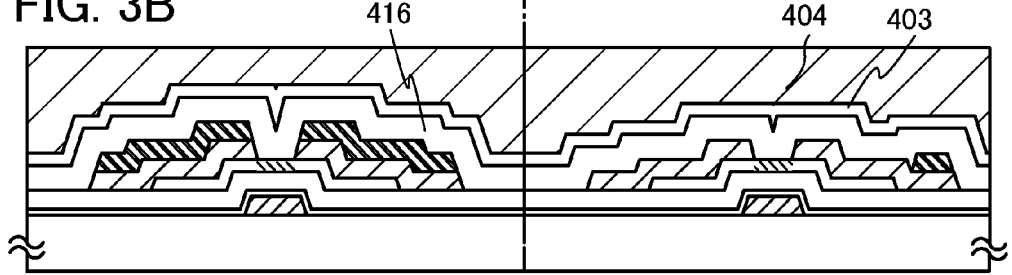

After that, the protective insulating layer 403 is formed over the oxide insulating film 416 (see FIG. 3B). In this embodiment, a silicon nitride film is formed by an RF sputtering method. Since an RF sputtering method allows high productivity, it is preferably used as a deposition method of the protective insulating layer 403. The protective insulating layer 403 is formed using an inorganic insulating film which does not contain impurities such as moisture, a hydrogen ion and OH⁻ and blocks entry of them from the outside; for example, a silicon nitride film, an aluminum nitride film, a silicon nitride oxide film, an aluminum oxynitride film or the like is used. Needless to say, the protective insulating layer 403 is an insulating film having light transmitting properties. Alternatively, a silicon oxide film may be formed using a silicon target doped with boron, whereby a higher barrier property against water or hydrogen can be obtained.

Further, the protective insulating layer 403 is preferably in contact with the second gate insulating layer 402b provided below the protective insulating layer 403 or an insulating film serving as a base and blocks entry of impurities such as moisture, a hydrogen ion, and OH⁻ from the vicinity of a side surface of the substrate. The above structure is effective particularly when a silicon nitride film is used for the second gate insulating layer 402b or the insulating film serving as a base. In other words, the reliability of the display device is improved when a silicon nitride film is provided so as to surround a bottom surface, a top surface, and a side surface of the oxide semiconductor layer.

Then, the planarizing insulating layer 404 is formed over the protective insulating layer 403. The planarizing insulating layer 404 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarizing insulating layer 404 may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the planarizing insulating layer 404, and the planarizing insulating layer 404 can be formed, depending on the material, by a method such as a sputtering method, an SOG method, a spin coating, a dipping, a spray coating, or a droplet discharge method (e.g., an ink-jet method, screen printing, or offset printing), or with a tool (equipment) such as a doctor knife, a roll coater, a curtain coater, or a knife coater.

Note that instead of providing the protective insulating layer 403, the planarizing insulating layer 404 may be formed over the oxide insulating film 416.

Figure 3C:
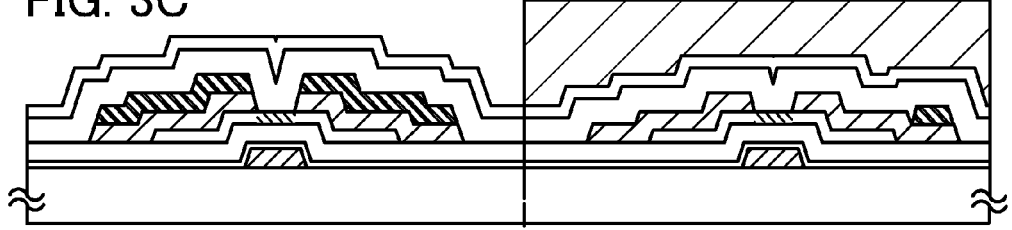

Next, in a sixth photolithography step, a resist mask is formed and the planarizing insulating layer 404 in the driver circuit portion is removed (see FIG. 3C).

Figure 3D:
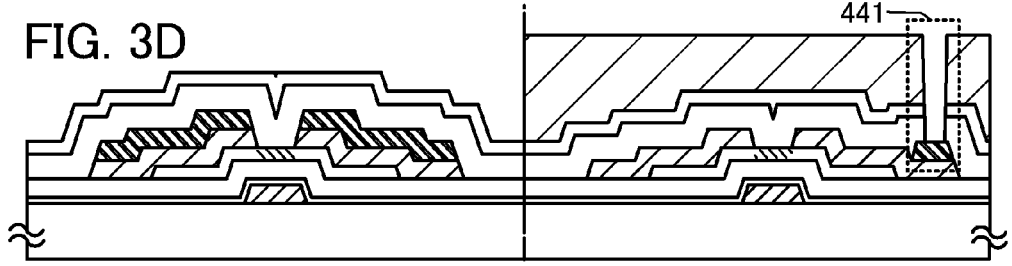

Then, after the resist mask is removed, in a seventh photolithography step, a resist mask is formed and a contact hole 441 reaching the conductive layer 426 is formed by etching the planarizing insulating layer 404, the protective insulating layer 403, and the oxide insulating film 416 (see FIG. 3D). In addition, by this etching, contact holes reaching the gate electrode layers 411 and 421 are also formed (not shown). Further, the resist mask for forming the contact hole reaching the conductive layer 426 may be formed by an ink-jet method. A photomask is not used when the resist mask is formed by an ink-jet method, which results in a reduction in the manufacturing cost.

Next, the resist mask is removed, and then a light-transmitting conductive film is formed. The light-transmitting conductive film is formed using an indium oxide ($In_2O_3$), an indium oxide-tin oxide alloy ($In_2O_3$—$SnO_2$, abbreviated to ITO), or the like by a sputtering method, a vacuum evaporation method, or the like. An Al—Zn—O-based non-single-crystal film, examples of which are an Al—Zn—O—N-based non-single-crystal film, a Zn—O—N-based non-single-crystal film containing nitrogen, and a Sn—Zn—O—N-based non-single-crystal film containing nitrogen, may also be used as the light-transmitting conductive film. Note that the relative proportion (atomic %) of zinc in an Al—Zn—O—N- based non-single-crystal film is less than or equal to 47 atomic % and is larger than the relative proportion (atomic %) of aluminum in the non-single-crystal film. The relative proportion (atomic %) of aluminum in the non-single-crystal film is larger than the relative proportion (atomic %) of nitrogen in the non-single-crystal. Such a material is etched with a hydrochloric acid-based solution. However, since a residue is easily generated particularly in etching ITO, an indium oxide-zinc oxide alloy ($In_2O_3$—ZnO) may be used to improve etching processability.

Note that the unit of the relative proportion in the light-transmitting conductive film is atomic percent, and the relative proportion is evaluated by analysis using an electron probe X-ray microanalyzer (EPMA).

Next, an eighth photolithography step is performed. A resist mask is formed, and an unnecessary portion is removed by etching to form the pixel electrode layer 427 and the conductive layer 417 (see FIG. 3E).

Through the above steps using eight masks, the thin film transistor 410 and the thin film transistor 420 can be manufactured in the driver circuit and the pixel electrode portion, respectively, on one substrate. The thin film transistor 410 for the driver circuit includes the high-resistance drain region 414a, the high-resistance drain region 414b, and the oxide semiconductor layer 412 including the channel formation region 413. The thin film transistor 420 for the pixel includes the high-resistance drain region 424a, the high-resistance drain region 424b, and the oxide semiconductor layer 422 including the channel formation region 423. The thin film transistor 410 and the thin film transistor 420 have a structure in which the high-resistance drain regions serve as buffers and a local high electric field is not applied even when a high electric field is applied; in this manner, the transistors can have an increased withstand voltage.

Further, the channel length L of the thin film transistor 410 provided in the driver circuit is preferably made shorter than that of the thin film transistor 420 provided in the pixel portion. By making the channel length L of the thin film transistor 410 provided in the driver circuit short, operation speed can be improved. The channel length L of the thin film transistor 410 provided in the driver circuit is preferably greater than or equal to 1 μm and less than or equal to 5 μm. The channel length of the thin film transistor 420 provided in the pixel portion is preferably greater than or equal to 5 μm and less than or equal to 20 μm.

In addition, a storage capacitor can be formed by the capacitor wiring layer and the capacitor electrode layer using the first gate insulating layer 402a and the second gate insulating layer 402b as dielectrics. By arranging the thin film transistors 410 and the storage capacitors in matrix corresponding to respective pixels to form a pixel portion, and by arranging the driver circuit including the thin film transistor 420 around the pixel portion, one of the substrates for manufacturing an active matrix display device can be obtained. In this specification, such a substrate is referred to as an active matrix substrate for convenience.

Note that the pixel electrode layer 427 is electrically connected to the capacitor electrode layer through the contact hole which is formed in the planarizing insulating layer 404, the protective insulating layer 403, and the oxide insulating film 416. Note also that the capacitor electrode layer can be formed using the same material and process as the source electrode layer 409a and the drain electrode layer 409b.

In addition, by providing the conductive layer 417 in a position overlapping with the channel formation region 413 of the oxide semiconductor layer, in a bias-temperature stress test (BT test) for examining reliability of a thin film transistor, the amount of change in the threshold voltage of the thin film transistor 410 between before and after the BT test can be reduced. The conductive layer 417 may have the same electric potential as the gate electrode layer 411 or have an electric potential different from that of the gate electrode layer 411 and can function as a second gate electrode layer. The electric potential of the conductive layer 417 may be a GND potential, 0 V, or the conductive layer 417 may be in a floating state.

The resist mask for forming the pixel electrode layer 427 may be formed by an ink-jet method. A photomask is not used when the resist mask is formed by an ink-jet method, which results in a reduction in the manufacturing cost.

Note that in this embodiment, the layers over and below the oxide semiconductor layer 412 and those over and below the oxide semiconductor layer 422 are silicon oxide films. The gate electrode and the gate insulating film can be formed with a plasma CVD apparatus; in other words, a conventional production line for a liquid crystal panel can be used as it is. The silicon oxide film formed on the back channel side is deposited with a sputtering apparatus in room temperature using Si as a target, and Ar and oxygen as a sputtering gas.

Figure 41A:
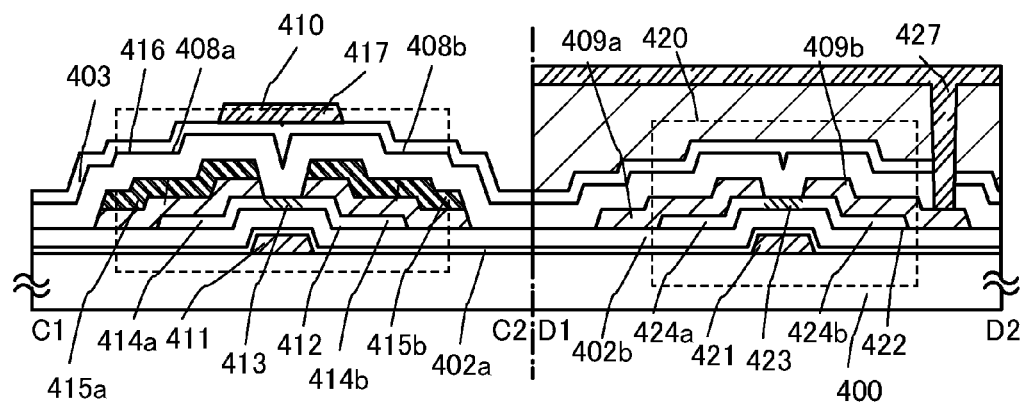
FIGS. 41A and 41B each illustrate a semiconductor device.
Figure 41B:
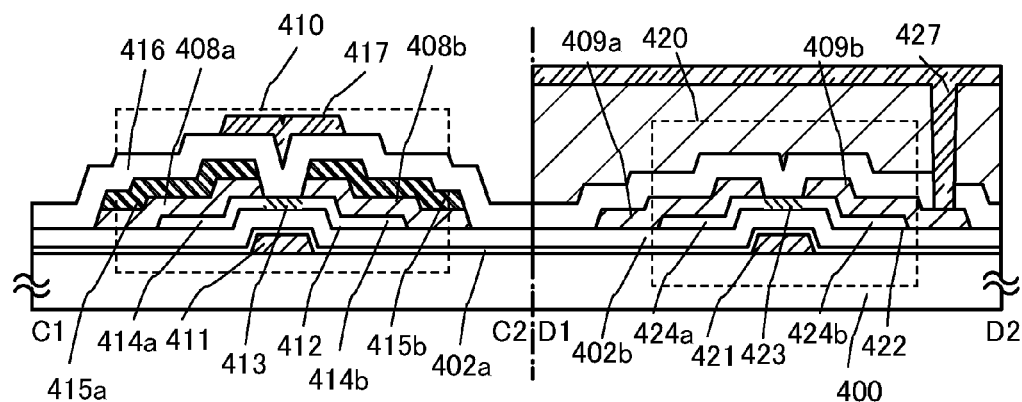

Note that, as illustrated in FIG. 1B2, a structure in which the conductive layer 426 is formed over the drain electrode layer 409b of the thin film transistor 420 for the pixel portion is described in this embodiment; however, a structure without the conductive layer 426 which is illustrated in FIG. 41A can be employed. Further, as illustrated in FIG. 1B1, a structure in which the conductive layer 417 is provided over the protective insulating layer 403 covering the thin film transistor 410 for the driver circuit is described; however, a structure can be employed in which the protective insulating layer 403 is not provided and the conductive layer 417 is provided over the oxide insulating film 416 as illustrated in FIG. 41B.

This embodiment can be freely combined with any of other embodiments.

(Embodiment 2)

Figure 3E:
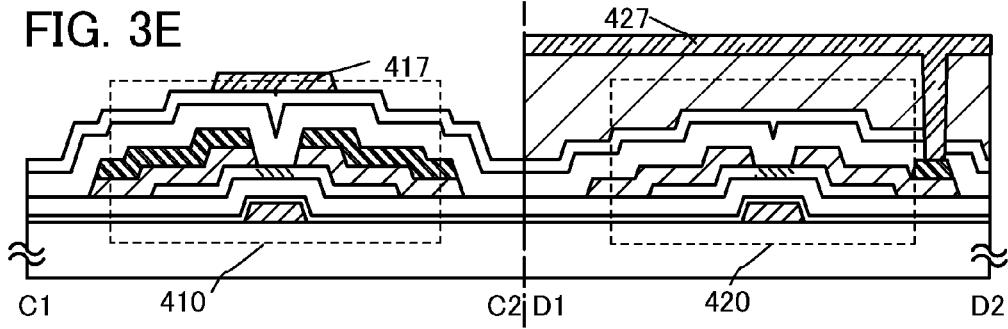
Figure 4A:
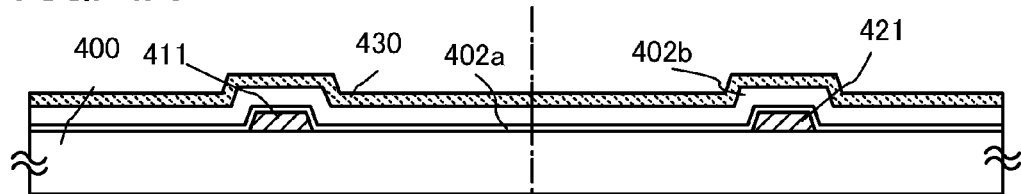
FIGS. 4A to 4C illustrate a method for manufacturing a semiconductor device.
Figure 4B:
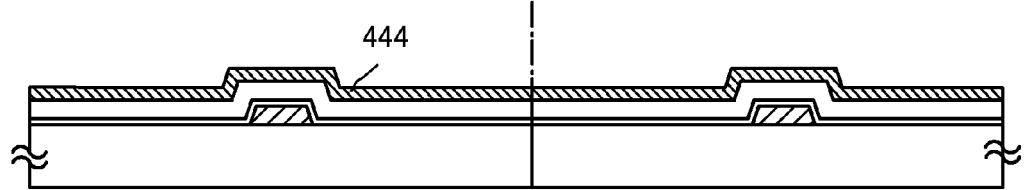
Figure 4C:
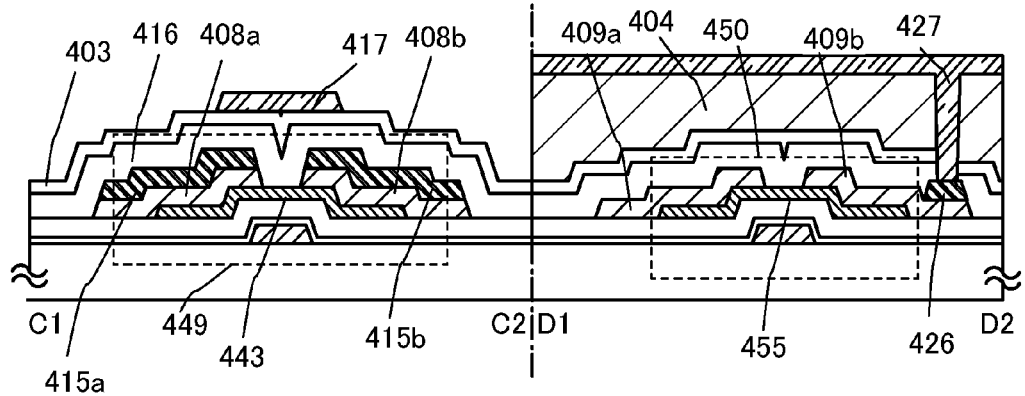

In FIG. 4A to 4C, an example the first heat treatment of which is different from that in Embodiment 1 is illustrated. Since the process described in this embodiment is the same as that illustrated in FIGS. 1A1 to 1C2, FIGS. 2A to 2E, and FIGS. 3A to 3E, the same portions as those in FIGS. 1A1 to 1C2, FIGS. 2A to 2E, and FIGS. 3A to 3E are denoted by the same reference numerals and detailed description on the portions is omitted.

FIGS. 4A to 4C are cross-sectional views illustrating steps of manufacturing two thin film transistors.

First, in accordance with Embodiment 1, a light-transmitting conductive film is formed over the substrate 400 having an insulating surface and then the gate electrode layers 411 and 421 are formed in a first photolithography step.

Next, the first gate insulating layer 402a and the second gate insulating layer 402b are stacked over the gate electrode layers 411 and 421.

Then, the oxide semiconductor film 430 is formed to a thickness greater than or equal to 2 nm and less than or equal to 200 nm over the second gate insulating layer 402b (see FIG. 4A). Note that the above steps are the same as in Embodiment 1 and FIG. 4A corresponds to FIG. 2A.

After that, the oxide semiconductor film is dehydrated or dehydrogenated in an inert gas atmosphere. A temperature of the first heat treatment for dehydration or dehydrogenation is higher than or equal to 350° C. and lower than the strain point of the substrate, preferably higher than or equal to 400° C. Here, the substrate is introduced into an electric furnace that is a kind of heat treatment apparatus and the oxide semiconductor film is subjected to heat treatment in a nitrogen atmosphere; then, the oxide semiconductor film becomes an oxygen deficient layer and has low resistance, that is, the oxide semiconductor film becomes an n-type (such as n⁻-type or n⁺-type) layer, without being exposed to the air and thus without any water or hydrogen entering the oxide semiconductor film. After that, a high-purity oxygen gas, a high-purity $N_2O$ gas, or an ultra-dry air (having a dew point of lower than or equal to −40° C., preferably lower than or equal to −60° C.) is introduced into the same furnace and cooling is performed. It is preferable that the oxygen gas or $N_2O$ gas do not contain water, hydrogen, and the like. Alternatively, it is preferable that the oxygen gas or $N_2O$ gas introduced into the heat treatment apparatus have purity of 4N (99.99%) or more, more preferably, 6N (99.9999%) or more; that is, the impurity concentration of the oxygen gas or $N_2O$ gas is preferably set to 20 ppm or lower, more preferably, 1 ppm or lower.

In addition, after the first heat treatment for dehydration or dehydrogenation, heat treatment may be performed at a temperature higher than or equal to 200° C. and lower than or equal to 400° C., preferably at a temperature higher than or equal to 200° C. and lower than or equal to 300° C. in an oxygen gas atmosphere, a $N_2O$ gas atmosphere, or an ultra-dry air (having a dew point of lower than or equal to −40° C., preferably lower than or equal to −60° C.).

Through the above process, the entire oxide semiconductor film 430 is made to be in an oxygen excess state, whereby the oxide semiconductor film is changed into a high-resistance oxide semiconductor film, i.e., an i-type oxide semiconductor film; thus, an oxide semiconductor film 444 is formed (see FIG. 4B). As a result, the reliability of the thin film transistor to be completed later can be improved.

Note that although the dehydration or dehydrogenation is performed after the deposition of the oxide semiconductor film in this embodiment, the present invention is not particularly limited and the first heat treatment can be alternatively performed after the formation of the island-shaped oxide semiconductor layers similarly to Embodiment 1.

Alternatively, the following process may be employed: the oxide semiconductor film is dehydrated or dehydrogenated in an inert gas atmosphere and cooled in an inert gas atmosphere; after that, the oxide semiconductor film is processed into island-shaped oxide semiconductor layers 443 and 455 in a photolithography step; and then, heat treatment is performed at a temperature higher than or equal to 200° C. and lower than or equal to 400° C., preferably, higher than or equal to 200° C. and lower than or equal to 300° C. in an oxygen gas, a $N_2O$ gas, or an ultra-dry air (having a dew point of lower than or equal to −40° C., preferably lower than or equal to −60° C.).

In addition, before the oxide semiconductor film 430 is formed, heat treatment (at higher than or equal to 400° C. and lower than the strain point of the substrate) may be performed in an inert gas atmosphere (e.g., nitrogen, or helium, neon, or argon), an oxygen atmosphere, or an ultra-dry air (with a dew point of lower than or equal to −40° C., preferably lower than or equal to −60° C.) atmosphere, thereby removing impurities such as hydrogen and water contained in the gate insulating layers.

Then, the oxide semiconductor film 444 is processed into the oxide semiconductor layers 443 and 455 which are island-shaped oxide semiconductor layers in a second photolithography step.

After that, similarly to the steps illustrated in FIGS. 2C to 2E and FIGS. 3A to 3E of Embodiment 1, the low-resistance drain regions 408a and 408b which are in contact with the oxide semiconductor layer 443 are formed; the source electrode layer 415a and the drain electrode layer 415b which are metal conductive layers and in contact with the low-resistance drain regions 408a and 408b are formed; and the oxide insulating film 416 which is in contact with the oxide semiconductor layer 443 is formed, whereby a thin film transistor 449 for the driver circuit is manufactured. Meanwhile, in the pixel portion, the source electrode layer 409a and the drain electrode layer 409b which are light-transmitting conductive layers and in contact with the oxide semiconductor layer 455 are formed; the conductive layer 426 is formed over the drain electrode layer 409b; and the oxide insulating film 416 which is in contact with the oxide semiconductor layer 455 is formed, whereby the thin film transistor 450 for the pixel is manufactured.

Next, the second heat treatment in an inert gas atmosphere or an oxygen gas atmosphere (preferably at a temperature higher than or equal to 200° C. and lower than or equal to 400° C., for example, higher than or equal to 250° C. and lower than or equal to 350° C.) is performed. For example, the second heat treatment is performed in a nitrogen atmosphere at 250° C. for one hour.

Next, the protective insulating layer 403 is formed to cover the thin film transistors 449 and 450 and to be in contact with the oxide insulating film 416 and the planarizing insulating layer 404 is stacked thereover. A contact hole reaching the conductive layer 426 over the drain electrode layer 409b is formed in the oxide insulating film 416, the protective insulating layer 403 and the planarizing insulating layer 404 and then a light-transmitting conductive film is formed in the contact hole and over the planarizing insulating layer 404. The light-transmitting conductive film is selectively etched so that the pixel electrode layer 427 electrically connected to the thin film transistor 450 and the conductive layer 417 which is in a position overlapping with the channel formation region of the oxide semiconductor layer 443 are formed (see FIG. 4C).

Through the above steps using eight masks, the thin film transistor 449 and the thin film transistor 450 in each of which the entire oxide semiconductor layer is an i-type oxide semiconductor layer can be manufactured in the driver circuit and the pixel electrode portion, respectively, on one substrate. The thin film transistor 449 for the driver circuit includes the oxide semiconductor layer 443 which is entirely intrinsic. Similarly, the thin film transistor 450 for the pixel includes the oxide semiconductor layer 455 which is entirely intrinsic.

In addition, a storage capacitor can be formed by the capacitor wiring layer and the capacitor electrode layer using the first gate insulating layer 402a and the second gate insulating layer 402b as dielectrics. By arranging the thin film transistors 450 and the storage capacitors in matrix corresponding to respective pixels to form a pixel portion, and by arranging the driver circuit including the thin film transistor 449 around the pixel portion, one of the substrates for manufacturing an active matrix display device can be obtained.

In addition, by providing the conductive layer 417 in a position overlapping with the channel formation region of the oxide semiconductor layer 443, in a bias-temperature stress test (BT test) for examining reliability of a thin film transistor, the amount of change in the threshold voltage of the thin film transistor 449 between before and after the BT test can be reduced. The conductive layer 417 may have the same electric potential as the gate electrode layer 411 or have an electric potential different from that of the gate electrode layer 411 and can function as a second gate electrode layer. The electric potential of the conductive layer 417 may be a GND potential, 0 V, or the conductive layer 417 may be in a floating state.

The resist mask for forming the pixel electrode layer 427 may be formed by an ink-jet method. A photomask is not used when the resist mask is formed by an ink-jet method, which results in a reduction in the manufacturing cost.

Note that in this embodiment, the layers over and below the oxide semiconductor layer 483 and those over and below the oxide semiconductor layer 485 are silicon oxide films. The gate electrode and the gate insulating film can be formed with a plasma CVD apparatus; in other words, a conventional production line for a liquid crystal panel can be used as it is. The silicon oxide film formed on the back channel side is deposited with a sputtering apparatus in room temperature using Si as a target, and Ar and oxygen as a sputtering gas.

This embodiment can be freely combined with any of other embodiments.

(Embodiment 3)

A manufacturing method of a semiconductor device, which differs from Embodiment 1 is described with reference to FIGS. 5A to 5E. The same portion as or a portion having functions similar to those described in Embodiment 1 can be formed in a manner similar to that described in Embodiment 1; therefore, repetitive description is omitted.

FIGS. 5A to 5E are cross-sectional views illustrating steps of manufacturing two thin film transistors.

Figure 5A:
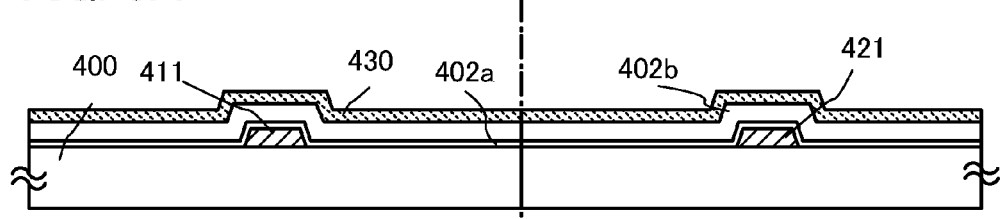
FIGS. 5A to 5E illustrate a method for manufacturing a semiconductor device.
Figure 5B:
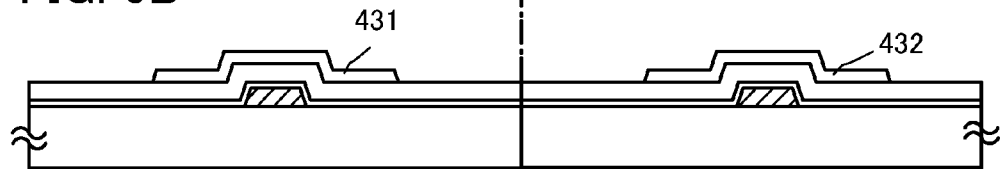

Similarly to the step illustrated in FIG. 2A of Embodiment 1, the gate electrode layer 411 and the gate electrode layer 421 are formed in the first photolithography step over the substrate 400 having an insulating surface; the first gate insulating layer 402a and the second gate insulating layer 402b which are gate insulating layers over the gate electrode layer 411 and the gate electrode layer 421; and the oxide semiconductor film 430 is formed over the second gate insulating layer 402b (see FIG. 5A).

Then, the oxide semiconductor film 430 is processed into island-shaped oxide semiconductor layers in the second photolithography step.

After that, similarly to the step illustrated in FIG. 2B of Embodiment 1, the oxide semiconductor layers are dehydrated or dehydrogenated by the first heat treatment. A temperature of the first heat treatment for dehydration or dehydrogenation is higher than or equal to 350° C. and lower than the strain point of the substrate, preferably higher than or equal to 400° C. Here, the oxide semiconductor layer 431 and the oxide semiconductor layer 432 are obtained in such a manner that: the substrate is introduced into an electric furnace that is a kind of heat treatment apparatus; the oxide semiconductor layers are subjected to the heat treatment in a nitrogen atmosphere; and the layers are prevented from being exposed to the air and thus water and hydrogen are prevented from entering the oxide semiconductor layers (see FIG. 5B).

Figure 5C:
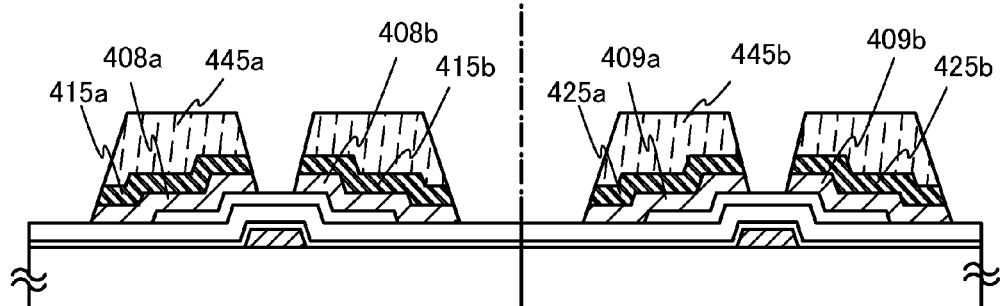
Figure 5D:
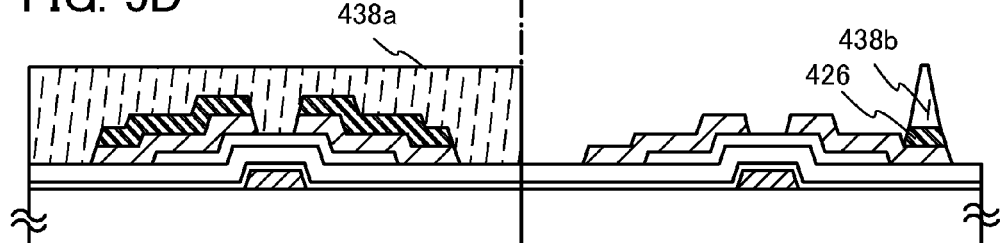
Figure 5E:
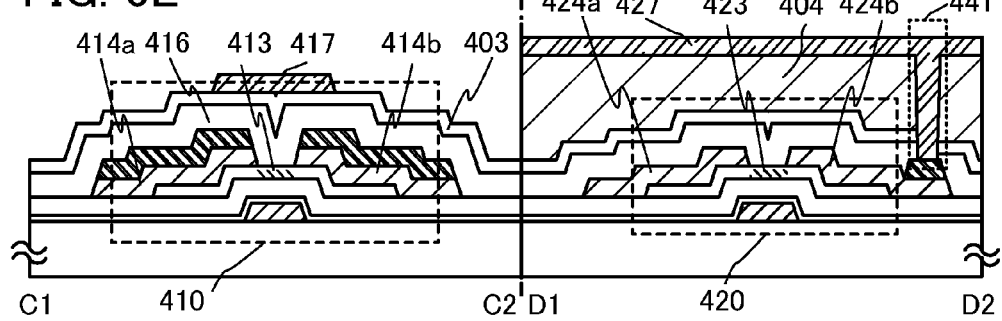

Next, an oxide conductive film is formed over the oxide semiconductor layers 431 and 432 and the second gate insulating layer 402b; a metal conductive film is formed over the oxide conductive film; and then, in a third photolithography step, a resist mask 445a and a resist mask 445b are formed and selective etching is performed so as to form the low-resistance drain regions 408a and 408b, the source electrode layer 409a, the drain electrode layer 409b, the source electrode layer 415a, the drain electrode layer 415b, and the conductive layers 425a and 425b (see FIG. 5C). As the material for the oxide conductive film and the metal conductive film, a material which is similar to that of Embodiment 1 can be used.

Note that in this etching process, etching conditions may be set as appropriate such that the oxide semiconductor layers 431 and 432 in lower layers can remain. For instance, the etching time may be controlled.

A material etching selectivity of which is high is preferably used as a material of the oxide semiconductor layers 431 and 432 and a material of the oxide conductive layers 406 and 407. For example, as the material of the oxide semiconductor layers, a metal oxide material containing Sn (such as SnZnOx, SnGaZnOx, or the like) is used and as the material of the oxide conductive layers, ITO, AZO, AZON, ZnO, GZO, IZO, or the like may be used.

Then, after the resist mask 445a and the resist mask 445b are removed, a fourth photolithography step is performed so that the resist mask 438a and the resist mask 438b are formed and selective etching is performed to remove the conductive layer 425a and part of the conductive layer 425b over which the resist mask 438b is not formed. By removing part of the conductive layer 425b over which the resist mask 438b is not formed, the conductive layer 426 can be formed (see FIG. 5D).

Note that since the conductive layers which overlap with the source electrode layer 409a and the drain electrode layer 409b are selectively etched in the fourth photolithography step, materials for the oxide semiconductor layer 432, the source electrode layer 409a, and the drain electrode layer 409b and etching conditions are appropriately adjusted so that they are not removed at the time of etching the conductive layers.

Note that the oxide semiconductor film 430 preferably has a thickness less than or equal to 50 nm in order to be kept amorphous. More preferably, the thickness of the region with a small thickness in a completed thin film transistor is greater than or equal to 5 nm and less than or equal to 20 nm.

Further, the channel length L of the thin film transistor 410 provided in the completed driver circuit is preferably made shorter than that of the thin film transistor 420 provided in the pixel portion. By making the channel length L of the thin film transistor 410 provided in the driver circuit short, operation speed can be improved. The channel length L of the thin film transistor 410 provided in the driver circuit is preferably greater than or equal to 1 μm and less than or equal to 5 μm. The channel length of the thin film transistor 420 provided in the pixel portion is preferably greater than or equal to 5 μm and less than or equal to 20 μm.

After that, similarly to the step illustrated in FIG. 3A of Embodiment 1, the oxide insulating film 416 which is a protective insulating film is formed to be in contact with the oxide semiconductor layers 431 and 432, and the second heat treatment is performed. Accordingly, the channel formation region 413 which overlaps with the gate electrode layer 411 becomes i-type; the channel formation region 423 overlapping with the gate electrode layer 421 becomes i-type; the high-resistance drain region 414a which overlaps with the source electrode layer 415a and the high-resistance drain region 414b which overlaps with the drain electrode layer 415b are formed in a self-aligned manner; and the high-resistance drain region 424a which overlaps with the source electrode layer 409a and the high-resistance drain region 424b which overlaps with the drain electrode layer 409b are formed in a self-aligned manner.

Then, similarly to the step illustrated in FIG. 3B of Embodiment 1, the protective insulating layer 403 is formed over the oxide insulating film 416, and the planarizing insulating layer 404 is formed over the protective insulating layer 403. Similarly to the step illustrated in FIG. 3C of Embodiment 1, in a fifth photolithography step, a resist mask is formed and the planarizing insulating layer 404 in the driver circuit portion is removed. After that, similarly to the step illustrated in FIG. 3D of Embodiment 1, in a sixth photolithography step, a resist mask is formed so that the contact hole 441 reaching the conductive layer 426 is formed by etching the planarizing insulating layer 404, the protective insulating layer 403, and the oxide insulating film 416.

After that, similarly to the step illustrated in FIG. 3E of Embodiment 1, a light-transmitting conductive film is formed and a seventh photolithography step is performed. A resist mask is formed, and an unnecessary portion is removed by etching to form the pixel electrode layer 427 and the conductive layer 417 (see FIG. 5E).

Through the above steps using seven masks, the thin film transistor 410 and the thin film transistor 420 can be manufactured in the driver circuit and the pixel electrode portion, respectively, on one substrate. In addition, the number of masks can be smaller than that in the manufacturing process of Embodiment 1. The thin film transistor 410 for the driver circuit includes the high-resistance drain region 414a, the high-resistance drain region 414b, and the oxide semiconductor layer 412 including the channel formation region 413. The thin film transistor 420 for the pixel includes the high-resistance drain region 424a, the high-resistance drain region 424b, and the oxide semiconductor layer 422 including the channel formation region 423. The thin film transistor 410 and the thin film transistor 420 have a structure in which the high-resistance drain regions serve as buffers and a local high electric field is not applied even when a high electric field is applied; in this manner, the transistors can have an increased withstand voltage.

This embodiment can be freely combined with any of other embodiments.

(Embodiment 4)

A semiconductor device different from that of Embodiment 1 and a method for manufacturing the semiconductor device will be described with reference to FIGS. 6A1, 6A2, 6B1, 6B2, 6C1, and 6C2, FIGS. 38A to 38E, and FIGS. 39A to 39E. FIGS. 6B1, 6B2, 6C1, and 6C2 illustrate examples of cross-sectional structures of two transistors with different structures formed over one substrate. A thin film transistor 460 and a thin film transistor 470 illustrated in FIGS. 6A1, 6A2, 6B1, 6B2, 6C1, and 6C2 are each a kind of bottom gate transistor.

FIG. 6A1 is a plan view of the thin film transistor 460 provided in a driver circuit. FIG. 6B1 is a cross-sectional view taken along line G1-G2 in FIG. 6A1. In addition, FIG. 6C1 is a cross-sectional view taken along line G3-G4 in FIG. 6A1.

The thin film transistor 460 provided in the driver circuit includes, over a substrate 451 having an insulating surface, a gate electrode layer 461; a first gate insulating layer 452a; a second gate insulating layer 452b; an oxide semiconductor layer 462 including at least a channel formation region 463, and a high-resistance drain region 464a and a high-resistance drain region 464b; a low-resistance drain region 446a and a low-resistance drain region 446b; a source electrode layer 465a; and a drain electrode layer 465b. Moreover, an oxide insulating film 466 which covers the thin film transistor 460 and is in contact with the channel formation region 463 is provided.

The high-resistance drain region 464a is formed in contact with the bottom surface of the low-resistance drain region 446a in a self-aligned manner. In addition, the high-resistance drain region 464b is formed in contact with the bottom surface of the low-resistance drain region 446b in a self-aligned manner. The channel formation region 463 is in contact with the oxide insulating film 466 and is a region with higher resistance than the high-resistance drain region 464a and the high-resistance drain region 464b (i.e., an i-type region).

Further, the provision of the low-resistance drain regions 446a and 446b enables the thin film transistor 460 to be operated more stably also in terms of heat than a thin film transistor with a Schottky junction. The low-resistance drain region with a higher carrier concentration than the oxide semiconductor layer is intentionally provided as described above, whereby an ohmic contact is formed.

In order to reduce the resistance of a wiring in the thin film transistor 460, a metal material is preferably used for the source electrode layer 465a and the drain electrode layer 465b.

When a pixel and a driver circuit are formed over one substrate in a liquid crystal display device, in the driver circuit, only either positive voltage or negative voltage is applied between a source electrode and a drain electrode of a thin film transistor included in a logic gate such as an inverter circuit, a NAND circuit, a NOR circuit, or a latch circuit and a thin film transistor included in an analog circuit such as a sense amplifier, a constant voltage generation circuit, or a VCO. Thus, the high-resistance drain region 464b which requires a high withstand voltage may be designed to be wider than the high-resistance drain region 464a. Moreover, the width of the high-resistance drain regions 464a and 464b that overlap with the gate electrode layer may be increased.

The thin film transistor 460 provided in the driver circuit is described using a single-gate thin film transistor; a multi-gate thin film transistor including a plurality of channel formation regions can be formed when needed.

Furthermore, a conductive layer 467 is provided above the channel formation region 463 so as to overlap with the channel formation region 463. The conductive layer 467 is electrically connected to the gate electrode layer 461 so that the conductive layer 467 and the gate electrode layer 461 have the same electric potential, whereby a gate voltage can be applied from above and below the oxide semiconductor layer 462 provided between the gate electrode layer 461 and the conductive layer 467. Alternatively, when the gate electrode layer 461 and the conductive layer 467 are made to have different electric potentials, for example, when the conductive layer 467 has a fixed electric potential, a GND potential, or 0 V, the electrical characteristics of the TFT, such as the threshold voltage, can be controlled.

Further, a protective insulating layer 453 is provided between the conductive layer 467 and the oxide insulating film 466.

The protective insulating layer 453 is preferably in contact with the second gate insulating layer 452b provided below the protective insulating layer 453 or an insulating film serving as a base, and blocks entry of impurities such as moisture, a hydrogen ion, and OH⁻ from the side surface of the substrate. It is particularly effective to use a silicon nitride film as the protective insulating layer 453, the second gate insulating layer 452b, or the insulating film serving as a base.

FIG. 6A2 is a plan view of the thin film transistor 470 provided in a pixel. FIG. 6B2 is a cross-sectional view taken along line H1-H2 in FIG. 6A2. In addition, FIG. 6C2 is a cross-sectional view taken along line H3-H4 in FIG. 6A2.

The thin film transistor 470 provided in the pixel includes, over the substrate 451 having an insulating surface, a gate electrode layer 471; the first gate insulating layer 452a, the second gate insulating layer 452b; an oxide semiconductor layer 472 including at least a channel formation region 473 and a high-resistance drain region 474a and a high-resistance drain region 474b; a source electrode layer 447a; and a drain electrode layer 447b. In addition, the oxide insulating film 466 which covers the thin film transistor 470 and is in contact with the upper surface and the side surface of the oxide semiconductor layer 472 is provided.

An AC drive is performed in the liquid crystal display device in order to prevent deterioration of liquid crystals. Through the AC drive, the polarity of a signal potential applied to a pixel electrode layer is inverted to be positive or negative every predetermined period. In a TFT which is connected to the pixel electrode layer, a pair of electrodes function as a source electrode layer and a drain electrode layer. In this specification, one of a pair of electrodes of a thin film transistor in a pixel is referred to as a source electrode layer and the other is referred to as a drain electrode layer for convenience; actually, in the AC drive, one of electrodes alternately functions as a source electrode layer and a drain electrode layer. In addition, in order to reduce the amount of leakage current, the width of the gate electrode layer in the thin film transistor 470 provided in the pixel may be made narrower than the width of the gate electrode layer in the thin film transistor 460 provided in the driver circuit. In addition, in order to reduce the amount of leakage current, the gate electrode layer of the thin film transistor 470 provided in the pixel may be designed so as not to overlap with the source electrode layer or the drain electrode layer.

Further, a conductive layer 476 is provided over part of the drain electrode layer 447b so that the pixel electrode layer is electrically connected to the drain electrode layer 447b via the conductive layer 476. The conductive layer 476 is provided over the drain electrode layer 447b, whereby contact resistance can be reduced.

The high-resistance drain region 474a is formed in contact with the bottom surface of the source electrode layer 447a in a self-aligned manner. In addition, the high-resistance drain region 474b is formed in contact with the bottom surface of the drain electrode layer 447b in a self-aligned manner. The channel formation region 473 is in contact with the oxide insulating film 466 and is a region with higher resistance than the high-resistance drain region 474a and the high-resistance drain region 474b (i.e., an i-type region).

Further, heat treatment (i.e., heat treatment for dehydration or dehydrogenation) is performed on the oxide semiconductor layer 462 and the oxide semiconductor layer 472 in order to reduce impurities such as moisture after at least an oxide semiconductor film is formed. The carrier concentration of the oxide semiconductor layer is lowered by, for example, forming an oxide insulating film so as to be in contact with the oxide semiconductor layer after the heat treatment for dehydration or dehydrogenation and slow cooling are performed, which leads to improvement in the electrical characteristics and the reliability of the thin film transistor 470.

The oxide semiconductor layer 462 is formed below the source electrode layer 465a and the drain electrode layer 465b and parts of the oxide semiconductor layer 462 overlap with the source electrode layer 465a and the drain electrode layer 465b. In addition, the oxide semiconductor layer 462 overlaps with the gate electrode layer 461 with the first gate insulating layer 452a and the second gate insulating layer 452b interposed therebetween. Further, the oxide semiconductor layer 472 is formed below the source electrode layer 447a and the drain electrode layer 447b and parts of the oxide semiconductor layer 472 overlap with the source electrode layer 447a and the drain electrode layer 447b. In addition, the oxide semiconductor layer 472 overlaps with the gate electrode layer 471 with the first gate insulating layer 452a and the second gate insulating layer 452b interposed therebetween.

Further, for realizing a display device with a high aperture ratio, the source electrode layer 447a and the drain electrode layer 447b are formed using a light-transmitting conductive film so that the thin film transistor 470 can serve as a light-transmitting thin film transistor. Moreover, the gate electrode layer 421 of the thin film transistor 420 is also formed using a light-transmitting conductive film.

In the pixel in which the thin film transistor 470 is provided, a conductive film that transmits visible light is used for the pixel electrode layer 477, another electrode layer (e.g., a capacitor electrode layer), or another wiring layer (e.g., a capacitor wiring layer); thus, a display device with a high aperture ratio is realized. Needless to say, it is preferable to use a conductive film that transmits visible light for the first gate insulating layer 452a, the second gate insulating layer 452b, and the oxide insulating film 466.

Further, the protective insulating layer 453 and a planarizing insulating layer 454 are provided between the pixel electrode layer 477 and the oxide insulating film 466.

In this specification, a film that transmits visible light refers to a film having a visible light transmittance of 75% to 100%; when the film has conductivity, it is also referred to as a transparent conductive film. A conductive film that is semi-transparent to visible light may be used for a metal oxide applied to the gate electrode layer, the source electrode layer, the drain electrode layer, the pixel electrode layer, another electrode layer, or another wiring layer. When a conductive film is semitransparent to visible light, it has a transmittance of visible light of 50% to 75%.

A process for manufacturing the thin film transistor 460 and the thin film transistor 470 over one substrate will be described below with reference to FIGS. 38A to 38E and FIGS. 39A to 39E.

First, a light-transmitting conductive film is formed over the substrate 451 having an insulating surface, and then the gate electrode layers 461 and 471 are formed in a first photolithography step. In addition, a capacitor wiring is formed in the pixel portion, using the same material as the gate electrode layers 461 and 471 in the first photolithography step. Further, when a capacitor is needed in the driver circuit as well as in the pixel portion, the capacitor wiring is also formed in the driver circuit. Note that the resist mask may be formed by an ink-jet method. The formation of the resist mask by an ink-jet method does not need a photomask, which results in a reduction in the manufacturing cost. Then, the first gate insulating layer 452a and the second gate insulating layer 452b are formed over the gate electrode layer 461.

The substrate 400 having an insulating surface, the gate electrode layers 411 and 421, the first gate insulating layer 402a, and the second gate insulating layer 402b described in Embodiment 1 may be referred to for the substrate 451 having an insulating surface, the gate electrode layers 461 and 471, the first gate insulating layer 452a, and the second gate insulating layer 452b, respectively; therefore, the detailed description is omitted.

Figure 38A:
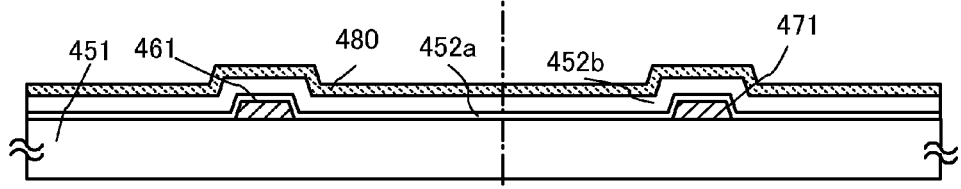
FIGS. 38A to 38E illustrates a method for manufacturing a semiconductor device.
Figure 38B:
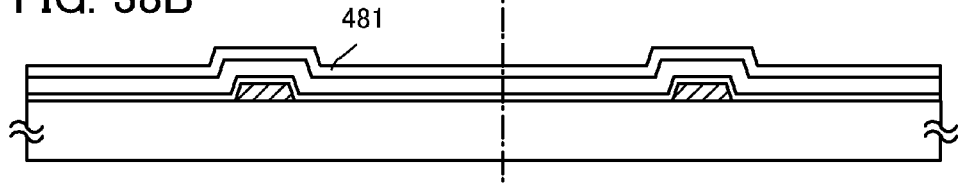

Next, an oxide semiconductor film 480 is formed to a thickness of 2 nm to 200 nm inclusive over the second gate insulating layer 452b (see FIG. 38A). The oxide semiconductor film 480 preferably has a thickness of 50 nm or less so as to remain in an amorphous state even when heat treatment for dehydration or dehydrogenation is performed after the oxide semiconductor film 480 is formed. The small thickness of the oxide semiconductor film 480 makes it possible to prevent the oxide semiconductor film 480 from being crystallized when heat treatment is performed after the formation of the oxide semiconductor film 480.

Note that before the oxide semiconductor film 480 is formed by a sputtering method, dust attached to the surface of the second gate insulating layer 452b is preferably removed by reverse sputtering in which plasma is generated by introduction of an argon gas. The reverse sputtering refers to a method in which, without application of voltage to a target side, an RF power source is used for application of voltage to the substrate side in an argon atmosphere so that plasma is generated around the substrate to modify a surface. Note that nitrogen, helium, oxygen or the like may be used instead of an argon atmosphere.

As the oxide semiconductor film 480, an In—Ga—Zn—O-based non-single-crystal film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, a Zn—O-based, or an In—Sn—O-based oxide semiconductor film is used. In this embodiment, the oxide semiconductor film 480 is formed by a sputtering method with the use of an In—Ga—Zn—O-based oxide semiconductor target. Alternatively, the oxide semiconductor film 480 can be formed by a sputtering method in a rare gas (typically argon) atmosphere, an oxygen atmosphere, or an atmosphere containing a rare gas (typically argon) and oxygen. In the case where a sputtering method is used, deposition may be performed using a target containing $SiO_2$ of 2 to 10 percent by weight inclusive and SiOx (x>0) which inhibits crystallization may be contained in the oxide semiconductor film, in which case crystallization at the time of the heat treatment for dehydration or dehydrogenation in a later step can be prevented.

Then, the oxide semiconductor film 480 is subjected to dehydration or dehydrogenation. The temperature of first heat treatment for dehydration or dehydrogenation is 350° C. or higher and lower than the strain point of the substrate, preferably 400° C. or higher. Here, the substrate is introduced into an electric furnace that is a kind of heat treatment apparatus and heat treatment is performed on the oxide semiconductor film in a nitrogen atmosphere, and then entry of water and hydrogen into the oxide semiconductor film is prevented with the oxide semiconductor film not exposed to the air; thus, an oxide semiconductor film 481 is obtained (see FIG. 38B). In this embodiment, slow cooling is performed in one furnace in a nitrogen atmosphere from the heating temperature T at which dehydration or dehydrogenation is performed on the oxide semiconductor film 480 to a temperature low enough to prevent entry of water; specifically, the slow cooling is performed until the temperature drops by 100° C. or more from the heating temperature T. The atmosphere of the dehydration or dehydrogenation is not limited to the nitrogen atmosphere, and a rare gas atmosphere (e.g., helium, neon, or argon) may be alternatively used.

Note that in the first heat treatment, it is preferable that water, hydrogen, and the like be not contained in the atmosphere of nitrogen or a rare gas such as helium, neon, or argon. Alternatively, the purity of nitrogen or a rare gas such as helium, neon, or argon which is introduced into the heat treatment apparatus is preferably 4N (99.99%) or more, more preferably 6N (99.9999%) or more (that is, the impurity concentration is preferably 1 ppm or lower, more preferably 20 ppm or lower).

Depending on the conditions of the first heat treatment or the material of the oxide semiconductor film 480, the oxide semiconductor film may be crystallized to be a microcrystalline film or a polycrystalline film.

Alternatively, the first heat treatment can be performed after the oxide semiconductor film is processed to have an island shape.

Before the oxide semiconductor film 480 is formed, impurities such as hydrogen and water contained in the gate insulating layer may be removed by heat treatment (at a temperature higher than or equal to 400° C. and lower than the strain point of the substrate) in an inert gas atmosphere (e.g., nitrogen, helium, neon, or argon) or an oxygen atmosphere.

Then, an oxide conductive film and a metal conductive film are sequentially formed over the oxide semiconductor film 481.

As the deposition method of the oxide conductive film, a sputtering method, a vacuum evaporation method (e.g., an electron beam evaporation method), an arc discharge ion plating method, or a spray method is used. As the material of the oxide conductive film 442, a material which has lower resistance than an oxide semiconductor layer 483 and higher resistance than a metal conductive layer 484 can be used; for example, an In—Sn—Zn—O-based metal oxide, an In—Al—Zn—O-based metal oxide, an Sn—Ga—Zn—O-based metal oxide, an Al—Ga—Zn—O-based metal oxide, an Sn—Al—Zn—O-based metal oxide, an In—Zn—O-based metal oxide, an Sn—Zn—O-based metal oxide, an Al—Zn—O-based metal oxide, an In—O-based metal oxide, an Sn—O-based metal oxide, a Zn—O-based metal oxide, or an In—Sn—O-based metal oxide can be used. The thickness of the oxide conductive film is set within the range of 50 nm to 300 nm as appropriate. In the case where a sputtering method is used, deposition may be performed using a target containing $SiO_2$ of 2 to 10 percent by weight inclusive and SiOx (x>0) which inhibits crystallization may be contained in the oxide conductive film, in which case crystallization at the time of the heat treatment for dehydration or dehydrogenation in a later step can be prevented.

Examples of the material for the metal conductive film include an element selected from Al, Cr, Cu, Ta, Ti, Mo, and W; an alloy containing any of these elements as a component; and an alloy containing the above elements in combination.

The metal conductive film preferably has a three-layer structure in which an aluminum layer is stacked over a titanium layer and a titanium layer is stacked over the aluminum layer, or a three layer structure in which an aluminum layer is stacked over a molybdenum layer and a molybdenum layer is stacked over the aluminum layer. Needless to say, the metal conductive film may have a single-layer structure, a two-layer structure, or a stacked-layer structure including four or more layers.

Note that the first heat treatment may alternatively be performed after the oxide conductive film and the metal conductive film are formed. In the case where the first heat treatment is performed after the oxide conductive film and the metal conductive film are formed, the heat treatment for dehydration or dehydrogenation is performed with the oxide conductive film and the oxide semiconductor film 480 stacked. With this heat treatment, the oxide semiconductor film 480 is crystallized unless a substance which inhibits crystallization, such as silicon oxide, is contained in the oxide semiconductor film 480. A crystal of the oxide semiconductor film 480 grows in a columnar shape from a base surface. Thus, when the metal film above the oxide semiconductor film 480 is etched for forming a source electrode and a drain electrode, an undercut can be prevented from being formed in the oxide semiconductor film 480 below the metal film. With the heat treatment for dehydration or dehydrogenation performed on the oxide conductive film, the conductivity of the oxide semiconductor film 480 can be increased. Note that only the oxide semiconductor film 480 may be subjected to heat treatment performed at a temperature lower than that of the heat treatment of the oxide conductive film.

After the oxide conductive film and the metal conductive film are formed, resist masks 482a and 482b used in a second photolithography step are formed. Note that the resist masks 482a and 482b may be formed by an ink-jet method. The formation of the resist mask by an ink-jet method does not need a photomask, which results in a reduction in the manufacturing cost.

The resist masks 482a and 482b in this embodiment each have a depression or a projection. In other words, those resist masks 482a and 482b can be referred to as a resist mask including a plurality of regions (here, two regions) with different thicknesses. In the resist mask 482a or 482b, a thick region is called a projection of the resist mask 482a or 482b, and a thin region is called a depression of the resist mask 482a or 482b.

In each of the resist masks 482a and 482b, the projection is formed corresponding to a region of the conductive film, which is to be a source electrode layer or a drain electrode layer later, and the depression is formed corresponding to a region of the conductive film, which is to be a channel formation region later.

The resist masks 482a and 482b can be formed using a multi-tone mask. The multi-tone mask is a mask capable of light exposure with multi-level light intensity, and typically, light exposure is performed with three levels of light intensity to provide an exposed region, a half-exposed region, and an unexposed region. With the use of a multi-tone mask, a resist mask with plural thicknesses (typically, two kinds of thicknesses) can be formed by one light exposure and development step. Thus, the use of the multi-tone mask, the number of photomasks can be reduced.

By light exposure using the multi-tone mask and development, the resist masks 482a and 482b each of which has regions with different thicknesses can be formed. Note that without limitation thereto, the resist masks 482a and 482b may be formed without the multi-tone mask.

Figure 38C:
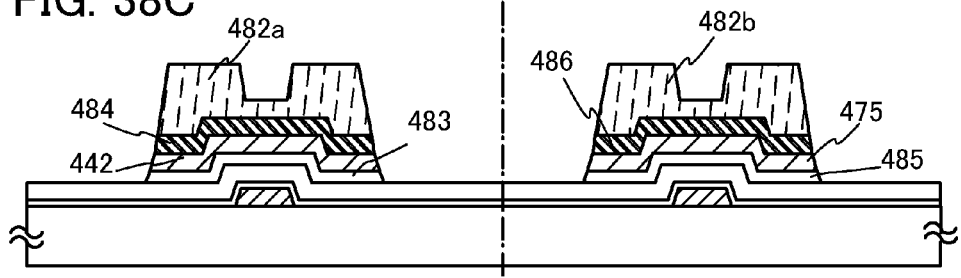

Then, the metal conductive film, the oxide conductive film, and the oxide semiconductor film 481 are selectively and concurrently etched with the use of the resist masks 482a and 482b, whereby island-shaped oxide semiconductor layers 483 and 485, oxide conductive layers 442 and 475, and metal conductive layers 484 and 486 are formed (see FIG. 38C). In the case where a stack of conductive films of a titanium film, an aluminum film, and a titanium film is used as the metal conductive layer, etching can be performed by a dry etching method with the use of a chlorine gas.

Next, the resist masks 482a and 482b are reduced (downsized) to form resist masks 487a and 487b. In order to reduce (downsize) the resist masks, ashing using oxygen plasma or the like may be performed. When the resist masks are reduced (downsized), part of the metal conductive layers 484 and 486 are exposed.

Figure 38D:
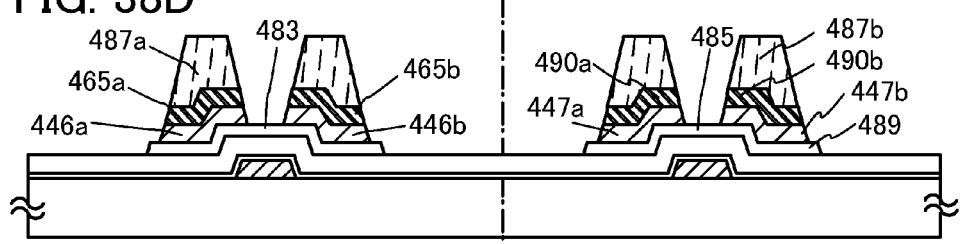
Figure 38E:
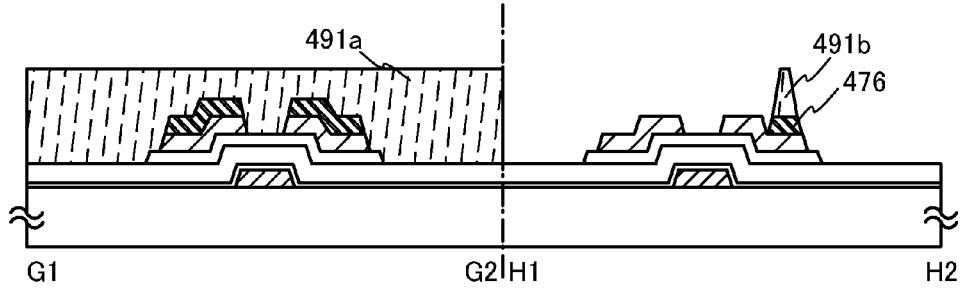

Next, selective etching is performed using the resist masks 487a and 487b to form a source electrode layer 465a, a drain electrode layer 465b, a low-resistance drain region 446a, a low-resistance drain region 446b, a source electrode layer 447a, a drain electrode layer 447b, a conductive layer 490a, and a conductive layer 490b (see FIG. 38D). Note that the edge portions of the oxide semiconductor layer 483 below the source electrode layer 465 and the drain electrode layer 465b extend outward from the outer edges of the source electrode layer 465a and the drain electrode layer 465b. Similarly, the edge portions of the oxide semiconductor layer 485 below the conductive layers 490a and 490b extend outward from the outer edges of the conductive layers 490a and 490b. Note that the edge portions of the oxide semiconductor layer 483 and the oxide semiconductor layer 485, which extend outward, may have a reduced thickness in some cases.

Note that as illustrated in FIG. 38D, the edge portions of the oxide semiconductor layer 483 are located more outward than the edge portions of the low-resistance drain regions 446a and 446b; the edge portions of the oxide semiconductor layer 485 are located more outward than the edge portions of the source electrode layer 447a and the drain electrode layer 447b. Note that the edge portions of the oxide semiconductor layer 483 have the same thickness as a portion of the oxide semiconductor layer 483, which is to be a channel formation region.

Etching treatment for dividing the metal conductive layers 484 and 486 is performed with the utilization of the difference in the etching rate between the oxide conductive layers 442 and 475 and the metal conductive layers 484 and 486. The oxide conductive layers 442 and 475 are selectively etched using the fact that the etching rate of the metal conductive layers 484 and 486 is higher than the etching rate of the oxide conductive layers 442 and 475.

It is preferable that the oxide conductive layers 442 and 475 not contain indium oxide but contain zinc oxide as its component. For such oxide conductive layers 442 and 475, zinc oxide, zinc aluminum oxide, zinc aluminum oxynitride, zinc gallium oxide, or the like can be used.

The oxide conductive layers 442 and 475 formed can be etched using the source electrode layer 465a, the drain electrode layer 465b, the conductive layer 490a, and the conductive layer 490b over the oxide conductive layers 442 and 475 as masks. The oxide conductive layers 442 and 475 containing zinc oxide as their components, the oxide conductive layers 442 and 475 can be easily etched with the use of, for example, an alkaline solution such as a resist stripper.

After the oxide conductive layers 442 and 475 are etched into island-shaped oxide conductive layers 442 and 475, metal conductive films are stacked over the oxide conductive layers 442 and 475, and wiring patterns including the source electrode layer and the drain electrode layer are etched, whereby the oxide conductive layers 442 and 475 can remain under the wiring patterns of the metal conductive films.

Then, the resist masks 482a and 482b are removed, and in a third photolithography step, resist masks 491a and 491b are formed and then selective etching is performed, whereby parts of the conductive layers 490a and 490b, over which the resist mask 491b is not formed, are removed. The part of the conductive layer 490b, over which the resist mask 491b is not formed, is removed to form a conductive layer 476 (see FIG. 38E).

Note that since the conductive layers which overlap with the source electrode layer 447a and the drain electrode layer 447b are selectively removed in the third photolithography step, the materials of the oxide semiconductor layer 485, the source electrode layer 447a, and the drain electrode layer 447b and the etching conditions are controlled as appropriate so that the oxide semiconductor layer 485, the source electrode layer 447a, and the drain electrode layer 447b are not removed in the etching of the conductive layers.

Further, the conductive layer 476 is provided over part of the drain electrode layer 447b, whereby the drain electrode layer 447b is electrically connected to the pixel electrode layer 477 which is formed later via the conductive layer 476. The conductive layer 476 is provided over the drain electrode layer 447b as described above, whereby the contact resistance can be reduced.

Next, an oxide insulating film 466 serving as a protective insulating film is formed in contact with the oxide semiconductor layer 483 and the oxide semiconductor layer 485.

The oxide insulating film 466 has a thickness of at least 1 nm and can be formed by a method by which impurities such as water and hydrogen are not mixed into the oxide insulating film 466, such as a sputtering method, as appropriate. In this embodiment, a 300-nm-thick silicon oxide film is formed as the oxide insulating film 466 by a sputtering method. The substrate temperature at the time of the film formation may be higher than or equal to room temperature and lower than or equal to 300° C., and is set at 100° C. in this embodiment. The formation of the silicon oxide film by a sputtering method can be performed in a rare gas (typically, argon) atmosphere, an oxygen atmosphere, or an atmosphere containing a rare gas (typically, argon) and oxygen. As a target, a silicon oxide target or a silicon target can be used. Alternatively, the silicon oxide film can be formed with the use of a silicon target doped with boron, in which case a barrier property against water or hydrogen can be improved. For example, the silicon oxide film can be formed with the use of a silicon target by a sputtering method in an atmosphere containing oxygen and nitrogen. The oxide insulating film 466 which is formed in contact with the low-resistance oxide semiconductor layers with the use of an inorganic insulating film that does not contain impurities such as moisture, a hydrogen ion, and OH⁻ and blocks entry of such impurities from the outside, typically a silicon oxide film, a silicon nitride oxide film, an aluminum oxide film, or an aluminum oxynitride film.

Figure 39A:
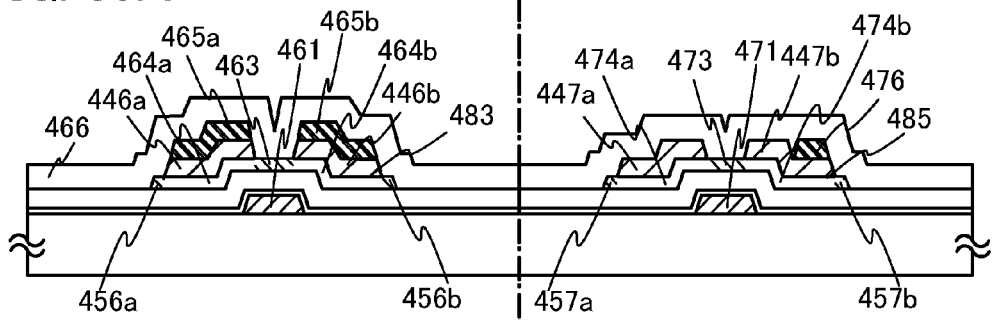
FIGS. 39A to 39E illustrates a method for manufacturing the semiconductor device.
Figure 39B:
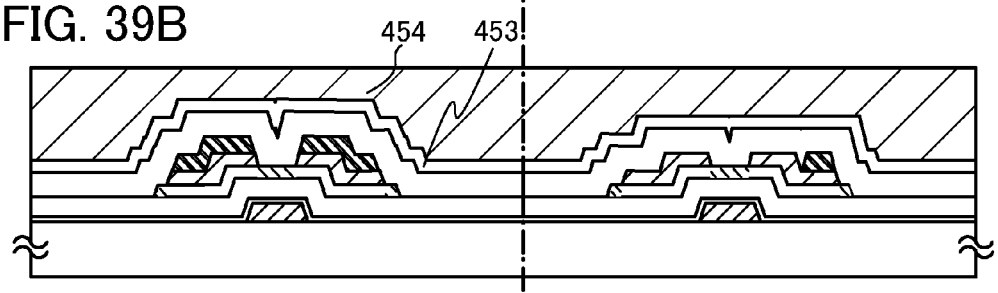

Next, second heat treatment (preferably 200° C. to 400° C. inclusive, e.g., 250° C. to 350° C. inclusive) is performed (see FIG. 39A). For example, the second heat treatment is performed at 250° C. in a nitrogen atmosphere for one hour. With the second heat treatment, heat is applied while the oxide semiconductor layers 483 and 485 are in contact with the oxide insulating film 466.

In this manner, the silicon oxide film as a protective film on the back channel side is formed by a sputtering method and then the heat treatment at 250° C. to 350° C. inclusive is performed, whereby oxygen is introduced into and diffused in the oxide semiconductor layer 483 and the oxide semiconductor layer 485 from exposed parts of the oxide semiconductor layer 483 and the oxide semiconductor layer 485. By being formed by a sputtering method, the silicon oxide film can be made to be in an oxygen excess state, which enables the oxygen to be introduced into and diffused in the oxide semiconductor layers 483 and 485 by the heat treatment. When oxygen is introduced into and diffused in the oxide semiconductor layers 483 and 485, the channel formation regions can be changed into high-resistance channel formation regions, i.e., i-type channel formation regions. Thus, a normally-off thin film transistor can be obtained. In addition, by the heat treatment which makes the oxygen to be introduced into and diffused in the oxide semiconductor layers 483 and 485, the oxide semiconductor layers 483 and 485 formed as a source region and a drain region can be crystallized and can have an improved conductivity.

Further, heat treatment for dehydration or dehydrogenation is performed on the oxide semiconductor film after the formation to reduce the resistance of the oxide semiconductor film so that the oxide semiconductor film is changed into a high-resistance drain region (an LRN region), and then part of the high-resistance drain region is selectively made to be in an oxygen-excess state. As a result, a channel formation region 463 overlapping with the gate electrode layer 461, extending regions 456a and 456b, and extending regions 457a and 457b become i-type regions; and a channel formation region 473 overlapping with the gate electrode layer 471 becomes an i-type region. Moreover, the high-resistance drain region 464a overlapping with the source electrode layer 465a and the high-resistance drain region 464b overlapping with the drain electrode layer 465b are formed in a self-aligned manner; and the high-resistance drain region 474a overlapping with the source electrode layer 447a and the high-resistance drain region 474b overlapping with the drain electrode layer 447b are formed in a self-aligned manner.

Note that by the formation of the high-resistance drain region 464a in part of the oxide semiconductor layer, which overlaps with the drain electrode layer 465b (and the source electrode layer 465a), the reliability at the time when a driver circuit is formed can be improved. Specifically, by the formation of the high-resistance drain region 464b, a structure can be obtained in which conductivity can be varied from the drain electrode layer 465b to the channel formation region 463 via the high-resistance drain region 464b. Thus, in the case where operation is performed with the drain electrode layer 465b connected to a wiring for supplying a high power supply potential VDD, the high-resistance drain region 464b serves as a buffer, and thus a high electric field is not applied locally even if the high electric field is applied between the gate electrode layer 461 and the drain electrode layer 465b, which leads to an increase in the withstand voltage of the transistor.

Further, by the formation of the high-resistance drain region 464b (or the high-resistance drain region 464a) in part of the oxide semiconductor layer, which overlaps with the drain electrode layer 465b (or the source electrode layer 465a), the amount of leakage current in the channel formation region at the time when the driver circuit is formed can be reduced.

Further, by the formation of the high-resistance drain region 474b (or the high-resistance drain region 474a) in part of the oxide semiconductor layer, which overlaps with the drain electrode layer 447b (or the source electrode layer 447a), the reliability at the time when a pixel is formed can be improved. Specifically, by the formation of the high-resistance drain region 474b, a structure can be obtained in which conductivity can be varied from the drain electrode layer 447b to the channel formation region 473 via the high-resistance drain region 474b. Thus, in the case where operation is performed with the drain electrode layer 447b connected to a wiring for supplying a high power supply potential VDD, the high-resistance drain region 474b serves as a buffer, and thus a high electric field is not applied locally even if the high electric field is applied between the gate electrode layer 471 and the drain electrode layer 447b, which leads to an increase in the withstand voltage of the transistor.

Further, by the formation of the high-resistance drain region 474b (or the high-resistance drain region 474a) in part of the oxide semiconductor layer, which overlaps with the drain electrode layer 447b (or the source electrode layer 447a), the amount of leakage current in the channel formation region 473 at the time when the pixel is formed can be reduced.

Further, the formation of the oxide conductive layer between the oxide semiconductor layer 483 and the source electrode layer 465a and the drain electrode layer 465b allows the resistance to be reduced and the transistor to be driven at a high speed.

Using the low-resistance drain regions 446a and 446b which are formed using the oxide conductive layer is effective in improving the frequency characteristics of the peripheral circuit (driver circuit). This is because contact resistance can be reduced more in the case where a metal electrode (formed using titanium or the like) is in contact with the oxide conductive layer (the low-resistance drain regions 446a and 446b) than in the case where a metal electrode (formed using titanium or the like) is in contact with the oxide semiconductor layer 483. Further, in a case of using molybdenum (for example, a stacked-layer structure of a molybdenum film, an aluminum film, and a molybdenum film), a high contact resistance between the molybdenum and the oxide semiconductor layer 483 has been problematic. This is because molybdenum is not readily oxidized when compared with titanium and thus extracts a small amount of oxygen, which does not allow the interface between the molybdenum and the oxide semiconductor layer 483 to be n-type. However, even in that case, by interposing the low-resistance drain region 446a (or a low-resistance drain region 465b) which is formed using the oxide conductive layer between the oxide semiconductor layer 483 and the source electrode layer 465a (or the drain electrode layer 465b), the contact resistance can be reduced and the frequency characteristics of the peripheral circuit (driver circuit) can be improved. The channel length of the thin film transistor is determined by etching of the oxide conductive layers (the low-resistance drain regions 446a and 446b) and thus can be much smaller.

Next, the protective insulating layer 453 is formed over the oxide insulating film 466. In this embodiment, silicon nitride film is formed by an RF sputtering method. Since an RF sputtering method allows high productivity, it is preferably used as a deposition method of the protective insulating layer 453. The protective insulating layer 453 is formed using an inorganic insulating film that does not contain impurities such as moisture, hydrogen ions, and OH⁻ and blocks entry of such impurities from the outside, typically a silicon nitride film, an aluminum nitride film, a silicon nitride oxide film, or an aluminum oxynitride film. Needless to say, the protective insulating layer 453 is a light-transmitting insulating film. Alternatively, a silicon oxide film is formed with the use of a silicon target doped with boron, in which case a barrier property against water or hydrogen can be improved.

The protective insulating layer 453 is preferably in contact with the second gate insulating layer 452b or an insulating film serving as a base provided below the protective insulating layer 453, and blocks entry of impurities such as moisture, a hydrogen ion, and OH⁻ from the vicinity of the side surface of the substrate. It is particularly effective to use a silicon nitride film as the second gate insulating layer 452a or the insulating film serving as a base. In other words, a silicon nitride film is provided so as to surround the bottom surface, the top surface, and the side surface of the oxide semiconductor layer, whereby the reliability of the display device is increased.

Next, the planarization insulating layer 454 is formed over the protective insulating layer 453. The planarization insulating layer 454 can be formed using an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that a plurality of insulating films formed using these materials may be stacked to form the planarization insulating layer 454.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Moreover, the organic group may include a fluoro group.

There is no particular limitation on the method for forming the planarization insulating layer 454. The planarization insulating layer 454 can be formed, depending on the material, by a method such as a sputtering method, an SOG method, a spin coating method, a dipping method, a spray coating method, or a droplet discharge method (e.g., an inkjet method, screen printing, or offset printing), or with the use of a tool such as a doctor knife, a roll coater, a curtain coater, or a knife coater.

Note that the planarization insulating layer 454 may be provided over the oxide insulating film 466 without providing the protective insulating layer 453.

Figure 39C:
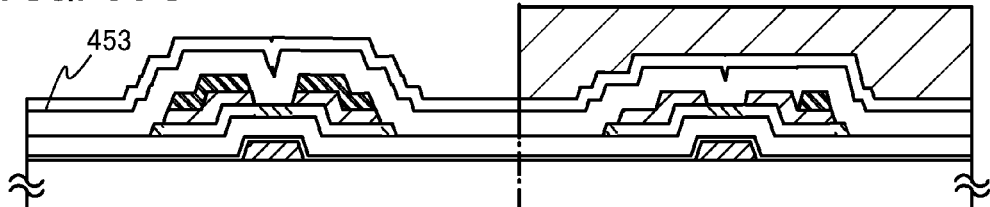

Next, a fourth photolithography step is performed so that a resist mask is formed to remove the planarization insulating layer 454 in the driver circuit portion (see FIG. 39C).

Figure 39D:
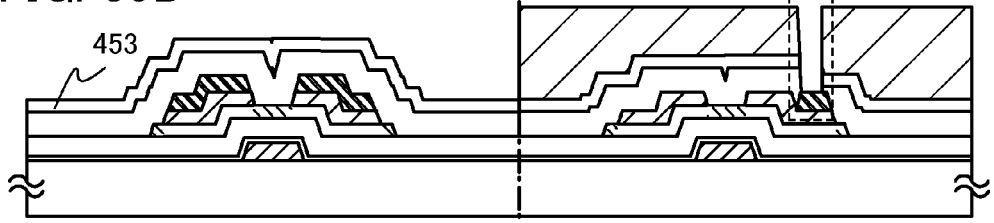

Then, after the resist mask is removed, a fifth photolithography step is performed so that a resist mask is formed and a contact hole 494 that reaches the conductive layer 476 is formed by etching of the planarization insulating layer 454, the protective insulating layer 453, and the oxide insulating film 466 (see FIG. 39D). In addition, contact holes that reach the gate electrode layers 461 and 471 are also formed with this etching (not illustrated). Alternatively, the resist mask for forming the contact hole that reaches the conductive layer 476 may be formed by an ink-jet method. The formation of the resist mask by an ink-jet method does not need a photomask, which results in a reduction in the manufacturing cost.

Next, the resist mask is removed, and then a light transmitting conductive film is formed. The light-transmitting conductive film can be formed using indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based non-single-crystal film containing nitrogen (i.e., an Al—Zn—O—N-based non-single-crystal film), a Zn—O-based non-single-crystal film containing nitrogen, or a Sn—Zn—O-based non-single-crystal film containing nitrogen may be used. Note that the percentage (atomic %) of zinc in the Al—Zn—O—N-based non-single-crystal film is 47 atomic % or less and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated particularly in etching ITO, an alloy of indium oxide and zinc oxide ($In_2O_3$—$ZnO$) may be used to improve etching processability.

Figure 39E:
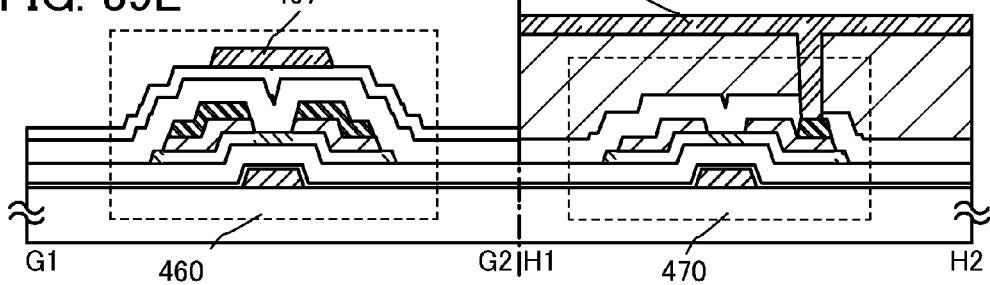

Next, a seventh photolithography step is performed so that a resist mask is formed and unnecessary portions are removed by etching to form the pixel electrode layer 477 and the conductive layer 467 (see FIG. 39E).

Through the above-described steps, with the use of seven masks, the thin film transistor 460 and the thin film transistor 470 can be manufactured in the driver circuit and the pixel portion, respectively, over one substrate. The thin film transistor 460 for the driver circuit includes the oxide semiconductor layer 483 including the high-resistance drain region 464a, the high-resistance drain region 464b, and the channel formation region 463. The thin film transistor 470 for the pixel includes the oxide semiconductor layer 485 including the high-resistance drain region 474a, the high-resistance drain region 474b, and the channel formation region 473. The thin film transistors 460 and 470 have increased withstand voltage because the high-resistance drain region serves as a buffer so that a localized high electric field is not applied to the thin film transistors 460 and 470 even when a high electric field is applied to the thin film transistors 460 and 470.

In addition, a storage capacitor that is constituted by a capacitor wiring layer and a capacitor electrode with the first gate insulating layer 452a and the second gate insulating layer 452b as dielectrics can be formed over the same substrate. The thin film transistors 460 and storage capacitors are arranged in matrix to correspond to respective pixels so that a pixel portion is formed and a driver circuit including the thin film transistor 460 is arranged around the pixel portion, whereby one of the substrates for manufacturing an active matrix display device can be obtained.

Note that the pixel electrode layer 477 is electrically connected to the capacitor electrode layer through a contact hole formed in the planarization insulating layer 454, the protective insulating layer 453, and the oxide insulating film 466. Note that the capacitor electrode layer can be formed using the same material in the same step as the drain electrode layer 447b.

The conductive layer 467 is provided so as to overlap with the channel formation region 463 in the oxide semiconductor layer, whereby in a bias-temperature stress test (referred to as a BT test) for examining the reliability of a thin film transistor, the amount of change in the threshold voltage of the thin film transistor 460 before and after the BT test can be reduced. The electric potential of the conductive layer 467 may be the same or different from that of the gate electrode layer 461. The conductive layer 467 can also function as a second gate electrode layer. Alternatively, the electric potential of the conductive layer 467 may be a GND potential or 0 V, or the conductive layer 467 may be in a floating state.

The resist mask for forming the pixel electrode layer 477 may be formed by an ink-jet method. The formation of the resist mask by an ink-jet method does not need a photomask, which results in a reduction in the manufacturing cost.

Figure 42A:
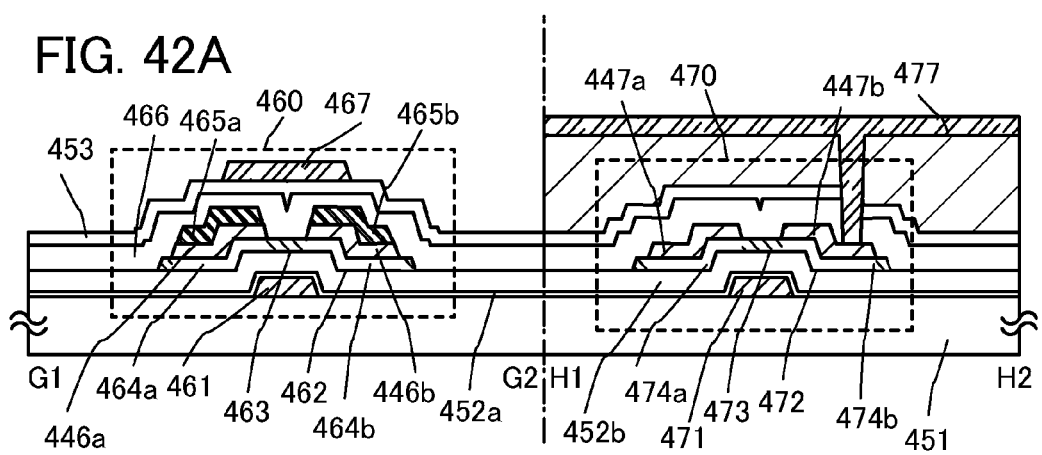
FIGS. 42A and 42B each illustrate a semiconductor device.
Figure 42B:
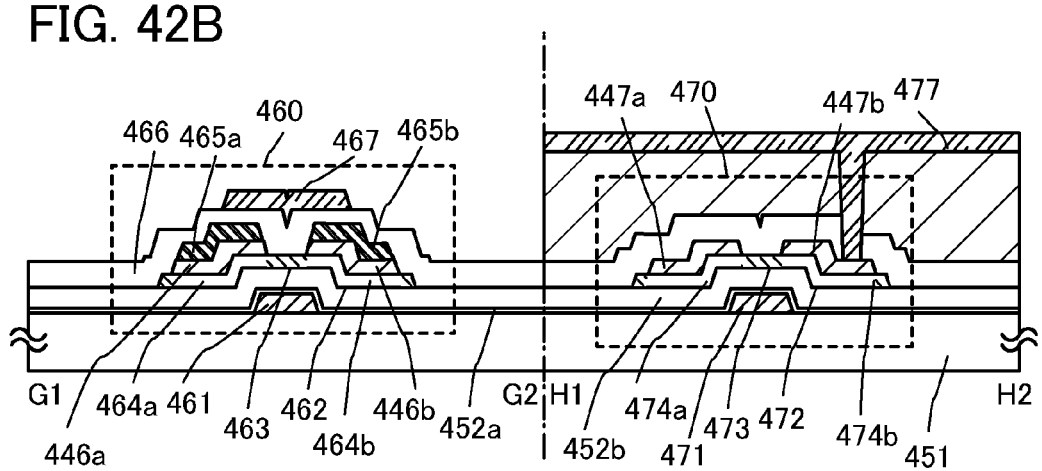

Note that, although the structure in which the conductive layer 476 is provided over the drain electrode layer 447b of the thin film transistor 470 in the pixel portion as illustrated in FIG. 6B2 is described in this embodiment, a structure in which the conductive layer 476 is not provided as illustrated in FIG. 42A can be employed. In addition, although the structure in which the conductive layer 476 is provided over the protective insulating layer 453 which covers the thin film transistor 460 in the driver circuit portion as illustrated in FIG. 6B1 is described, a structure in which the conductive layer 476 is provided over the oxide insulating film 466 without providing the protective insulating layer 453 can be employed as illustrated in FIG. 42B.

This embodiment can be freely combined with any of the other embodiments.

(Embodiment 5)

Figure 40A:
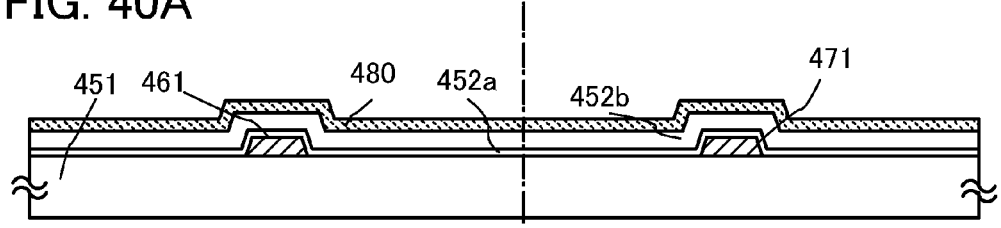
FIGS. 40A to 40C illustrates a method for manufacturing a semiconductor device.
Figure 40B:
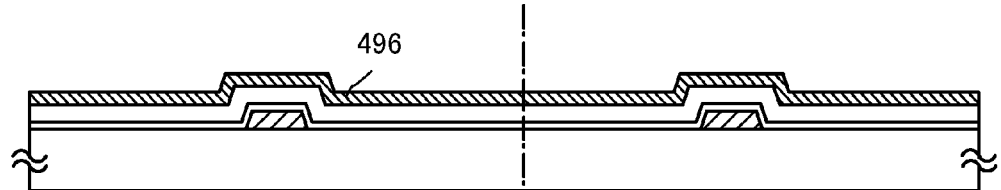
Figure 40C:
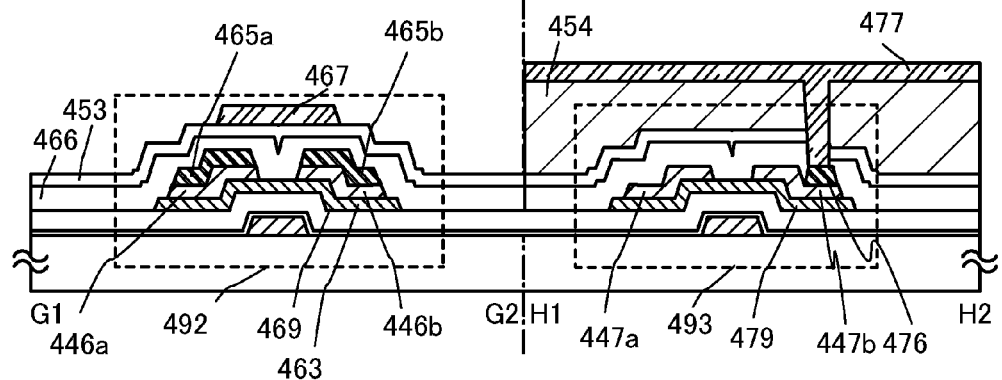

In this embodiment, an example in which the first heat treatment is different from that in Embodiment 4 is illustrated in FIGS. 40A to 40C. FIGS. 40A to 40C are the same as FIGS. 38A to 38E and FIGS. 39A to 39E except for part of the steps; therefore, the same parts as in FIGS. 38A to 38E and FIGS. 39A to 39E are denoted by the same reference numerals and detailed description on the parts is omitted.

FIGS. 40A to 40C are cross-sectional views illustrating a process for manufacturing two thin film transistors.

First, as described in Embodiment 4, a light-transmitting conductive film is formed over the substrate 451 having an insulating surface, and then the gate electrode layers 461 and 471 are formed in a first photolithography step.

Then, a stack of a first gate insulating layer 452a and a second gate insulating layer 452b is formed over the gate electrode layers 461 and 471. Then, an oxide semiconductor film 480 is formed to a thickness of 2 nm to 200 nm inclusive over the second gate insulating layer 452b (see FIG. 40A). Note that since the steps up to and including the step in FIG. 40A can be performed as in Embodiment 4 (see FIG. 38A), detailed description on the steps is omitted.

Next, the oxide semiconductor film 480 is subjected to dehydration or dehydrogenation in an inert gas atmosphere. The temperature of first heat treatment for dehydration or dehydrogenation is 350° C. or higher and lower than the strain point of the substrate, preferably 400° C. or higher. Here, the substrate is introduced into an electric furnace that is a kind of heat treatment apparatus and heat treatment is performed on the oxide semiconductor film 480 in a nitrogen atmosphere, and then the resistance of the oxide semiconductor film 480 is reduced, that is, the oxide semiconductor film 480 becomes an n-type (e.g., $n^-$-type or $n^+$-type) semiconductor film as an oxygen deficient semiconductor film while water or hydrogen is prevented from being mixed into the oxide semiconductor film 480 with the oxide semiconductor film 480 not exposed to the air. After that, a high-purity oxygen gas or a high-purity $N_2O$ gas is introduced into the same furnace and cooling is performed. It is preferable that water, hydrogen, or the like be not contained in the oxygen gas or the $N_2O$ gas. Alternatively, the purity of an oxygen gas or a $N_2O$ gas which is introduced into the heat treatment apparatus is preferably 4N (99.99%) or more, more preferably 6N (99.9999%) or more (that is, the impurity concentration of the oxygen gas or the $N_2O$ gas is preferably 20 ppm or lower, more preferably 1 ppm or lower).

Moreover, after the first heat treatment for dehydration or dehydrogenation, heat treatment may be performed at 200° C. to 400° C. inclusive, preferably 200° C. to 300° C. inclusive in an oxygen gas atmosphere, a $N_2O$ gas atmosphere, or an ultra-dry air (having a dew point of −40° C. or lower, preferably −60° C. or lower) atmosphere.

The entire oxide semiconductor film is made to contain an excess amount of oxygen through the above steps; thus, an oxide semiconductor film 496 with increased resistance, that is, an i-type oxide semiconductor film 496 is obtained (see FIG. 40B). As a result, the reliability of a thin film transistor to be manufactured later can be increased.

Note that, although the example in which dehydration or dehydrogenation is performed after the formation of the oxide semiconductor film 480 is described in this embodiment, the present invention is not limited thereto. The first heat treatment may be performed after the oxide semiconductor film 480 is processed to have an island shape as in Embodiment 4.

Alternatively, the following process may be employed: dehydration or dehydrogenation is performed on the oxide semiconductor film 480 in an inert gas atmosphere; cooling is performed in an inert gas atmosphere; the oxide semiconductor film is processed into island-shaped oxide semiconductor layers 469 and 479 in a photolithography step; and then heat treatment is performed in an oxygen gas, a $N_2O$ gas atmosphere, or an ultra-dry air (having a dew point of −40° C. or lower, preferably −60° C. or lower) atmosphere.

Before the oxide semiconductor film 480 is formed, heat treatment (at higher than or equal to 400° C. and lower than the strain point of the substrate) may be performed in an inert gas atmosphere (e.g., nitrogen, helium, neon, or argon), an oxygen atmosphere, or an ultra-dry air (having a dew point of −40° C. or lower, preferably −60° C. or lower) atmosphere to remove impurities such as hydrogen and water contained in the gate insulating layers.

Next, the oxide semiconductor film 496 is processed into the island-shaped oxide semiconductor layers 469 and 479 in a second photolithography step.

Next, as in FIGS. 38C to 38E and FIGS. 39A to 39E of Embodiment 4, in the peripheral driver circuit portion, the low-resistance drain regions 446a and 446b are formed in contact with the oxide semiconductor layer 469, the oxide insulating film 466 is formed in contact with the source electrode layer 465a and the drain electrode layer 465b which are metal conductive layers and with the low-resistance drain regions 446a and 446b; thus, a thin film transistor 492 for the driver circuit is manufactured. In contrast, in the pixel portion, the source electrode layer 447a and the drain electrode layer 447b which are light-transmitting conductive layers are formed in contact with the oxide semiconductor layer 479, the conductive layer 476 is formed over the drain electrode layer 447b, and the oxide insulating film 466 is formed in contact with the oxide semiconductor layer 479; thus, a thin film transistor 493 for the pixel is manufactured.

Next, second heat treatment (preferably at 200° C. to 400° C. inclusive, for example, 250° C. to 350° C. inclusive) is performed in an inert gas atmosphere or an oxygen gas atmosphere. For example, the second heat treatment is performed at 250° C. in a nitrogen atmosphere for one hour Then, the protective insulating layer 453 is formed so as to cover the thin film transistors 492 and 493 and to be in contact with the oxide insulating film 466, and the planarization insulating layer 454 is stacked over the protective insulating layer 453. A contact hole that reaches the drain electrode layer 447b is formed in the oxide insulating film 466, the protective insulating layer 453, and the planarizing insulating layer 454, and a light-transmitting conductive film is formed in the contact hole and over the planarization insulating layer 454. The light-transmitting conductive film is selectively etched to form the conductive layer 467 and the pixel electrode layer 477 that is electrically connected to the thin film transistor 493 (see FIG. 40C).

Through the above-described steps, with the use of five masks, the thin film transistor 492 and the thin film transistor 493 in each of which the entire oxide semiconductor layer is an i-type oxide semiconductor layer can be manufactured in the driver circuit and the pixel portion, respectively, over one substrate. The thin film transistor 492 for the driver circuit includes the oxide semiconductor layer 469 which is entirely intrinsic. The thin film transistor 493 for the pixel includes the oxide semiconductor layer 479 which is entirely intrinsic.

In addition, a storage capacitor that is constituted by a capacitor wiring layer and a capacitor electrode layer with the first gate insulating layer 452a and the second gate insulating layer 452b as dielectrics can be formed over the same substrate. The thin film transistors 493 and storage capacitors are arranged in matrix so as to correspond to respective pixels so that a pixel portion is formed and a driver circuit including the thin film transistor 492 is arranged around the pixel portion, whereby one of the substrates for manufacturing an active matrix display device can be obtained The conductive layer 467 is provided so as to overlap with the channel formation region in the oxide semiconductor layer 469, whereby in a bias-temperature stress test (referred to as a BT test) for examining the reliability of a thin film transistor, the amount of change in the threshold voltage of the thin film transistor 492 before and after the BT test can be reduced. The electric potential of the conductive layer 467 may be the same or different from that of the gate electrode layer 461. The conductive layer 467 can also function as a second gate electrode layer. Alternatively, the electric potential of the conductive layer 467 may be a GND potential or 0 V, or the conductive layer 467 may be in a floating state.

This embodiment can be freely combined with any of the other embodiments.

(Embodiment 6)

In this embodiment, an example in which an active matrix liquid crystal display device is manufactured with the use of the transistors described in Embodiment 1 will be described.

FIG. 7A illustrates an example of cross-sectional structure of an active matrix substrate The thin film transistor in the driver circuit and the thin film transistor in the pixel portion over one substrate are illustrated in Embodiment 1; in this embodiment, a storage capacitor, a gate wiring (also referred to as a gate wiring layer), and a terminal portion of a source wiring are illustrated in addition to those thin film transistors for description. The capacitor, the gate wiring, and the terminal portion of the source wiring can be formed in the same manufacturing steps as in Embodiment 1 and can be manufactured without increase in the number of photomasks and the number of steps. Moreover, in a portion that serves as a display region in a pixel portion, the gate wiring, the source wiring, and a capacitor wiring layer are formed using a light-transmitting conductive film, resulting in a high aperture ratio. Furthermore, a metal wiring can be used for the source wiring layer in a portion that does not serve as the display region in order to reduce the wiring resistance.

In FIG. 7A, a thin film transistor 210 is a thin film transistor provided in a driver circuit, and a thin film transistor 220 which is electrically connected to a pixel electrode layer 227 is a thin film transistor provided in a pixel portion.

In this embodiment, the thin film transistor 220 formed over a substrate 200 has the same structure as the thin film transistor 410 in Embodiment 1.

A capacitor wiring layer 230 which is formed using the same light-transmitting material in the same step as a gate electrode layer of the thin film transistor 220 overlaps with a capacitor electrode layer 231, with a first gate insulating layer 202a and a second gate insulating layer 202b serving as dielectrics interposed therebetween; thus, a storage capacitor is formed. The capacitor electrode layer 231 is formed using the same light-transmitting material in the same step as a source electrode layer or a drain electrode layer of the thin film transistor 220. Since the storage capacitor as well as the thin film transistor 220 has light transmitting properties, the aperture ratio can be increased.

The light-transmitting properties of the storage capacitor are important in increasing the aperture ratio. For small liquid crystal display panels of 10 inches or smaller in particular, a high aperture ratio can be achieved even when the pixel size is reduced in order to realize higher definition of display images by an increase in the number of gate wirings, for example. Moreover, the use of a light-transmitting film for components of the thin film transistor 220 and the storage capacitor makes it possible to achieve a high aperture ratio even when one pixel is divided into a plurality of subpixels in order to realize a wide viewing angle. In other words, a high aperture ratio can be maintained even when a group of high-density thin film transistors is arranged, and the display region can have a sufficient area. For example, when one pixel includes two to four subpixels and storage capacitors, the storage capacitors have light-transmitting properties as well as the thin film transistors, so that the aperture ratio can be increased.

Note that the storage capacitor is provided below the pixel electrode layer 227, and the capacitor electrode layer 231 is electrically connected to the pixel electrode layer 227.

Although the example in which the storage capacitor includes the capacitor electrode layer 231 and the capacitor wiring layer 230 is described in this embodiment, there is no particular limitation on the structure of the storage capacitor. For example, a storage capacitor may be formed in such a manner that, without providing a capacitor wiring layer, a pixel electrode layer overlaps with a gate wiring in an adjacent pixel, with a planarization insulating layer, a protective insulating layer, a first gate insulating layer, and a second gate insulating layer interposed therebetween.

A plurality of gate wirings, source wirings, and capacitor wiring layers are provided in accordance with the pixel density. In the terminal portion, a plurality of first terminal electrodes having the same electric potential as the gate wiring, a plurality of second terminal electrodes having the same electric potential as the source wiring, a plurality of third terminal electrodes having the same electric potential as the capacitor wiring layer, and the like are arranged. There is no particular limitation on the number of each of the terminal electrodes, and the number of the terminals can be determined by a practitioner as appropriate.

In the terminal portion, the first terminal electrode 232 which has the same electric potential as the gate wiring can be formed using the same light-transmitting material as the pixel electrode layer 227. The first terminal electrode 232 is electrically connected to the gate wiring through a contact hole that reaches the gate wiring. In forming a contact hole that reaches the first terminal electrode 232, a resist mask is formed over an oxide semiconductor layer, whereby an interface between the gate insulating film and the oxide semiconductor layer can be prevented from being contaminated.

Alternatively, the contact hole may be formed in such a manner that a resist mask is directly formed on the gate insulating film. In that case, it is preferable that after the resist is removed, heat treatment be performed to perform dehydration, dehydrogenation, or dehydroxylation of the surface of the gate insulating film. The heat treatment for dehydration or dehydrogenation of the oxide semiconductor layer may be performed: after the oxide semiconductor layer is formed; after an oxide conductive layer is stacked over the oxide semiconductor layer; or after a passivation film is formed over a source electrode and a drain electrode. As for the electrical connection between a gate wiring and a source wiring, an oxide conductive layer is preferably formed below the source wiring, in which case the oxide conductive layer serves as a buffer, the resistance is only the series resistance depending on the thickness of the oxide conductive layer, and the oxide conductive layer does not form an insulating oxide with a metal.

A gate electrode layer of the thin film transistor 210 provided in the driver circuit may be electrically connected to a conductive layer 217 provided above the oxide semiconductor layer. In that case, a contact hole is formed by selective etching of a planarization insulating layer 204, a protective insulating layer 203, an oxide insulating layer 216, the second gate insulating layer 202b, and the first gate insulating layer 202a with the use of the same photomask as in the case of forming the contact hole for electrically connecting the conductive layer over the drain electrode layer of the thin film transistor 220 and the pixel electrode layer 227 to each other. The conductive layer 217 and the gate electrode layer of the thin film transistor 210 provided in the driver circuit are electrically connected through the contact hole.

A second terminal electrode 235 which has the same electric potential as a source wiring 234 provided in the driver circuit can be formed using the same light-transmitting material as the pixel electrode layer 227. The second terminal electrode 235 is electrically connected to the source wiring 234 through a contact hole that reaches the source wiring 234. The source wiring is a metal wiring, is formed using the same material in the same step as a source electrode layer of the thin film transistor 210, and has the same electric potential as the source electrode layer of the thin film transistor 210.

In the case of manufacturing an active matrix liquid crystal display device, a liquid crystal layer is provided between an active matrix substrate and a counter substrate provided with a counter electrode (also referred to as a counter electrode layer), and the active matrix substrate and the counter substrate are fixed. A common electrode electrically connected to the counter electrode on the counter substrate is provided over the active matrix substrate, and a fourth terminal electrode electrically connected to the common electrode is provided in the terminal portion. The fourth terminal electrode is used for setting the common electrode to a fixed electric potential such as a GND potential or 0 V. The fourth terminal electrode can be formed using the same light-transmitting material as the pixel electrode layer 227.

Note that FIG. 7A illustrates a cross-sectional structure of the first terminal electrode 232 in the driver circuit. Since an example of small liquid crystal display panel of 10 inches or smaller is described in this embodiment, the first terminal electrode 232 in the driver circuit is formed using the same light-transmitting material as the gate electrode layer of the thin film transistor 220. Note that the first terminal electrode 232 can also serve as a wiring.

In addition, when the gate electrode layer, the source electrode layer, the drain electrode layer, the pixel electrode layer, another electrode layer, and another wiring layer are formed using the same material, a common sputtering target and a common manufacturing apparatus can be used; therefore, costs of the material of these layers and an etchant (or an etching gas) which is used in etching can be reduced, which results in a reduction in the manufacturing cost.

When a photosensitive resin material is used for the planarization insulating layer 204 in the structure of FIG. 7A, the step for forming a resist mask can be omitted.

FIG. 7B illustrates a cross-sectional structure, part of which is different from the structure in FIG. 7A. FIG. 7B is the same as FIG. 7A except that the planarization insulating layer 204 is not provided; therefore, the same parts as in FIG. 7A are denoted by the same reference numerals and detailed description on the parts is omitted. In FIG. 7B, the pixel electrode layer 227, the conductive layer 217, and the second terminal electrode 235 are formed on and in contact with the protective insulating layer 203.

With the structure in FIG. 7B, the step for forming the planarization insulating layer 204 can be omitted.

FIG. 43A illustrates a cross-sectional structure, part of which is different from the structure in FIG. 7A. Since the capacitor portion is the same as in FIGS. 7A and 7B, the capacitor portion is not illustrated in FIG. 43A. In FIG. 43A, a thin film transistor 410 is a thin film transistor provided in a driver circuit, and a thin film transistor 420 electrically connected to a pixel electrode layer 477 is a thin film transistor provided in a pixel portion. Further, the thin film transistors 410 and 420 are the same as those in Embodiment 2.

In the terminal portion, a first terminal electrode 468 which has the same electric potential as a gate wiring can be formed using the same light-transmitting material as the pixel electrode layer 477. The first terminal electrode 468 is electrically connected to the gate wiring through a contact hole that reaches the gate wiring. After a contact hole that reaches the first terminal electrode is formed in gate insulating films, an oxide semiconductor layer, an oxide conductive layer, and a metal film are formed. Then, a resist mask is formed over the metal film and etching is performed to form an oxide semiconductor layer 478, an oxide conductive layer 446c, and a metal layer 465c.

In the case where a resist mask is formed directly on the gate insulating film, it is preferable that after the resist is removed, heat treatment be performed to perform dehydration, dehydrogenation, or dehydroxylation of the surface of the gate insulating film. The heat treatment for dehydration or dehydrogenation of the oxide semiconductor layer may be performed: after the oxide semiconductor layer is formed; after an oxide conductive layer is stacked over the oxide semiconductor layer; or after a passivation film is formed over a source electrode and a drain electrode. As for the electrical connection between a gate wiring and a source wiring, an oxide conductive layer is preferably formed below the source wiring, in which case the oxide conductive layer serves as a buffer, the resistance is only the series resistance depending on the thickness of the oxide conductive layer, and the oxide conductive layer does not form an insulating oxide with a metal.

FIG. 43B illustrates a cross-sectional structure, part of which is different from the structure in FIG. 43A. FIG. 43B is the same as FIG. 43A except that the planarization insulating layer 454 is not provided; therefore, the same parts as in FIG. 43A are denoted by the same reference numerals and detailed description on the parts is omitted. In FIG. 43B, the pixel electrode layer 427 and the conductive layer 417 are formed on and in contact with the protective insulating layer 453.

FIG. 44A illustrates a cross-sectional structure, part of which is different from the structure in FIG. 43A. In FIG. 44A, the thin film transistor 410 is a thin film transistor provided in the driver circuit and the thin film transistor 420 electrically connected to the pixel electrode layer 477 is a thin film transistor provided in the pixel portion.

The shapes of an oxide semiconductor layer and an oxide conductive layer of the thin film transistors 410 and 420 illustrated in FIG. 44A are different from those of the oxide semiconductor layer and the oxide conductive layer of the thin film transistors 410 and 420 illustrated in FIGS. 1B1 and 1B2 because etching is performed after the oxide semiconductor layer and the oxide conductive layer are formed. After that, a metal film is formed and etching is performed to form a source electrode layer and a drain electrode layer.

In FIG. 44A, for forming a contact hole in gate insulating films, a resist pattern is formed over an oxide semiconductor layer, whereby an interface between the gate insulating film and the oxide semiconductor layer can be prevented from being contaminated. Alternatively, the contact hole may be formed in such a manner that a resist pattern is directly formed on the gate insulating film. In that case, it is preferable that after the resist is removed, heat treatment be performed to perform dehydration, dehydrogenation, or dehydroxylation of the surface of the gate insulating film. The heat treatment for dehydration or dehydrogenation of the oxide semiconductor layer may be performed: after the oxide semiconductor layer is formed; after an oxide conductive layer is stacked over the oxide semiconductor layer; or after a passivation film is formed over a source electrode and a drain electrode. As for the electrical connection between a gate wiring and a source wiring, an oxide conductive layer is preferably formed below the source wiring, in which case the oxide conductive layer serves as a buffer, the resistance is only the series resistance depending on the thickness of the oxide conductive layer, and the oxide conductive layer does not form an insulating oxide with a metal.

In the terminal portion, the first terminal electrode 468 which has the same electric potential as the gate wiring can be formed using the same light-transmitting material as the pixel electrode layer 477. The first terminal electrode 468 is electrically connected to the gate wiring through the contact hole that reaches the gate wiring. For forming a contact hole that reaches the first terminal electrode 468, a resist mask is formed over an oxide semiconductor layer, whereby an interface between the gate insulating film and the oxide semiconductor layer can be prevented from being contaminated.

Alternatively, the contact hole may be formed in such a manner that a resist mask is directly formed on the gate insulating film. In that case, it is preferable that after the resist is removed, heat treatment be performed to perform dehydration, dehydrogenation, or dehydroxylation of the surface of the gate insulating film. The heat treatment for dehydration or dehydrogenation of the oxide semiconductor layer may be performed: after the oxide semiconductor layer is formed; after an oxide conductive layer is stacked over the oxide semiconductor layer; or after a passivation film is formed over a source electrode and a drain electrode. As for the electrical connection between a gate wiring and a source wiring, an oxide conductive layer is preferably formed below the source wiring, in which case the oxide conductive layer serves as a buffer, the resistance is only the series resistance depending on the thickness of the oxide conductive layer, and the oxide conductive layer does not form an insulating oxide with a metal.

FIG. 44B illustrates a cross-sectional structure, part of which is different from the structure in FIG. 44A. FIG. 44B is the same as FIG. 44A except that the planarization insulating layer 454 is not provided; therefore, the same parts as in FIG. 44A are denoted by the same reference numerals and detailed description on the parts is omitted. In FIG. 44B, the pixel electrode layer 477 and the conductive layer 417 are formed on and in contact with the protective insulating layer 453.

This embodiment can be freely combined with any of the other embodiments.

(Embodiment 7)

There is a possibility that the resistance of a light-transmitting wiring might become a problem in the case where the size of a liquid crystal display panel exceeds 10 inches and reaches 60 inches and even 120 inches. Therefore, in this embodiment, an example in which part of a gate wiring is made from a metal wiring so that the wiring resistance is reduced will be described.

Note that in FIG. 8A, the same parts as in FIG. 7A are denoted by the same reference numerals and detailed description of the parts is omitted. Note that this embodiment can also be applied to any of the active matrix substrates described in Embodiments 1 to 4

FIG. 8A illustrates an example in which part of a gate wiring in a driver circuit is made from a metal wiring and formed in contact with a light-transmitting wiring which is the same as the gate electrode layer of the thin film transistor 210. Note that the number of photomasks in this embodiment is larger than that in Embodiment 1 due to the formation of the metal wiring.

First, a heat-resistant conductive material film (with a thickness of 100 nm to 500 nm inclusive) that can withstand first heat treatment for dehydration or dehydrogenation is formed over a substrate 200.

In this embodiment, a 370-nm-thick tungsten film and a 50-nm-thick tantalum nitride film are formed. Although a stack of the tantalum nitride film and the tungsten film is used as the conductive film here, there is no particular limitation and the conductive film may be formed using an element selected from Ta, W, Ti, Mo, Al, and Cu; an alloy containing any of these elements as its component, an alloy containing the above elements in combination, or a nitride containing any of these elements as its component. The heat-resistant conductive material film is not limited to a single layer containing the above-described element and may be a stack of two or more layers.

In a first photolithography step, metal wirings are formed to form a first metal wiring layer 236 and a second metal wiring layer 237 are formed. An ICP (inductively coupled plasma) etching method is preferably used for etching of the tungsten film and the tantalum nitride film. The films can be etched into desired tapered shapes by an ICP etching method with appropriate adjustment of the etching conditions (e.g., the amount of electric power applied to a coiled electrode, the amount of electric power applied to a substrate-side electrode, and the temperature of the substrate-side electrode). The first metal wiring layer 236 and the second metal wiring layer 237 are tapered; thus, defects in forming a light-transmitting conductive film thereon can be reduced.

Then, after the light-transmitting conductive film is formed, a gate wiring layer 238, a gate electrode layer of the thin film transistor 210, and a gate electrode layer of the thin film transistor 220 are formed in a second photolithography step. The light-transmitting conductive film is formed using any of the conductive materials that transmit visible light, which are described in Embodiment 1.

Note that for example, if there is an interface between the gate wiring layer 238 and the first metal wiring layer 236 or the second metal wiring layer 237, an oxide film might be formed with later heat treatment or the like and the contact resistance might be increased depending on the material of the light-transmitting conductive film. For that reason, the second metal wiring layer 237 is preferably formed using a metal nitride film that prevents oxidation of the first metal wiring layer 236

Next, a gate insulating layer, an oxide semiconductor layer, and the like are formed in the same steps as in Embodiment 1. Subsequent steps are performed in accordance with Embodiment 1 to complete the active matrix substrate.

Further, in this embodiment, an example in which after the formation of the planarization insulating layer 204, the planarization insulating layer in a terminal portion is selectively removed using a photomask is described. It is preferable that the planarization insulating layer be not placed in the terminal portion so that the terminal portion can be connected to an FPC in a favorable manner.

In FIG. 8A, the second terminal electrode 235 is formed over the protective insulating layer 203. FIG. 8A illustrates the gate wiring layer 238 which overlaps with part of the second metal wiring layer 237; alternatively, the gate wiring layer 238 may cover all the first metal wiring layer 236 and the second metal wiring layer 237. In other words, the first metal wiring layer 236 and the second metal wiring layer 237 can be referred to as auxiliary wirings for reducing the resistance of the gate wiring layer 238.

In the terminal portion, a first terminal electrode that has the same electric potential as the gate wiring is formed over the protective insulating layer 203 and electrically connected to the second metal wiring layer 237. A wiring led from the terminal portion is also formed using a metal wiring.

Furthermore, in order to reduce the wiring resistance, the metal wirings (i.e., the first metal wiring layer 236 and the second metal wiring layer 237) can be used as the auxiliary wirings for the gate wiring layer and a capacitor wiring layer in a portion that does not serve as a display region.

FIG. 8B illustrates a cross-sectional structure, part of which is different from the structure in FIG. 8A. FIG. 8B is the same as FIG. 8A except for a material of the gate electrode layer in the thin film transistor in the driver circuit; therefore, the same parts as in FIG. 8A are denoted by the same reference numerals and detailed description on the parts is omitted.

FIG. 8B illustrates an example in which the gate electrode layer in the thin film transistor in the driver circuit is made from a metal wiring. In the driver circuit, a material of the gate electrode layer is not limited to a light-transmitting material.

In FIG. 8B, a thin film transistor 240 in the driver circuit includes a gate electrode layer in which a second metal wiring layer 241 is stacked over a first metal wiring layer 242. Note that the first metal wiring layer 242 can be formed using the same material in the same step as the first metal wiring layer 236. Moreover, the second metal wiring layer 241 can be formed using the same material in the same step as the second metal wiring layer 237.

In the case where the first metal wiring layer 242 is electrically connected to the conductive layer 217, it is preferable to use a metal nitride film for the second metal wiring layer 241 for preventing oxidation of the first metal wiring layer 242.

In this embodiment, metal wirings are used for some wirings so that the wiring resistance is reduced; high definition of display images can be achieved and a high aperture ratio can be realized even when the size of a liquid crystal display panel exceeds 10 inches and reaches 60 inches and even 120 inches.

(Embodiment 8)

Figure 9A:
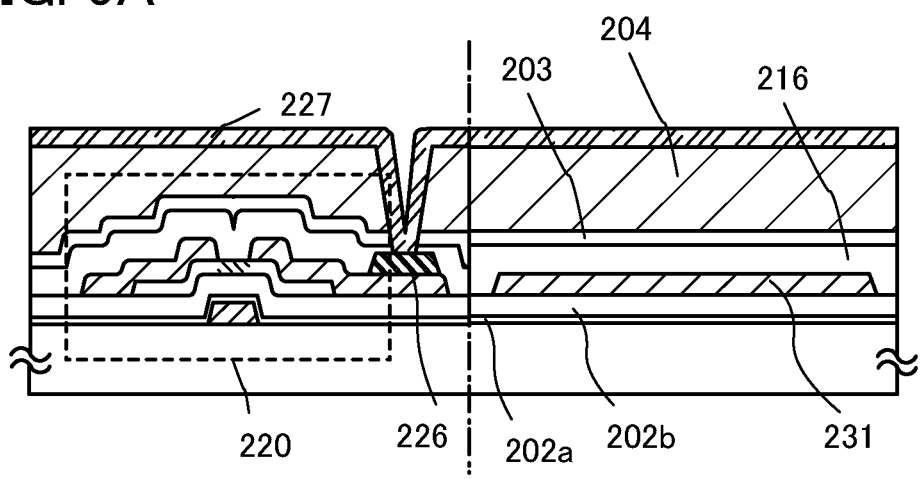
FIGS. 9A and 9B each illustrate a semiconductor device.
Figure 9B:
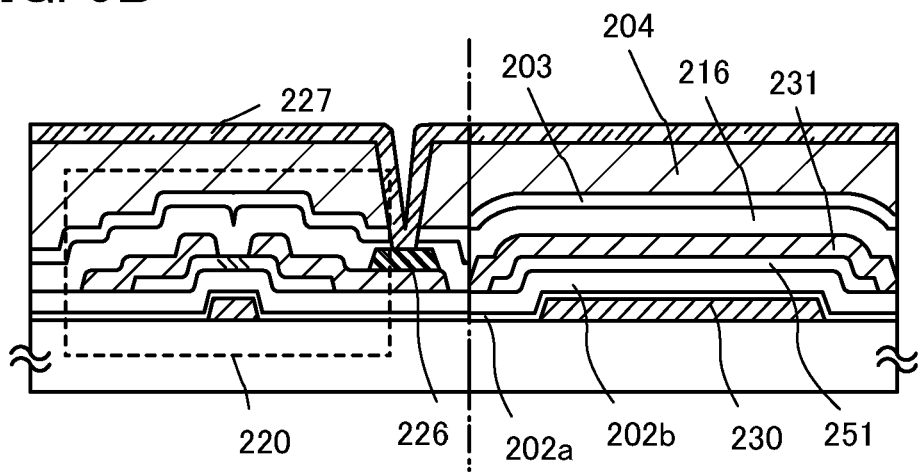

In this embodiment, an example of structure of a storage capacitor, which is different from that in Embodiment 6, is illustrated in FIGS. 9A and 9B. FIG. 9A is the same as FIG. 7A except for a structure of the storage capacitor; therefore, the same parts as in FIG. 7A are denoted by the same reference numerals and detailed description of the parts is omitted. FIG. 9A illustrates a cross-sectional structure of the thin film transistor 220 provided in a pixel and a storage capacitor.

FIG. 9A illustrates an example in which the storage capacitor is constituted by the pixel electrode layer 227 and a capacitor electrode layer 231 that overlaps with the pixel electrode layer 227 with the oxide insulating layer 216, the protective insulating layer 203, and the planarization insulating layer 204 serving as dielectrics. Since the capacitor electrode layer 231 is formed using the same light-transmitting material in the same step as the source electrode layer of the thin film transistor 220 provided in the pixel, the capacitor electrode layer 231 is arranged so as not to overlap with a source wiring layer of the thin film transistor 220.

In the storage capacitor illustrated in FIG. 9A, a pair of electrodes and the dielectrics have light-transmitting properties, and thus the storage capacitor as a whole has light-transmitting properties.

FIG. 9B illustrates an example of structure of the storage capacitor, which is different from that in FIG. 9A. FIG. 9B is also the same as FIG. 7A except for a structure of the storage capacitor; therefore, the same parts as in FIG. 7A are denoted by the same reference numerals and detailed description of the parts is omitted.

FIG. 9B illustrates an example in which the storage capacitor is constituted by the storage wiring layer 230 and a stack of an oxide semiconductor layer 251 and the capacitor electrode layer 231 which overlap with the storage wiring layer 230 with the first gate insulating layer 202a and the second gate insulating layer 202b serving as dielectrics. The capacitor electrode layer 231 is stacked on and in contact with the oxide semiconductor layer 251 and functions as one of electrodes of the storage capacitor. Note that the capacitor electrode layer 231 is formed using the same light-transmitting material in the same step as the source electrode layer or the drain electrode layer of the thin film transistor 220. Moreover, since the capacitor wiring layer 230 is formed using the same light-transmitting material in the same step as the gate electrode layer of the thin film transistor 220, the capacitor wiring layer 230 is arranged so as not to overlap with a gate wiring layer of the thin film transistor 220

The capacitor electrode layer 231 is electrically connected to the pixel electrode layer 227

Also in the storage capacitor illustrated in FIG. 9B, a pair of electrodes and the dielectrics have light-transmitting properties, and thus the storage capacitor as a whole has light-transmitting properties.

Each of the storage capacitors illustrated in FIGS. 9A and 9B has light-transmitting properties; thus, sufficient capacitance can be obtained and a high aperture ratio can be obtained even when the pixel size is reduced in order to realize higher definition of display images, for example, by an increase in the number of gate wirings.

This embodiment can be freely combined with any of the other embodiments.

(Embodiment 9)

In this embodiment, an example is described below in which at least part of a driver circuit and a thin film transistor to be provided in a pixel portion are formed over one substrate.

The thin film transistor provided in the pixel portion is formed according to any of Embodiments 1 to 5. Further, the thin film transistor described in any of Embodiments 1 to 5 is an n-channel TFT. Thus, some of driver circuits that can be constituted by n-channel TFTs among the driver circuits are formed over the same substrate as that for the thin film transistor in the pixel portion.

Figure 14A:
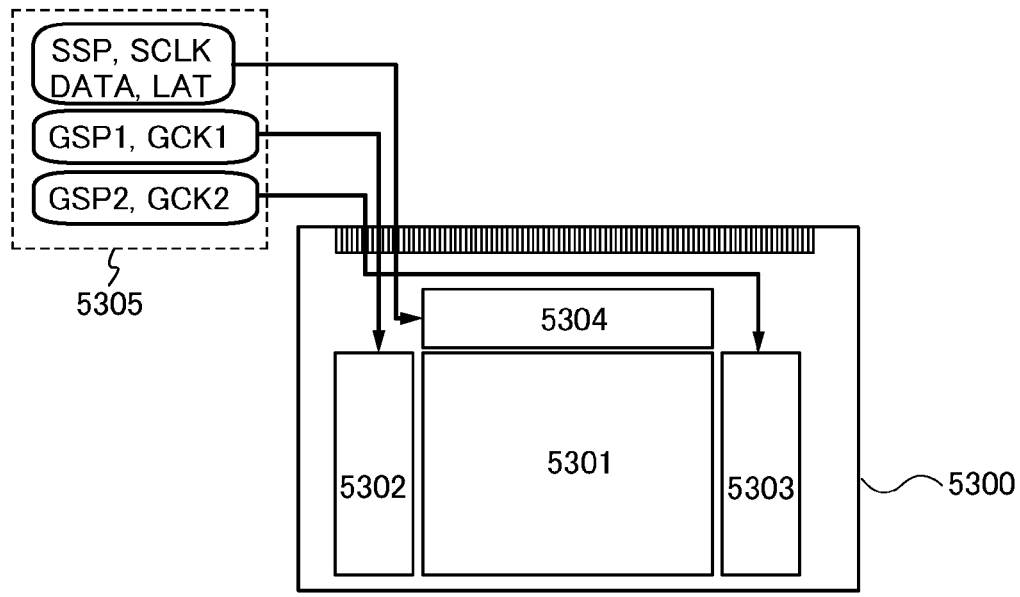
FIGS. 14A and 14B are block diagrams each illustrating a semiconductor device.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extending from the signal line driver circuit 5304 is provided, and a plurality of scan lines extending from the first scan line driver circuit 5302 and the second scan line driver circuit 5303 is provided. Note that in cross regions of the scan lines and the signal lines, pixels each having a display element are arranged in matrix. Further, the substrate 5300 of the display device is connected to a timing control circuit 5305 (also referred to as a controller or a control IC) through a connection portion of a flexible printed circuit (FPC) or the like.

In FIG. 14A, the first scan line driver circuit 5302, the second scan line driver circuit 5303, and the signal line driver circuit 5304 are formed over the same substrate 5300 as the pixel portion 5301. Accordingly, the number of parts such as driver circuits provided outside is reduced, so that cost can decrease. Moreover, the number of connections in the connection portion in the case where wirings are extended from a driver circuit provided outside the substrate 5300 can be reduced, and the reliability or yield can be improved.

Note that the timing control circuit 5305 supplies a start signal for the first scan line driver circuit (GSP1) and a clock signal for the first scan line driver circuit (GCK1) to the first scan line driver circuit 5302, as an example. In addition, the timing control circuit 5305 supplies, for example, a start signal for the second scan line driver circuit (GSP2) (also referred to as a start pulse) and a clock signal for the second scan line driver circuit (GCK2) to the second scan line driver circuit 5303. A start signal for the signal line driver circuit (SSP), a clock signal for the signal line driver circuit (SCK), data for a video signal (DATA) (also simply referred to as a video signal), and a latch signal (LAT) are supplied to the signal line driver circuit 5304. Note that each clock signal may be a plurality of clock signals with different phases, or may be supplied with an inverted clock signal (CKB). Note that either the first scan line driver circuit 5302 or the second scan line driver circuit 5303 can be omitted.

Figure 14B:
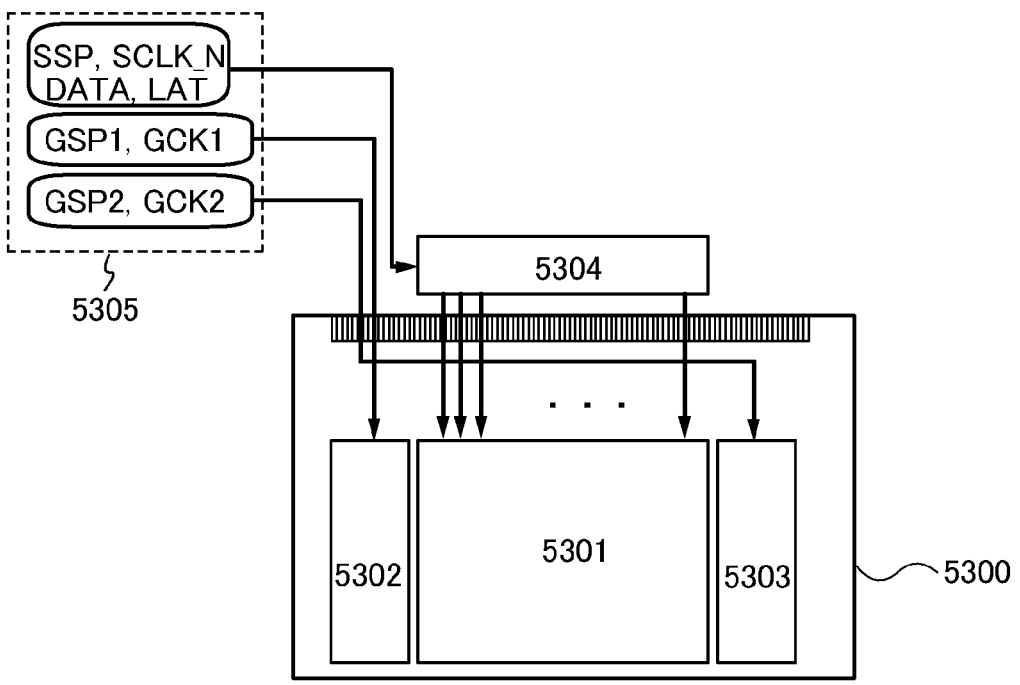

In FIG. 14B, a circuit with a low drive frequency (e.g., the first scan line driver circuit 5302 and the second scan line driver circuit 5303) is formed over the same substrate 5300 as the pixel portion 5301, and the signal line driver circuit 5304 is formed over another substrate which is different from the substrate provided with the pixel portion 5301. This structure enables a driver circuit formed over the substrate 5300 using a thin film transistor having low field effect mobility, compared with a transistor formed using a single crystal semiconductor. Accordingly, increase in the size of the display device, a reduction in the number of steps, a reduction in cost, improvement in yield, or the like can be achieved.

Figure 15A:
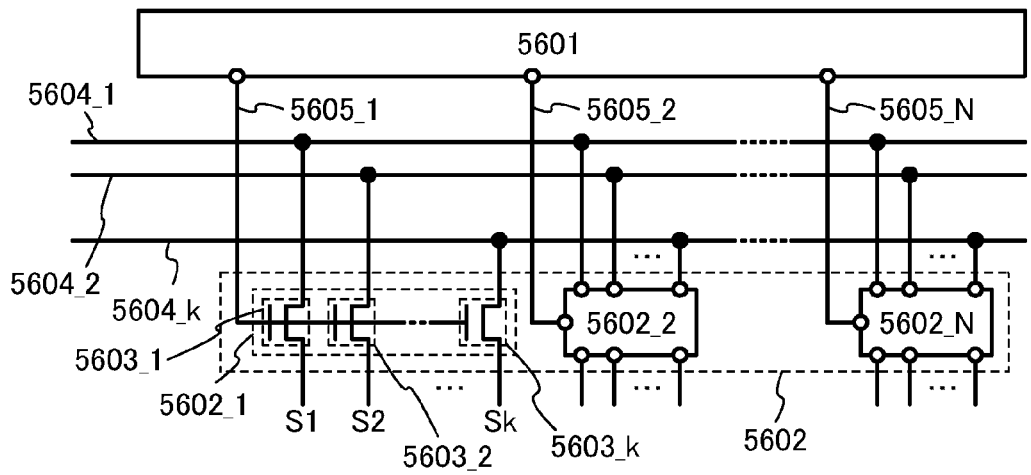
FIGS. 15A and 15B are a circuit diagram and a timing chart of a signal line driver circuit, respectively.
Figure 15B:
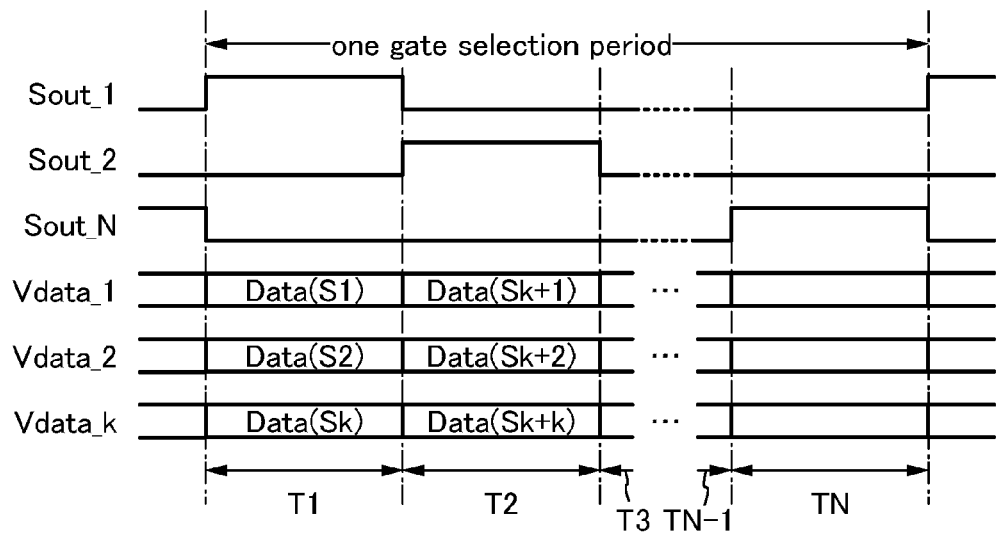

The thin film transistors described in Embodiments 1 to 5 are n-channel TFTs. In FIGS. 15A and 15B, an example of a structure and operation of a signal line driver circuit formed using an n-channel TFT is described.

The signal line driver circuit includes a shift register 5601 and a switching circuit 5602. The switching circuit 5602 includes a plurality of switching circuits 5602_1 to 5602_N(N is a natural number). The switching circuits 5602_1 to 5602_N each include a plurality of thin film transistors 5603_1 to 5603_$k$ ($k$ is a natural number). An example in which the thin film transistors 5603_1 to 5603_$k$ are n-channel TFTs is described.

A connection relation of the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal wirings S1 to Sk, respectively. Gates of the thin film transistors 5603_1 to 5603_$k$ are connected to a wiring 5605_1.

The shift register 5601 has a function of sequentially outputting H level signals (also referred to as an H signal or a high power electric potential level) to the wirings 5605_1 to 5605_N, and a function of sequentially selecting the switching circuits 5602_1 to 5602_N.

The switching circuit 5602_1 has a function of controlling conduction states between the wirings 5604_1 to 5604_$k$ and the signal lines S1 to Sk (conduction between the first terminal and the second terminal), that is, a function of controlling whether the electric potentials of the wirings 5604_1 to 5604_$k$ are supplied or not to the signal lines S1 to Sk. In this manner, the switching circuit 5602_1 has a function of a selector. The thin film transistors 5603_1 to 5603_$k$ have functions of controlling conduction states between the wirings 5604_1 to 5604_$k$ and the signal lines S1 to Sk, that is, functions of supplying electric potentials of the wirings 5604_1 to 5604_$k$ to the signal lines S1 to Sk, respectively. In this manner, each of the thin film transistors 5603_1 to 5603_$k$ functions as a switch.

Note that the data for a video signal (DATA) is input to the wirings 5604_1 to 5604_$k$. The data for a video signal (DATA) is an analog signal corresponding to image data or an image signal in many cases.

Next, operation of the signal line driver circuit illustrated in FIG. 15A is described with reference to a timing chart in FIG. 15B. In FIG. 15B, an example of signals Sout_1 to Sout_N and signals Vdata_1 to Vdata_k is illustrated. The signals Sout_1 to Sout_N are examples of output signals of the shift register 5601, and the signals Vdata_1 to Vdata_k are examples of signals which are input to the wirings 5604_1 to 5604_$k$, respectively. Note that one operation period of the signal line driver circuit corresponds to one gate selection period in a display device. For example, one gate selection period is divided into periods T1 to TN. The periods T1 to TN are periods for writing the data for a video signal (DATA) to pixels in a selected TOW.

Note that signal waveform distortion and the like in each structure illustrated in drawings and the like in this embodiment are exaggerated for simplicity in some cases. Therefore, the present invention is not limited to such scales.

In the periods T1 to TN, the shift register 5601 sequentially outputs H level signals to the wirings 5605_1 to 5605_N. For example, in the period T1, the shift register 5601 outputs a high level signal to the wiring 5605_1. Then, the thin film transistors 5603_1 to 5603_k are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in a selected row in a first to k-th columns through the thin film transistors 5603_1 to 5603_k, respectively. Thus, in the periods T1 to TN, the data for a video signal (DATA) is sequentially written to the pixels in the selected row by k columns.

By writing the data for a video signal (DATA) to pixels by a plurality of columns, the number of the data for a video signal (DATA) or the number of wirings can be reduced. Accordingly, the number of connections to external circuits can be reduced. Further, by writing a video signal to pixels of a plurality of columns each time, write time can be extended, and shortage of writing of a video signal can be prevented.

Note that for the shift register 5601 and the switching circuit 5602, a circuit formed using the thin film transistor described in Embodiments 1 to 5 can be used. In that case, all the transistors included in the shift register 5601 can be only n-channel transistors or only p-channel transistors.

One mode of a shift register which is used for part of a scan line driver circuit and/or a signal line driver circuit is described with reference to FIGS. 16A to 16C and FIGS. 17A and 17B.

The scan line driver circuit includes a shift register. Additionally, the scan line driver circuit may include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can feed a large amount of current is used.

Figure 16A:
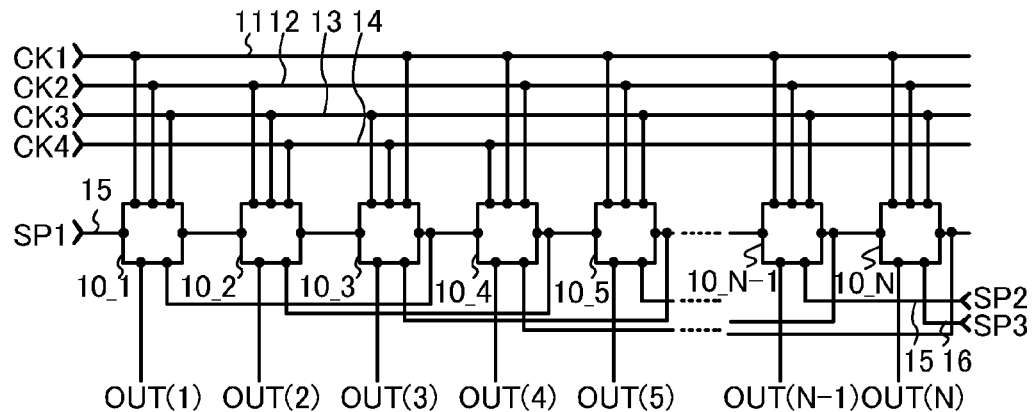
FIGS. 16A to 16C each illustrate a configuration of a shift register.

The shift register includes a first to Nth pulse output circuits 10_1 to 10_N(N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n (n is a natural number greater than or equal to 2 and less than or equal to N) in the second or later stage, a signal from the pulse output circuit in the preceding stage (such a signal is referred to as a preceding-stage signal OUT(n−1)) is input. A signal from the third pulse output circuit 10_3 in the stage that is two stages after the first pulse output circuit 10_1 is also input to the first pulse output circuit 10_1. In a similar manner, a signal from the (n+2)th pulse output circuit 10_(n+2) in the stage that is two stages after the nth pulse output circuit 10_n (such a signal is referred to as a later-stage signal OUT(n+2)) is input to the nth pulse output circuit 10_n in the second or later stage. Thus, the pulse output circuits in the respective stages output first output signals (OUT(1)(SR) to OUT (N)(SR)) to be input to the pulse output circuits in the respective subsequent stages and/or the pulse output circuits in the stages that are two stages before the respective pulse output circuits and second output signals (OUT(1) to OUT (N)) to be input to other circuits or the like. Note that as illustrated in FIG. 16A, since the later-stage signal OUT(n+2) is not input to the pulse output circuits in the last two stages of the shift register, for example, a second start pulse SP2 and a third start pulse SP3 may be additionally input to the respective pulse output circuits.

Note that a clock signal (CK) is a signal which alternates between an H level signal and an L level signal (also referred to as an L signal or a low power supply potential level) at a regular interval. Here, the first to fourth clock signals (CK1) to (CK4) are sequentially delayed by a quarter of a cycle. In this embodiment, by using the first to fourth clock signals (CK1) to (CK4), control or the like of driving of a pulse output circuit is performed. Although the clock signal is used as a GCK or an SCK in accordance with a driver circuit to which the clock signal is input, the clock signal is described as a CK here.

A first input terminal 21, a second input terminal 22, and a third input terminal 23 are electrically connected to any of the first to fourth wirings 11 to 14. For example, in FIG. 16A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 16B:
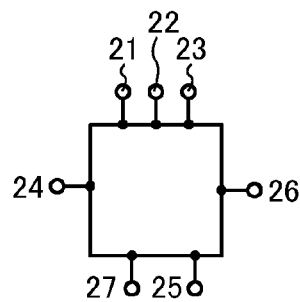

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21, the second clock signal CK2 is input to the second input terminal 22, the third clock signal CK3 is input to the third input terminal 23, the start pulse is input to the fourth input terminal 24, a subsequent stage signal OUT (3) is input to the fifth input terminal 25, a first output signal OUT (1) (SR) is output from the first output terminal 26, and a second output signal OUT (1) is output from the second output terminal 27.

In the first to Nth pulse output circuits 10_1 to 10_N, the thin film transistor (TFT) having four terminals described in the above embodiment can be used in addition to a thin film transistor having three terminals. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode.

When a channel layer of a thin film transistor is formed using an oxide semiconductor, a threshold voltage is shifted in a negative or positive direction in some cases depending on a manufacturing process. Thus, a thin film transistor in which an oxide semiconductor is used for a channel layer favorably has a structure with which a threshold voltage can be controlled. The threshold voltage of a thin film transistor having four terminals can be controlled to be a desired value by control of the electric potential of the upper gate electrode and/or the lower gate electrode.

Next, an example of a specific circuit structure of the pulse output circuit illustrated in FIG. 16B is described with reference to FIG. 16C.

Figure 16C:
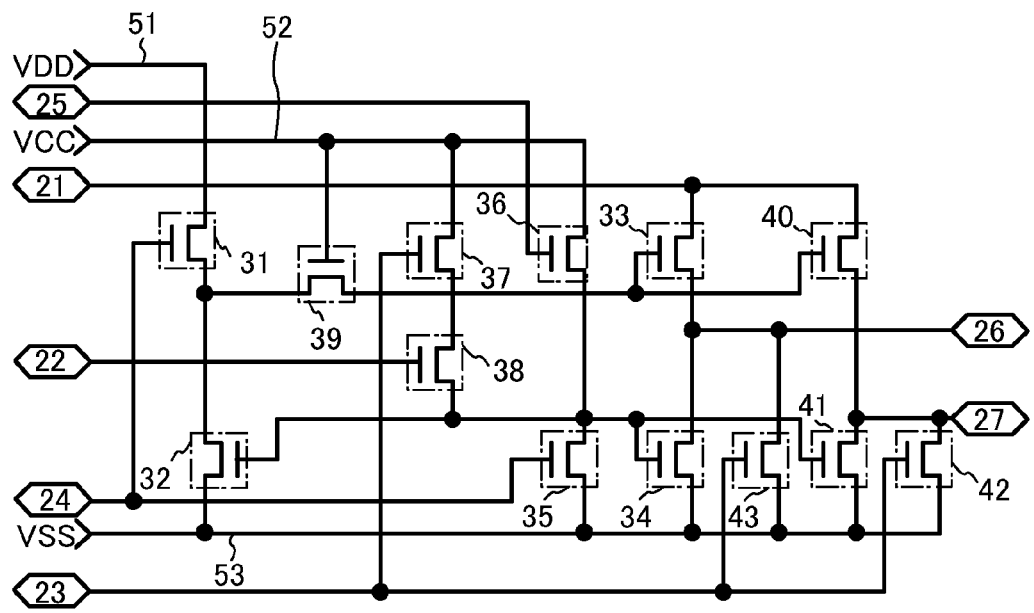

The pulse output circuit illustrated in FIG. 16C includes first to thirteenth transistors 31 to 43. In addition to the first to fifth input terminals 21 to 25, the first output terminal 26, and the second output terminal 27, signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied. Here, the magnitude relation among power supply potentials of the power supply lines illustrated in FIG. 16C is set as follows: the first power supply potential VDD is higher than or equal to the second power supply potential VCC, and the second power supply potential VCC is higher than the third power supply potential VSS. Although the first to fourth clock signals (CK1) to (CK4) are signals which alternate between an H level signal and an L level signal at a regular interval, an electric potential is VDD when the clock signal is at an H level, and an electric potential is VSS when the clock signal is at an L level. Note that the electric potential VDD of the power supply line 51 is higher than the electric potential VCC of the power supply line 52, so that there is no effect on an operation, the electric potential applied to a gate electrode of a transistor can be low, a shift of the threshold voltage of the transistor can be reduced, and deterioration can be suppressed. A thin film transistor having four terminals is preferably used as the first transistor 31 and the sixth to ninth transistors 36 to 39 among the first to thirteenth transistors 31 to 43. The first transistor 31 and the sixth to ninth transistors 36 to 39 need to operate so that an electric potential of a node to which one electrode serving as a source or a drain is connected is switched with a control signal of the gate electrode, and can further reduce malfunction of the pulse output circuit because response to the control signal input to the gate electrode is fast (the rise of on-state current is steep). Thus, with the use of the thin film transistor having four terminals, the threshold voltage can be controlled, and malfunction of the pulse output circuit can be further prevented.

In FIG. 16C, a first terminal of the first transistor 31 is electrically connected to the power supply line 51, a second terminal of the first transistor 31 is electrically connected to a first terminal of the ninth transistor 39, and gate electrodes (a first gate electrode and a second gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a first gate electrode and a second gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a first gate electrode and a second gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a first gate electrode and a second gate electrode) of the eighth transistor 38 are electrically connected to the second input terminal 22. A first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and gate electrodes (a first gate electrode and a second gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the first gate electrode and the second gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the first gate electrode and the second gate electrode) of the seventh transistor 37.

In FIG. 16C, a connection portion of the gate electrode of the third transistor 33, the gate electrode of the tenth transistor 40, and the second terminal of the ninth transistor 39 is a node A. A connection portion of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is a node B.

Figure 17A:
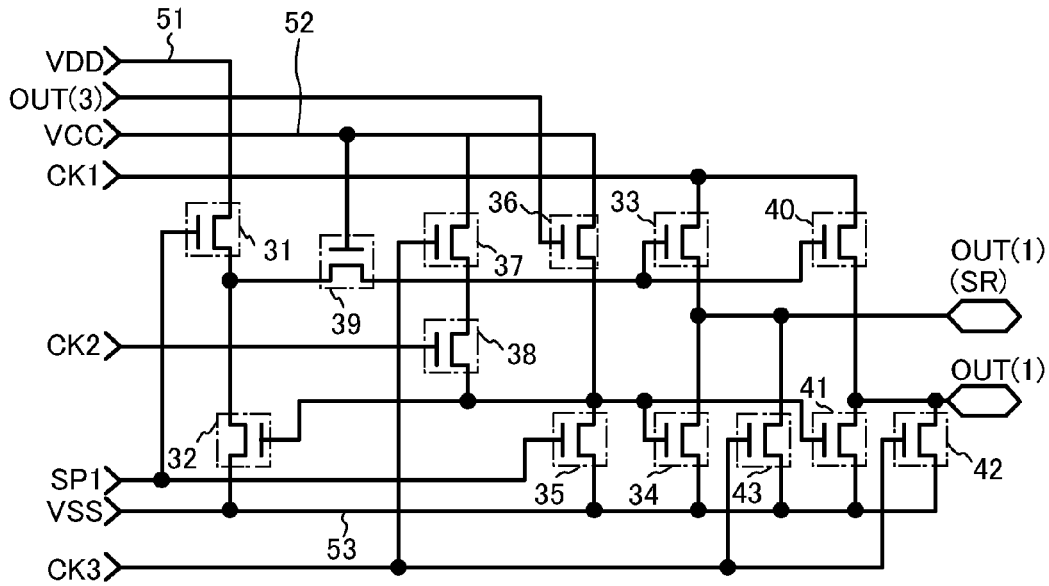
FIGS. 17A and 17B are a circuit diagram and a timing chart of a shift register, respectively.

In FIG. 17A, signals which are input or output to/from the first to the fifth input terminals 21 to 25, the first output terminal 26, and the second output terminal 27 when the pulse output circuit illustrated in FIG. 16C is applied to the first pulse output circuit 10_1 are illustrated.

Specifically, the first clock signal CK1 is input to the first input terminal 21, the second clock signal CK2 is input to the second input terminal 22, the third clock signal CK3 is input to the third input terminal 23, the start pulse is input to the fourth input terminal 24, the subsequent stage signal OUT (3) is input to the fifth input terminal 25, the first output signal OUT (1) (SR) is output from the first output terminal 26, and the second output signal OUT (1) is output from the second output terminal 27.

Note that a thin film transistor is an element having at least three terminals of a gate, a drain, and a source. The thin film transistor has a semiconductor whose channel region is formed at a region that overlaps with the gate, and the electric potential of the gate is controlled, whereby current which flows between the drain and the source through the channel region can be controlled. Here, since the source and the drain of the thin film transistor may change depending on the structure, the operating condition, and the like of the thin film transistor, it is difficult to define which is a source or a drain. Therefore, a region functioning as a source or a drain is not called the source or the drain in some cases. In such a case, for example, one of the source and the drain may be referred to as a first terminal and the other thereof may be referred to as a second terminal.

Note that in FIG. 16C and FIG. 17A, a capacitor may be additionally provided in order to perform bootstrap operation effected by the node A in a floating state. A capacitor whose one electrode is electrically connected to the node B may be provided in order to hold the electric potential of the node B.

Figure 17B:
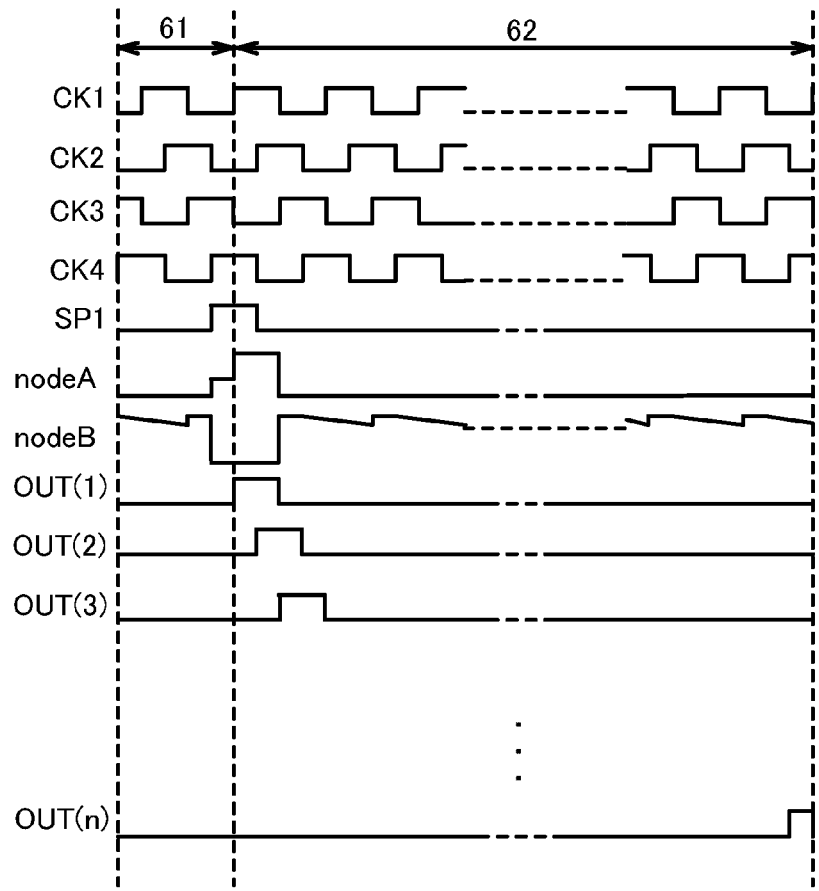

Here, a timing chart of a shift register in which a plurality of pulse output circuits illustrated in FIG. 17A is provided is illustrated in FIG. 17B. Note that in FIG. 17B, when the shift register is a scan line driver circuit, a period 61 is a vertical retrace period and a period 62 is a gate selection period.

Note that as illustrated in FIG. 17A, when the ninth transistor 39 having the gate to which the second power supply potential VCC is applied is provided, there are the following advantages before or after the bootstrap operation.

Without the ninth transistor 39 whose gate electrode is supplied with the second power supply potential VCC, when an electric potential of the node A is raised by bootstrap operation, an electric potential of a source which is the second terminal of the first transistor 31 increases to a value higher than the first power supply potential VDD. Then, the source of the first transistor 31 is switched to the first terminal side, that is, the power supply line 51 side. Therefore, in the first transistor 31, a large amount of bias voltage is applied and thus great stress is applied between a gate and a source and between the gate and a drain, which can cause deterioration in the transistor. When the ninth transistor 39 is provided whose gate electrode is supplied with the second power supply potential VCC, an electric potential of the node A is raised by bootstrap operation, but at the same time, an increase in an electric potential of the second terminal of the first transistor 31 can be prevented. In other words, with the ninth transistor 39, negative bias voltage applied between a gate and a source of the first transistor 31 can be reduced. Accordingly, with a circuit structure in this embodiment, negative bias voltage applied between a gate and a source of the first transistor 31 can be reduced, so that deterioration in the first transistor 31, which is due to stress, can further be restrained.

Note that the ninth transistor 39 may be provided in any places where the ninth transistor 39 is connected between the second terminal of the first transistor 31 and the gate of the third transistor 33 through the first terminal and the second terminal. When a shift register includes a plurality of pulse output circuits in this embodiment, the ninth transistor 39 may be omitted in a signal line driver circuit which has a larger number of stages than a scan line driver circuit, and there is an advantage of decreasing the number of transistors.

Note that when oxide semiconductors are used for semiconductor layers for the first to the thirteenth transistors 31 to 43, the off-state current of the thin film transistors can be reduced, the on-state current and the field effect mobility can be increased, and the degree of deterioration can be reduced, whereby malfunction of a circuit can decrease. Compared with a transistor formed using an oxide semiconductor and a transistor formed using amorphous silicon, the degree of deterioration of the transistor due to the application of a high electric potential to the gate electrode is low. Therefore, similar operation can be obtained even when the first power supply potential VDD is supplied to the power supply line which supplies the second power supply potential VCC, and the number of power supply lines which are led between circuits can decrease; therefore, the size of the circuit can be reduced.

Note that a similar function is obtained even when the connection relation is changed so that a clock signal that is supplied to the gate electrodes (the first gate electrode and the second gate electrode) of the seventh transistor 37 from the third input terminal 23 and a clock signal that is supplied to the gate electrodes (the first gate electrode and the second gate electrode) of the eighth transistor 38 from the second input terminal 22 are supplied from the second input terminal 22 and the third input terminal 23, respectively. Note that in the shift register illustrated in FIG. 17A, the state is changed from the state where both the seventh transistor 37 and the eighth transistor 38 are turned on, to the state where the seventh transistor 37 is turned off and the eighth transistor 38 is turned on, and then to the state where both the seventh transistor 37 and the eighth transistor 38 are turned off; thus, the fall in an electric potential of the node B due to fall in the electric potentials of the second input terminal 22 and the third input terminal 23 is caused twice by fall in the electric potential of the gate electrode of the seventh transistor 37 and fall in the electric potential of the gate electrode of the eighth transistor 38. On the other hand, when the shift register illustrated in FIG. 17A is operated as in a period illustrated in FIG. 17B, the state is changed from the state where both the seventh transistor 37 and the eighth transistor 38 are turned on to the state where the seventh transistor 37 is turned on and the eighth transistor 38 is turned off, and then to the state where both the seventh transistor 37 and the eighth transistor 38 are turned off. Accordingly, the fall in an electric potential of the node B due to fall in electric potentials of the second input terminal 22 and the third input terminal 23 is reduced to one, which is caused by fall in an electric potential of the gate electrode of the eighth transistor 38. Therefore, the connection relation, that is, the clock signal CK3 is supplied from the third input terminal 23 to the gate electrodes (the first gate electrode and the second gate electrode) of the seventh transistor 37 and the clock signal CK2 is supplied from the second input terminal 22 to the gate electrodes (the first gate electrode and the second gate electrode) of the eighth transistor 38, is preferable. That is because the number of times of the change in the electric potential of the node B can be reduced, whereby the noise can be decreased.

In this way, in a period during which the electric potential of the first output terminal 26 and the electric potential of the second output terminal 27 are each held at an L level, an H level signal is regularly supplied to the node B; therefore, malfunction of the pulse output circuit can be suppressed.

(Embodiment 10)

A thin film transistor is manufactured, and a semiconductor device having a display function (also referred to as a display device) can be manufactured using the thin film transistor in a pixel portion and further in a driver circuit. Further, part or the whole of the driver circuit having the thin film transistors is formed over the same substrate as the pixel portion, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which a display element is sealed, and a module in which an IC and the like including a controller are mounted on the panel. Furthermore, an element substrate, which corresponds to an embodiment before the display element is completed in a manufacturing process of the display device, is provided with a means for supplying current to the display element in each of a plurality of pixels. The element substrate may be specifically in a state where only a pixel electrode (which is also called a pixel electrode layer) of a display element is formed or in a state after a conductive film to be a pixel electrode is formed and before the conductive film is etched to form a pixel electrode, and can have any mode.

Note that a display device in this specification means an image display device, a display device, or a light source (including a lighting device). Further, the display device includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

The appearance and a cross section of a liquid crystal display panel, which corresponds to one mode of a semiconductor device, are described with reference to FIGS. 10A1, 10A2, and 10B. FIGS. 10A1 and 10A2 are each a plan view of a panel in which thin film transistors 4010 and 4011 and a liquid crystal element 4013 are sealed between a first substrate 4001 and a second substrate 4006 with a sealant 4005. FIG. 10B is a cross-sectional view taken along line M-N in FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of a driver circuit which is separately formed, and a COG method, a wire bonding method, a TAB method, or the like can be used. FIG. 10A1 illustrates an example in which the signal line driver circuit 4003 is mounted by a COG method and FIG. 10A2 illustrates an example in which the signal line driver circuit 4003 is mounted by a TAB method.

Each of the pixel portion 4002 and the scan line driver circuit 4004 which are provided over the first substrate 4001 includes a plurality of thin film transistors. FIG. 10B illustrates the thin film transistor 4010 included in the pixel portion 4002 and the thin film transistor 4011 included in the scan line driver circuit 4004. Over the thin film transistors 4010 and 4011, protective insulating layers 4020 and 4021 are provided.

For the thin film transistors 4010 and 4011, the highly reliable thin film transistors including the oxide semiconductor layer which are described in any of Embodiments 1 to 4 can be employed. The thin film transistor 410 or the thin film transistor 449 described in the aforementioned embodiments can be used as the thin film transistor 4011 for the driver circuit. The thin film transistor 420 or the thin film transistor 450 can be used as the thin film transistor 4010 for the pixel. In this embodiment, the thin film transistors 4010 and 4011 are n-channel thin film transistors.

Over the insulating layer 4021, a conductive layer 4040 is provided in a position which overlaps with a channel formation region of an oxide semiconductor layer included in the thin film transistor 4011 for the driver circuit. By providing the conductive layer 4040 in the position which overlaps with the channel formation region of the oxide semiconductor layer, the amount of change in the threshold voltage of the thin film transistor 4011 between before and after the BT test can be reduced. The conductive layer 4040 may have the same electric potential as a gate electrode layer of the thin film transistor 4011 or have an electric potential different from that of the gate electrode layer and can function as a second gate electrode layer. The electric potential of the conductive layer 4040 may be a GND electric potential, 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is provided on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 interposed therebetween.

Note that a light-transmitting substrate can be used as the first substrate 4001 and the second substrate 4006; glass, ceramic, or plastic can be used. As plastic, a fiberglass-reinforced plastics (FRP) plate, a polyvinyl fluoride (PVF) film, a polyester film, or an acrylic resin film can be used.

A spacer 4035 is a columnar spacer obtained by selective etching of an insulating film and is provided in order to control the distance (a cell gap) between the pixel electrode layer 4030 and the counter electrode layer 4031. Alternatively, a spherical spacer may also be used. In addition, the counter electrode layer 4031 is electrically connected to a common potential line formed over the same substrate as the thin film transistor 4010. With the use of a common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which appears just before a cholesteric phase changes into an isotropic phase while temperature of cholesteric liquid crystal is increased. Since the blue phase only appears within a narrow range of temperature, a liquid crystal composition containing a chiral agent at 5 percent by weight or more so as to improve the temperature range is used for the liquid crystal layer 4008. The liquid crystal composition which includes a liquid crystal exhibiting a blue phase and a chiral agent has a short response time of 1 msec or less, has optical isotropy, which makes the alignment process unneeded, and has a small viewing angle dependence.

An embodiment of the present invention can also be applied to a semi-transmissive liquid crystal display device, in addition to a transmissive liquid crystal display device.

An example of the liquid crystal display device is described in which a polarizing plate is provided on the outer surface of the substrate (on the viewer side) and a coloring layer (color filter) and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process.

In the thin film transistor 4011, the insulating layer 4041 is formed as a protective insulating film so as to be in contact with the oxide semiconductor layer including a channel formation region. The insulating layer 4041 may be formed using a material and a method similar to those of the oxide insulating film 416 described in Embodiment 1. In addition, in order to reduce the surface roughness of the thin film transistors, the thin film transistors are covered with the protective insulating layer 4021 functioning as a planarizing insulating film. Here, as the insulating layer 4041, a silicon oxide film is formed by a sputtering method according to Embodiment 1.

Further, the protective insulating layer 4020 is provided over the thin film transistors 4010 and 4011. The protective insulating layer 4020 can be formed using a material and a method similar to those of the protective insulating layer 403 described in Embodiment 1. Here, as the protective insulating layer 4020, a silicon nitride film is formed by a PCVD method.

The insulating layer 4021 is formed as the planarizing insulating film. The insulating layer 4021 may be formed using a material and a method similar to those of the planarizing insulating layer 404 described in Embodiment 1; for example, an organic material having heat resistance such as acrylic, polyimide, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

There is no particular limitation on the method for forming the insulating layer 4021, and the insulating layer 4021 can be formed, depending on the material, by a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater. The baking step of the insulating layer 4021 also serves as an annealing of the oxide semiconductor layer, whereby a semiconductor device can be efficiently manufactured.

The pixel electrode layer 4030 and the counter electrode layer 4031 can be formed using a light-transmitting conductive material such as indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a light transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and electric potentials are supplied to the signal line driver circuit 4003 which is formed separately, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistor 4011.

The connection terminal electrode 4015 is electrically connected to a terminal included in the FPC 4018 via an anisotropic conductive film 4019.

FIGS. 10A1, 10A2, and 10B illustrate an example in which the signal line driver circuit 4003 is formed separately and mounted on the first substrate 4001; however, an embodiment of the present invention is not limited to this structure. The scan line driver circuit may be separately formed and then mounted, or only part of the signal line driver circuit or part of the scan line driver circuit may be separately formed and then mounted.

Figure 19:
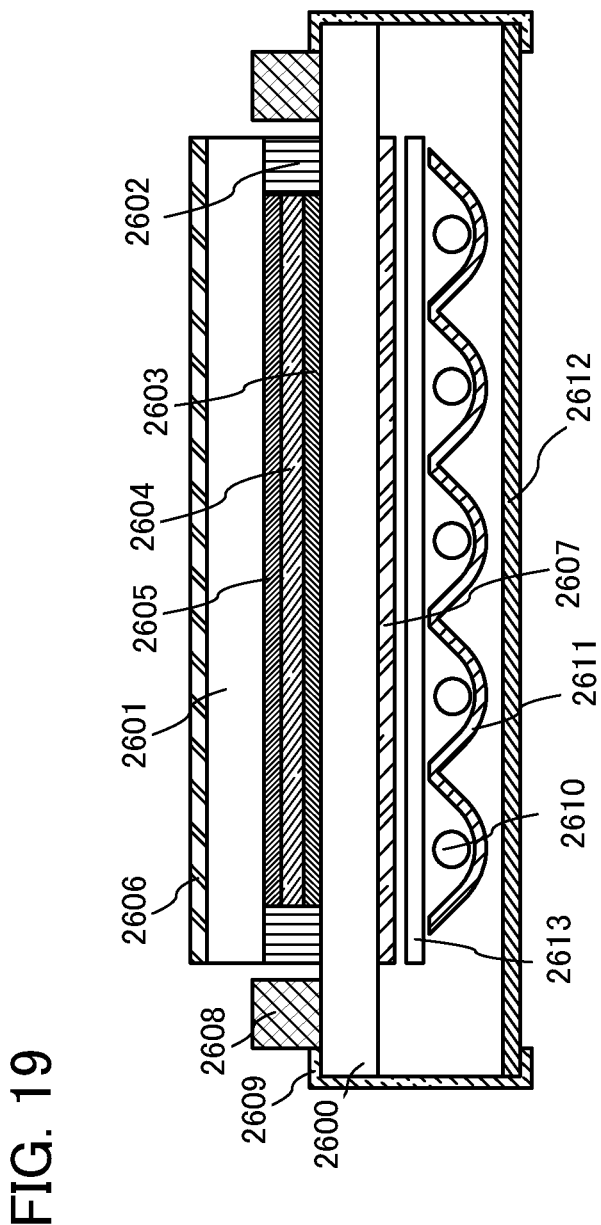
FIG. 19 illustrates a semiconductor device.

FIG. 19 illustrates an example in which a liquid crystal display module is formed as a semiconductor device using a TFT substrate 2600 which is manufactured according to the manufacturing method disclosed in this specification.

FIG. 19 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605, are provided between the substrates to form a display region. The coloring layer 2605 is necessary to perform color display. In the RGB system, respective coloring layers corresponding to colors of red, green, and blue are provided for respective pixels. A polarizing plate 2606 is provided on the outer side of the counter substrate 2601, while a polarizing plate 2607 and a diffusion plate 2613 are provided on the outer side of the TFT substrate 2600. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power supply circuit. The polarizing plate and the liquid crystal layer may be stacked with a retardation plate interposed therebetween.

The liquid crystal display module can employ a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optically Compensated Birefringence) mode, an FLC (Ferroelectric Liquid Crystal) mode, an AFLC (Anti Ferroelectric Liquid Crystal) mode, or the like.

Through the above process, a highly reliable liquid crystal display panel as a semiconductor device can be manufactured.

This embodiment can be implemented in appropriate combination with the structures described in the other embodiments.

(Embodiment 11)

An example of electronic paper is described as an embodiment of a semiconductor device.

The semiconductor device can be used for electronic paper in which electronic ink is driven by an element electrically connected to a switching element. The electronic paper is also referred to as an electrophoretic display device (an electrophoretic display device) and is advantageous in that it has the same level of readability as plain paper, it has lower power consumption than other display devices, and it can be made thin and lightweight.

Electrophoretic display devices can have various modes. Electrophoretic display devices contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain dye and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region. An electrophoretic display device does not need to use a polarizing plate which is required in a liquid crystal display device.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, when a plurality of the above microcapsules is arranged as appropriate over an active matrix substrate so as to be interposed between two electrodes, an active matrix display device can be completed, and display can be performed by application of an electric field to the microcapsules. For example, the active matrix substrate obtained by the thin film transistor described in any of Embodiments 1 to 4 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 18:
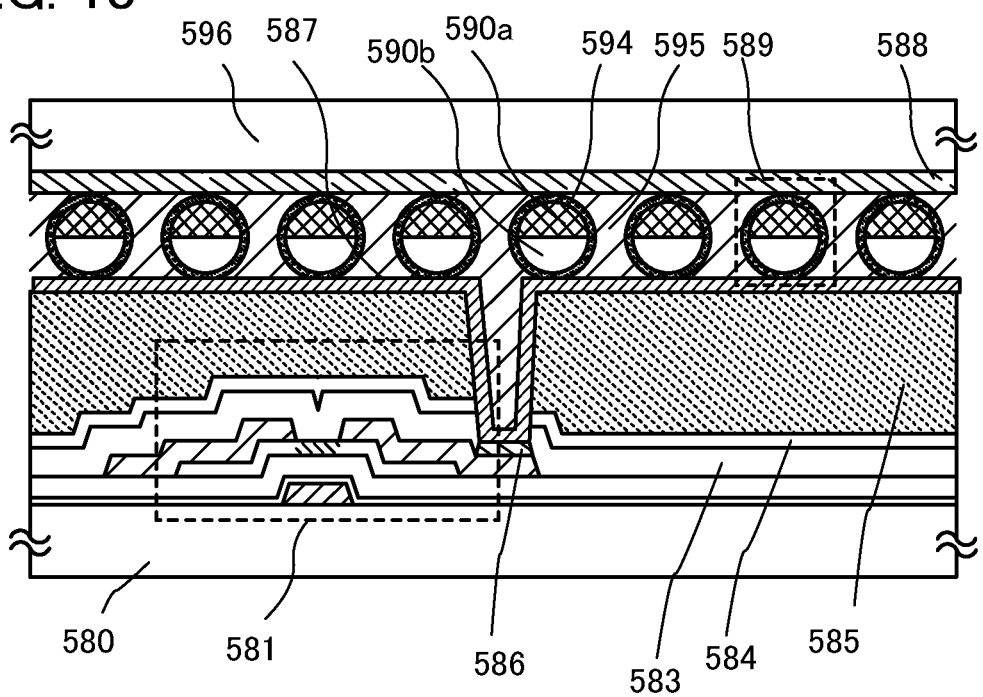
FIG. 18 illustrates a semiconductor device.

FIG. 18 illustrates active matrix electronic paper as an example of a semiconductor device. A thin film transistor 581 used for the semiconductor device can be formed in a manner similar to the thin film transistor described in Embodiment 1, which is a highly reliable thin film transistor including an oxide semiconductor layer. Alternatively, the thin film transistor described in any of Embodiments 2 to 4 can be used as the thin film transistor 581 of this embodiment.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and an electric potential difference is generated between the first electrode layer and the second electrode layer to control orientation of the spherical particles, so that display is performed.

The thin film transistor 581 formed over a substrate 580 is a bottom gate thin film transistor and is covered with an insulating layer 583 which is in contact with a semiconductor layer. A source electrode layer or a drain electrode layer of the thin film transistor 581 is in contact with a first electrode layer 587 in an opening formed in insulating layers 583, 584, and 585, whereby the thin film transistor 581 is electrically connected to the first electrode layer 587. Between the first electrode layer 587 and a second electrode layer 588 on a substrate 596, spherical particles 589 are provided. Each spherical particle 589 includes a black region 590a and a white region 590b, and a cavity 594 filled with liquid around the black region 590a and the white region 590b. The circumference of the spherical particle 589 is filled with a filler 595 such as a resin or the like. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line by conductive particles arranged between a pair of substrates.

Further, instead of the twisting ball, an electrophoretic element can also be used. A microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through the above process, a highly reliable electronic paper as a semiconductor device can be manufactured.

This embodiment can be implemented in appropriate combination with the structures described in the other embodiments.

(Embodiment 12)

An example of a light-emitting display device is described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Based on this mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 12:
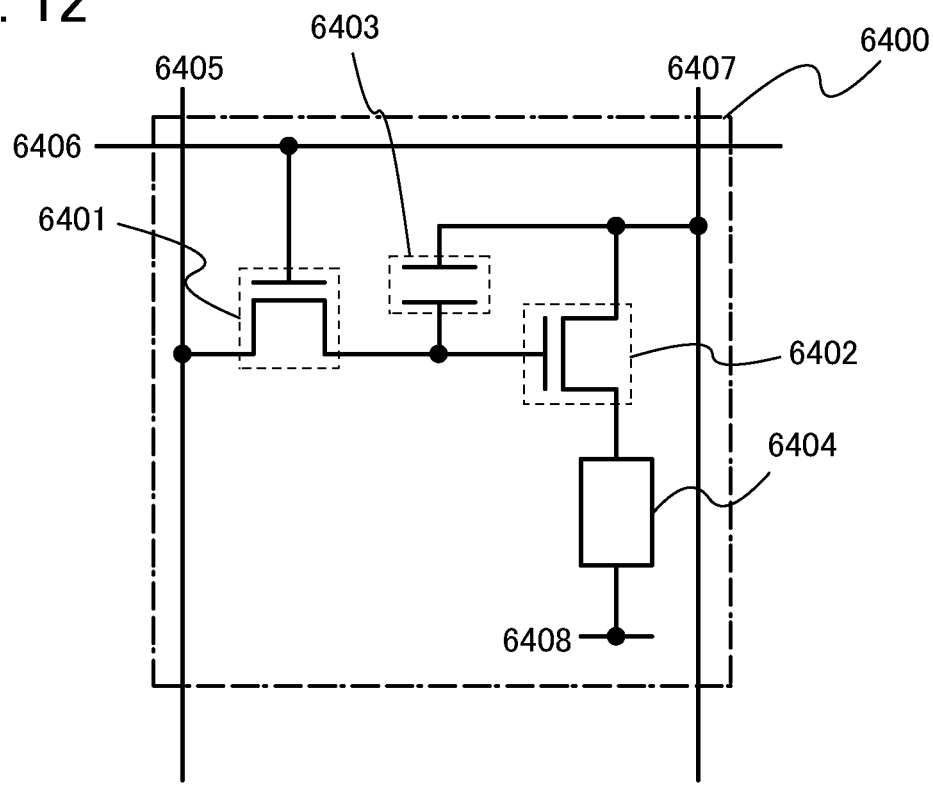
FIG. 12 illustrates a pixel equivalent circuit of a semiconductor device.

FIG. 12 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402 for a light-emitting element, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402 for a light-emitting element. The gate of the driver transistor 6402 for a light-emitting element is connected to a power supply line 6407 via the capacitor 6403, a first electrode of the driver transistor 6402 for a light-emitting element is connected to the power supply line 6407, and a second electrode of the driver transistor 6402 for a light-emitting element is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is an electric potential satisfying the low power supply potential<a high power supply potential with reference to the high power supply potential that is set to the power supply line 6407. As the low power supply potential, a GND electric potential, 0 V, or the like may be employed, for example. An electric potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each electric potential is set so that the electric potential difference between the high power supply potential and the low power supply potential is forward threshold voltage or higher of the light-emitting element 6404.

Gate capacitance of the driver transistor 6402 for a light-emitting element may be used as a substitute for the capacitor 6403, so that the capacitor 6403 can be omitted. The gate capacitance of the driver transistor 6402 for a light-emitting element may be formed between a channel region and a gate electrode.

In the case of a voltage-input voltage driving method, a video signal is input to the gate of the driver transistor 6402 for a light-emitting element so that the driver transistor 6402 for a light-emitting element is in either of two states of being sufficiently turned on and turned off. That is, the driver transistor 6402 for a light-emitting element operates in a linear region. Since the driver transistor 6402 for a light-emitting element operates in a linear region, voltage higher than the voltage of the power supply line 6407 is applied to the gate of the driver transistor 6402 for a light-emitting element. Note that voltage higher than or equal to (voltage of the power supply line+Vth of the driver transistor 6402 for a light-emitting element) is applied to the signal line 6405.

In the case of performing analog grayscale driving instead of digital time grayscale driving, the same pixel structure as that in FIG. 12 can be used by changing signal input.

In the case of performing analog grayscale driving, voltage higher than or equal to (forward voltage of the light-emitting element 6404+Vth of the driver transistor 6402 for a light-emitting element) is applied to the gate of the driver transistor 6402 for a light-emitting element. The forward voltage of the light-emitting element 6404 indicates voltage at which a desired luminance is obtained, and includes at least forward threshold voltage. By inputting a video signal to enable the driver transistor 6402 for a light-emitting element to operate in a saturation region, current can be supplied to the light-emitting element 6404. In order to allow the driver transistor 6402 for a light-emitting element to operate in the saturation region, the electric potential of the power supply line 6407 is higher than a gate electric potential of the driver transistor 6402 for a light-emitting element. When an analog video signal is used, it is possible to feed current to the light-emitting element 6404 in accordance with the video signal and perform analog grayscale driving.

Note that an embodiment of the present invention is not limited to the pixel structure illustrated in FIG. 12. For example, a switch, a resistor, a capacitor, a transistor, a logic circuit, or the like may be added to the pixel illustrated in FIG. 12.

Next, structures of the light-emitting element are described with reference to FIGS. 13A to 13C. A cross-sectional structure of a pixel is described by taking an n-channel driver TFT for a light-emitting element as an example. Driver TFTs 7001, 7011, and 7021 for light-emitting elements, which are used in semiconductor devices illustrated in FIGS. 13A, 13B, and 13C, respectively, can be formed in a manner similar to that of the thin film transistor which is described in Embodiment 1 and provided in a pixel and are highly reliable thin film transistors each including an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a bottom emission structure is described with reference to FIG. 13A.

Figure 13A:
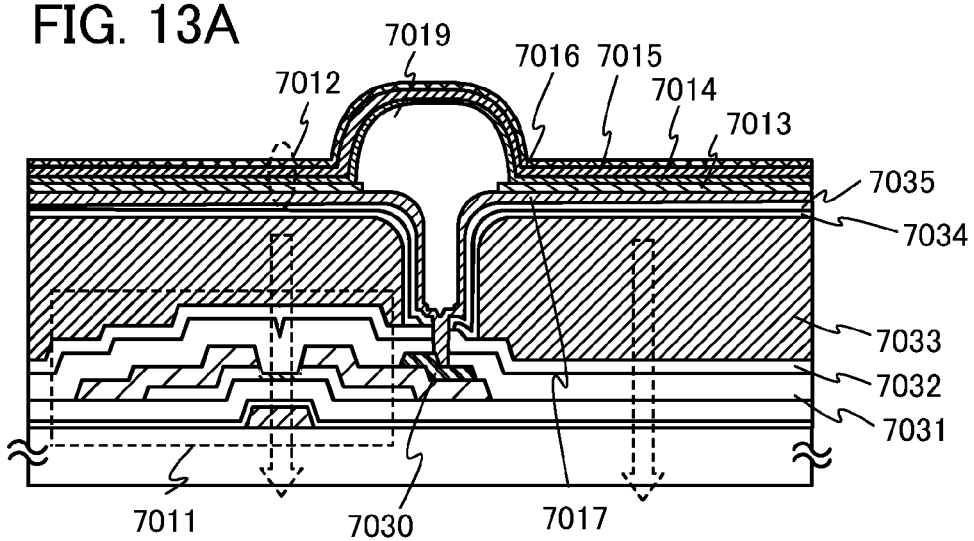
FIGS. 13A to 13C each illustrate a semiconductor device.

FIG. 13A is a cross-sectional view of a pixel in the case where the driver TFT 7011 for a light-emitting element is an n-channel transistor and light is emitted from a light-emitting element 7012 to a cathode 7013 side. In FIG. 13A, the cathode 7013 of the light-emitting element 7012 is formed over a light-transmitting conductive film 7017 that is electrically connected to the driver TFT 7011 for a light-emitting element via a connection electrode layer 7030, and an EL layer 7014 and an anode 7015 are stacked in that order over the cathode 7013. Note that the light-transmitting conductive film 7017 is electrically connected to a drain electrode layer of the driver TFT 7011 for a light-emitting element via the connection electrode layer 7030 through a contact hole which is formed in an oxide insulating layer 7031, an insulating layer 7032, and a protective insulating layer 7035.

As the light-transmitting conductive film 7017, a light-transmitting conductive film of a material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like can be used.

Any of a variety of materials can be used for the cathode 7013. Specifically, the cathode 7013 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In FIG. 13A, the cathode 7013 is formed to have a thickness through which light can be transmitted (preferably, approximately 5 nm to 30 nm). For example, an aluminum film with a thickness of 20 nm can be used as the cathode 7013.

Alternatively, a light-transmitting conductive film and an aluminum film may be stacked and then selectively etched so as to form the light-transmitting conductive film 7017 and the cathode 7013. In this case, the etching can be performed using the same mask, which is preferable.

Further, the periphery of the cathode 7013 is covered with a partition 7019. The partition 7019 is formed using an organic resin film of polyimide, acrylic, polyamide, epoxy, or the like, an inorganic insulating film, or organic polysiloxane. It is particularly preferable that the partition 7019 be formed using a photosensitive resin material to have an opening portion over the cathode 7013 so that a sidewall of the opening portion is formed as a tilted surface with continuous curvature. When the partition 7019 is formed using a photosensitive resin material, a step of forming a resist mask can be omitted.

The EL layer 7014 which is formed over the cathode 7013 and the partition 7019 may be formed using a single layer or a plurality of layers stacked. When the EL layer 7014 is formed using a plurality of layers, the EL layer 7014 is formed by stacking an electron-injection layer, an electron-transport layer, a light-emitting layer, a hole-transport layer, and a hole-injection layer in that order over the cathode 7013. Note that it is not necessary to form all of these layers.

In addition, the present invention is not limited to the above order of the stacked layers; that is, the EL layer 7014 may be formed by stacking a hole-injection layer, a hole-transport layer, a light-emitting layer, an electron-transport layer, and an electron-injection layer in that order over the cathode 7013. Note that when power consumption is contrasted, stacking an electron-injection layer, an electron-transport layer, a light-emitting layer, a hole-transport layer, and a hole-injection layer in that order over the cathode 7013 leads to low power consumption and thus is more preferable.

Any of a variety of materials can be used for the anode 7015 which is formed over the EL layer 7014; for example, a material having a high work function, examples of which are ZrN, Ti, W, Ni, Pt, Cr, and a transparent conductive material such as ITO, IZO, and ZnO, is preferable. It is also preferable that a film containing titanium nitride be used. Further, over the anode 7015, a light-blocking film 7016 is formed using, for example, a metal which blocks light or a metal which reflects light. In this embodiment, an ITO film is used as the anode 7015 and a Ti film is used as the light-blocking film 7016.

The light-emitting element 7012 corresponds to a region where the EL layer 7014 is sandwiched between the cathode 7013 and the anode 7015. In the case of the element structure illustrated in FIG. 13A, light is emitted from the light-emitting element 7012 to the cathode 7013 side as indicated by an arrow.

Note that in FIG. 13A, an example in which a light-transmitting conductive film is used as the gate electrode layer. Light emitted from the light-emitting element 7012 passes through the color filter layer 7033 and then passes through the gate electrode layer, the source electrode layer, and the like of the TFT 7011 so as to be emitted to the outside. By using a light-transmitting conductive film as the gate electrode layer, the source electrode layer, or the like of the TFT 7011, an increased aperture ratio can be obtained.

The color filter layer 7033 is formed by: a droplet discharge method such as an ink-jet method; a printing method; an etching method using a photolithography technique; or the like.

The color filter layer 7033 is covered with an overcoat layer 7034 and the protective insulating layer 7035 is further formed thereover. Note that although the overcoat layer 7034 is illustrated to have a small thickness in FIG. 13A, the overcoat layer 7034 has a function of reducing unevenness caused by the color filter layer 7033.

The contact hole formed in the oxide insulating layer 7031, the insulating layer 7032, and the protective insulating layer 7035 and reaching the connection electrode layer 7030 is in a position which overlaps with the partition 7019. Since a metal conductive film is used as the connection electrode layer 7030 in the example illustrated in FIG. 13A, an increased aperture ratio can be obtained by employing a structure in which the contact hole reaching the connection electrode layer 7030, the partition 7019, and the conductive film 7017 overlap with one another.

A light-emitting element having a dual emission structure is described with reference to FIG. 13B.

Figure 13B:
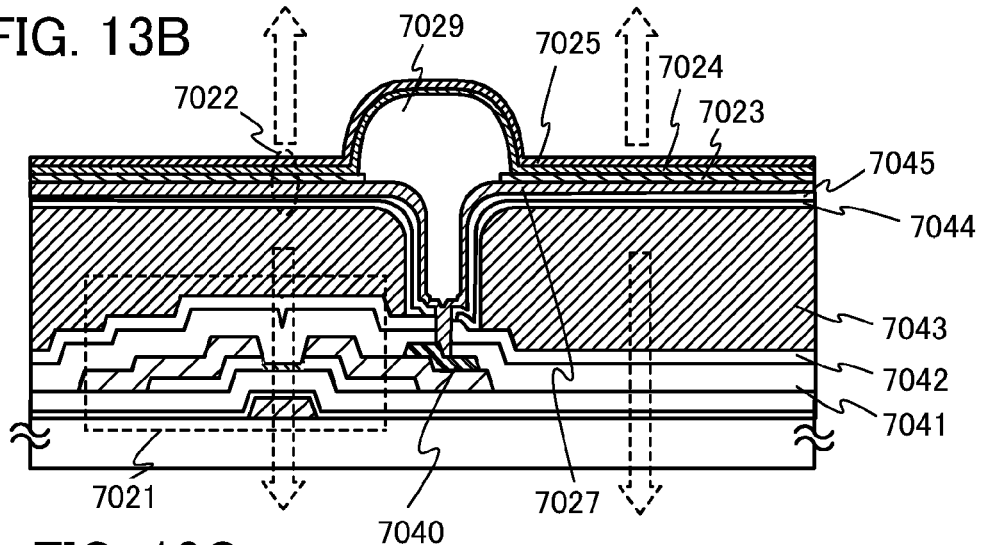

In FIG. 13B, a cathode 7023 of the light-emitting element 7022 is formed over a light-transmitting conductive film 7027 that is electrically connected to the driver TFT 7021 via a connection electrode layer 7040, and an EL layer 7024 and an anode 7025 are stacked in that order over the cathode 7023. Note that the light-transmitting conductive film 7027 is electrically connected to a drain electrode layer of the driver TFT 7021 via the connection electrode layer 7040 through a contact hole formed in an oxide insulating layer 7041, an insulating layer 7042, and a protective insulating layer 7045.

The light-transmitting conductive film 7027 can be formed using a light-transmitting conductive film of a material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like.

Any of a variety of materials can be used for the cathode 7023. Specifically, the cathode 7023 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the cathode 7023 is formed to have a thickness through which light can be transmitted (preferably, approximately 5 nm to 30 nm). For example, an aluminum film with a thickness of 20 nm can be used as the cathode 7023.

Alternatively, a light-transmitting conductive film and an aluminum film may be stacked and then selectively etched so as to form the light-transmitting conductive film 7027 and the cathode 7023. In this case, the etching can be performed using the same mask, which is preferable.

Further, the periphery of the cathode 7023 is covered with a partition 7029. The partition 7029 is formed using an organic resin film of polyimide, acrylic, polyamide, epoxy, or the like, an inorganic insulating film, or organic polysiloxane. It is particularly preferable that the partition 7029 be formed using a photosensitive resin material to have an opening portion over the cathode 7023 so that a sidewall of the opening portion is formed as a tilted surface with continuous curvature. When the partition 7029 is formed using a photosensitive resin material, a step of forming a resist mask can be omitted.

The EL layer 7024 which is formed over the cathode 7023 and the partition 7029 may be formed using a single layer or a plurality of layers stacked. When the EL layer 7024 is formed using a plurality of layers, the EL layer 7024 is formed by stacking an electron-injection layer, an electron-transport layer, a light-emitting layer, a hole-transport layer, and a hole-injection layer in that order over the cathode 7023. It is not necessary to form all of these layers.

In addition, the present invention is not limited to the above order of the stacked layers; that is, the EL layer 7024 may be formed by stacking a hole-injection layer, a hole-transport layer, a light-emitting layer, an electron-transport layer, and an electron-injection layer in that order over the cathode 7023. Note that when power consumption is contrasted, stacking an electron-injection layer, an electron-transport layer, a light-emitting layer, a hole-transport layer, and a hole-injection layer in that order over the cathode 7023 leads to low power consumption and thus is more preferable.

Any of a variety of materials can be used for the anode 7025 which is formed over the EL layer 7024. Examples of the material include a material having a high work function such as a transparent conductive material such as ITO, IZO, and ZnO. In this embodiment, an ITO film containing a silicon oxide is used as the anode 7026.

The light-emitting element 7022 corresponds to a region where the EL layer 7024 is sandwiched between the cathode 7023 and the anode 7025. In the case of the element structure illustrated in FIG. 13B, light is emitted from the light-emitting element 7022 to both the anode 7025 side and the cathode 7023 side as indicated by arrows.

Note that in FIG. 13B, an example in which a light-transmitting conductive film is used as the gate electrode layer. Light emitted from the light-emitting element 7022 to the cathode 7023 side passes through the color filter layer 7043 and then passes through the gate electrode layer, the source electrode layer, and the like of the driver TFT 7021 so as to be emitted to the outside. By using a light-transmitting conductive film as the gate electrode layer, the source electrode layer, or the like of the driver TFT 7021, an aperture ratio on the anode 7025 side can be substantially the same as that on the cathode 7023 side.

The color filter layer 7043 is formed by: a droplet discharge method such as an ink-jet method; a printing method; an etching method using a photolithography technique; or the like.

The color filter layer 7043 is covered with an overcoat layer 7044 and the protective insulating layer 7045 is further formed thereover.

The contact hole formed in an oxide insulating layer 7041, an insulating layer 7042, and a protective insulating layer 7045 and reaching the connection electrode layer 7040 is in a position which overlaps with the partition 7029. Since a metal conductive film is used as the connection electrode layer 7040 in the example illustrated in FIG. 13B, an aperture ratio on the anode 7025 side can be substantially the same as that on the cathode 7023 side by employing a structure in which the contact hole reaching the connection electrode layer 7040, the partition 7029 and the connection electrode layer 7040 overlap with one another.

Note that in the case where full-color display is realized on both display surfaces by using a light-emitting element having a dual emission structure, light emitted from the anode 7025 side does not pass through the color filter layer 7043; therefore, it is preferable that a sealing substrate having a color filter layer be further provided over the anode 7025.

A light-emitting element having a top emission structure is described with reference to FIG. 13C.

Figure 13C:
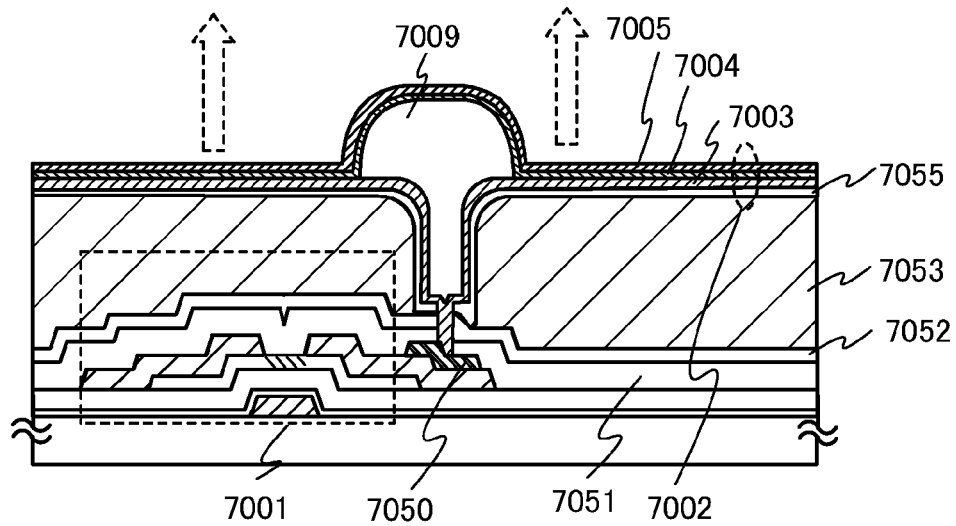

FIG. 13C is a cross-sectional view of a pixel in the case where the TFT 7001 which is a driver TFT is of an n-type and light is emitted from a light-emitting element 7002 to an anode 7005 side. In FIG. 13C, a cathode 7003 of the light-emitting element 7002 is electrically connected to the TFT 7001 via a connection electrode layer 7050, and an EL layer 7004 and the anode 7005 are stacked in that order over the cathode 7003.

Any of a variety of materials can be used for the cathode 7003. Specifically, the cathode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

Further, the periphery of the cathode 7003 is covered with a partition 7009. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening portion over the cathode 7003 so that a sidewall of the opening portion is formed as a tilted surface with continuous curvature. When the partition 7009 is formed using a photosensitive resin material, a step of forming a resist mask can be omitted.

The EL layer 7004 which is formed over the cathode 7003 and the partition 7009 may be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the cathode 7003. Note that it is not necessary to form all of these layers.

In addition, the present invention is not limited to the above order of the stacked layers; that is, the EL layer 7004 may be formed by stacking a hole-injection layer, a hole-transport layer, a light-emitting layer, an electron-transport layer, and an electron-injection layer in that order over the cathode 7003. Note that when the layers are stacked in this order, the cathode 7003 functions as an anode.

In FIG. 13C, over a stacked-layer film in which a Ti film, an aluminum film, a Ti film are stacked in that order, a hole-injection layer, a hole-transport layer, a light-emitting layer, an electron-transport layer, and an electron-injection layer are stacked in that order. Further, an alloy thin film of Mg:Ag and an ITO film are stacked thereover.

Note that when power consumption is contrasted, stacking an electron-injection layer, an electron-transport layer, a light-emitting layer, a hole-transport layer, and a hole-injection layer in that order over the cathode 7003 leads to low power consumption and thus is more preferable.

The anode 7005 is formed using a light-transmitting conductive material; for example, an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, an indium tin oxide to which a silicon oxide is added, or the like may be used.

The light-emitting element 7002 corresponds to a region where the EL layer 7004 is sandwiched between the cathode 7003 and the anode 7005. In the case of the element structure illustrated in FIG. 13C, light is emitted from the light-emitting element 7002 to the anode 7005 side as indicated by an arrow.

Although an example in which the thin film transistor 420 is used as the TFT 7001 is illustrated in FIG. 13C, the present invention is not particularly limited thereto.

In FIG. 13C, a drain electrode layer of the TFT 7001 is electrically connected to a connection electrode layer 7050. Further, the connection electrode layer is electrically connected to the cathode 7003. A planarizing insulating layer 7053 can be formed using a resin material such as polyimide, acrylic, benzocyclobutene, polyamide, or epoxy. Other than such resin materials, it is also possible to use a low-dielectric constant material (a low-k material), a siloxane-based resin, PSG (phosphosilicate glass), BPSG (borophosphosilicate glass), or the like. Note that the planarizing insulating layer 7053 may be formed by stacking a plurality of insulating films formed using these materials. There is no particular limitation on the method for forming the planarizing insulating layer 7053, and the planarizing insulating layer 7053 can be formed, depending on the material, by a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater.

A partition 7009 is provided in order to insulate the cathode 7003 from a cathode of an adjacent pixel. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening portion over the cathode 7003 so that a sidewall of the opening portion is formed as a tilted surface with continuous curvature. When the partition 7009 is formed using a photosensitive resin material, a step of forming a resist mask can be omitted.

In the structure illustrated in FIG. 13C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full-color display may be manufactured using four kinds of light-emitting element, which include white emissive light-emitting elements as well as three kinds of light-emitting elements.

In the structure illustrated in FIG. 13C, a light-emitting display device capable of full-color display may be manufactured in the following manner: all the light-emitting elements to be arranged are white emissive light-emitting elements; and a sealing substrate having a color filter is placed over the light-emitting element 7002. When a material which exhibits monochromatic light such as white light is formed and combined with color filters or color conversion layers, full-color display can be performed.

Needless to say, display of monochromatic light emission can also be performed. For example, a lighting device may be formed utilizing white light emission; alternatively, an area-color light-emitting device using monochromatic light emission may be formed.

Moreover, an optical film such as a polarizing film, one of examples of which is a circular polarizing plate, may be provided when needed.

Although the organic EL elements are described here as the light-emitting elements, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

One embodiment of the present invention can be applied to a liquid crystal display device when the light-emitting element and the partition are not provided. A case of a liquid crystal display device is described with reference to FIG. 45.

Figure 45:
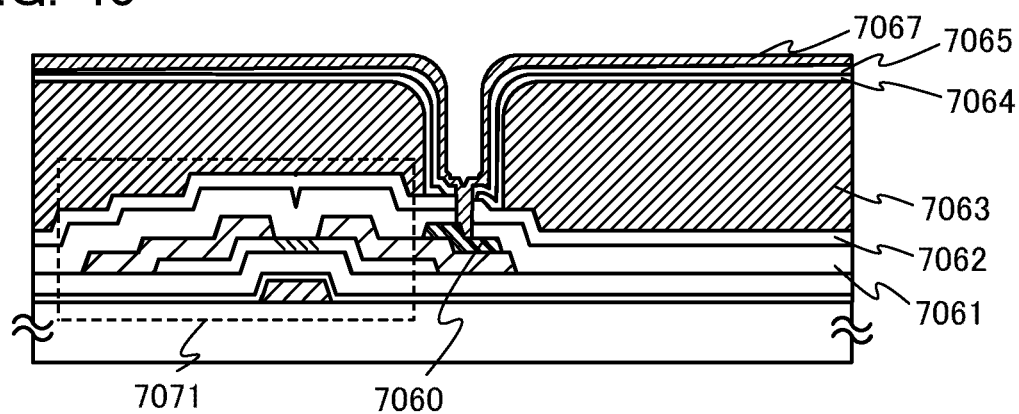
FIG. 45 illustrates a semiconductor device.

Here, a driver TFT 7071 is of an n-type. In FIG. 45, the driver TFT 7071 has a light-transmitting conductive film 7067 which is electrically connected thereto. The light-transmitting conductive film 7067 is electrically connected to a drain electrode layer of the driver TFT 7071 via a connection electrode layer 7060 through a contact hole which is formed in an oxide insulating layer 7061 and a protective insulating layer 7062.

The light-transmitting conductive film 7067 can be formed using a light-transmitting conductive material such as an indium oxide containing a tungsten oxide, an indium zinc oxide containing a tungsten oxide, an indium oxide containing a titanium oxide, an indium tin oxide containing a titanium oxide, an indium tin oxide (hereinafter referred to as ITO), an indium zinc oxide, an indium tin oxide to which a silicon oxide is added, or the like.

Note that in FIG. 45, an example in which a light-transmitting conductive film is used as a gate electrode layer. Light emitted from a back light or the like passes through the color filter layer 7063 so as to be emitted to the outside. Thus, by using a light-transmitting conductive film as the gate electrode layer, a source electrode layer, or the like of the driver TFT 7071, an increased aperture ratio can be obtained.

The color filter layer 7063 is formed by: a droplet discharge method such as an ink-jet method; a printing method; an etching method using a photolithography technique; or the like.

The color filter layer 7063 is covered with an overcoat layer 7064 and a protective insulating layer 7065 is further formed thereover. Note that although the overcoat layer 7064 is illustrated to have a small thickness in FIG. 45, the overcoat layer 7064 has a function of reducing unevenness caused by the color filter layer 7063.

As described above, one embodiment of the present invention can also be applied to a liquid crystal display device.

Note that the structure of the semiconductor device is not limited to those illustrated in FIG. 12, FIGS. 13A to 13C, and FIG. 45 and can be modified in various ways based on techniques disclosed in this specification.

Figure 11A:
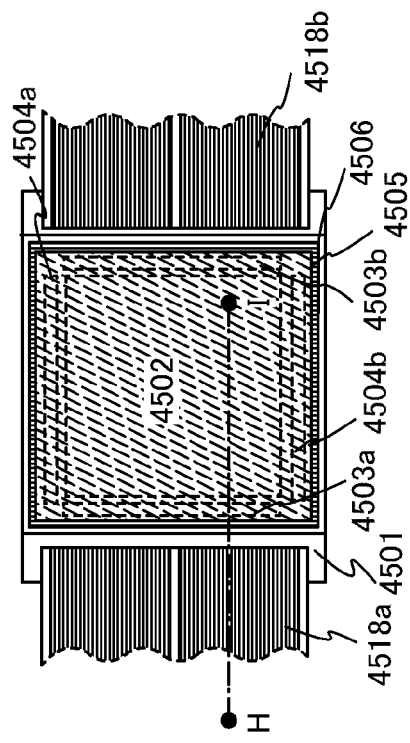
FIGS. 11A and 11B illustrate a semiconductor device.
Figure 11B:
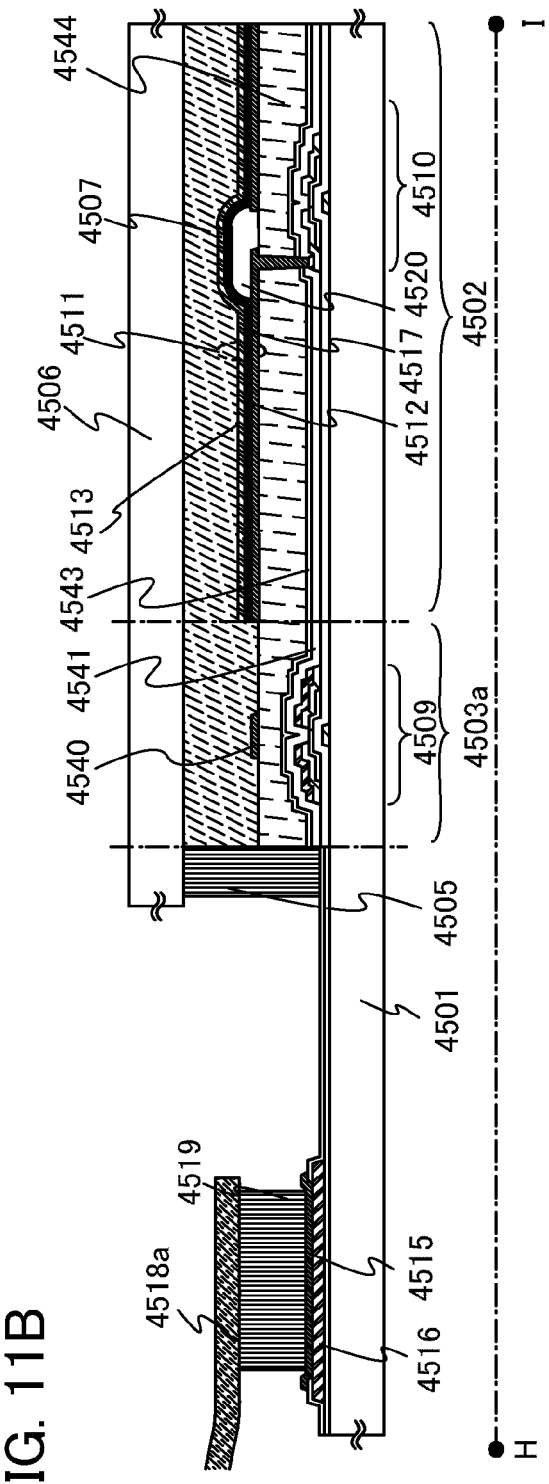

Next, the appearance and cross section of a light-emitting display panel (also referred to as a light-emitting panel) which corresponds to one mode of a semiconductor device are described with reference to FIGS. 11A and 11B. FIG. 11A is a plan view of a panel in which a thin film transistor and a light-emitting element formed over a first substrate are sealed between the first substrate and a second substrate with a sealant. FIG. 11B is a cross-sectional view taken along line H-I in FIG. 11A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 11B.

For the thin film transistors 4509 and 4510, the highly reliable thin film transistors including the oxide semiconductor layer which are described in any of Embodiments 1 to 5 can be employed. Any of the thin film transistors 410, 460, 449, and 492 which are described in the aforementioned embodiments can be used as the thin film transistor 4509 for the driver circuit. Any of the thin film transistors 420, 450, 470, and 493 can be used as the thin film transistor 4510 for the pixel. In this embodiment, the thin film transistors 4509 and 4510 are n-channel thin film transistors.

Over an insulating layer 4544, a conductive layer 4540 is provided in a position which overlaps with a channel formation region of the oxide semiconductor layer included in the thin film transistor 4509 for the driver circuit. By providing the conductive layer 4540 in the position which overlaps with the channel formation region of the oxide semiconductor layer, the amount of change in the threshold voltage of the thin film transistor 4509 between before and after the BT test can be reduced. The conductive layer 4540 may have the same electric potential as a gate electrode layer of the thin film transistor 4509 or have an electric potential different from that of the gate electrode layer of the thin film transistor 4509 and can function as a second gate electrode layer. The electric potential of the conductive layer 4540 may be a GND electric potential, 0 V, or the conductive layer 4540 may be in a floating state.

In the thin film transistor 4509, the insulating layer 4541 is formed as a protective insulating film so as to be in contact with the oxide semiconductor layer including a channel formation region. The insulating layer 4541 may be formed using a material and a method similar to those of the oxide insulating film 416 described in Embodiment 1. In addition, in order to reduce the surface roughness of the thin film transistors, the thin film transistors are covered with the insulating layer 4544 functioning as a planarizing insulating film. Here, as the insulating layer 4541, a silicon oxide film is formed by a sputtering method according to Embodiment 1.

Further, a protective insulating layer 4543 is formed over the insulating layer 4541. The protective insulating layer 4543 may be formed using a material and a method similar to those of the protective insulating layer 403 described in Embodiment 1. Here, a silicon nitride film is formed by a PCVD method as the protective insulating layer 4543.

The insulating layer 4544 is formed as the planarizing insulating film. The insulating layer 4544 may be formed using a material and a method similar to those of the planarizing insulating layer 404 described in Embodiment 1. Here, acrylic is used for the insulating layer 4544.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is, but not limited to, the stacked structure which includes the first electrode layer 4517, an electroluminescent layer 4512, and a second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening portion over the first electrode layer 4517 so that a sidewall of the opening portion is formed as a tilted surface with continuous curvature.

The electroluminescent layer 4512 may be formed using a single layer or a plurality of layers stacked.

A protective film may be formed over the second electrode layer 4513 and the partition 4520 in order to prevent entry of oxygen, hydrogen, moisture, carbon dioxide, and the like into the light-emitting element 4511. As the protective film, a silicon nitride film, a silicon nitride oxide film, a DLC film, or the like can be formed.

In addition, a variety of signals and electric potentials are supplied to the signal line driver circuits 4503a and 4503b, the scan line driver circuits 4504*a* and 4504*b*, or the pixel portion 4502 from FPCs 4518*a* and 4518*b*.

A connection terminal electrode 4515 is formed using the same conductive film as the first electrode layer 4517 included in the light-emitting element 4511, and a terminal electrode 4516 is formed using the same conductive film as the source and drain electrode layers included in the thin film transistors 4509 and 4510.

The connection terminal electrode 4515 is electrically connected to a terminal included in the FPC 4518*a* via an anisotropic conductive film 4519.

As the second substrate 4506 located in the direction in which light is extracted from the light-emitting element 4511 needs to have light-transmitting properties. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, polyvinyl chloride (PVC), acrylic, polyimide, an epoxy resin, a silicone resin, polyvinyl butyral (PVB), or ethylene vinyl acetate (EVA) can be used. For example, nitrogen may be used for the filler 4507.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Driver circuits formed using a single crystal semiconductor film or a polycrystalline semiconductor film over a substrate separately prepared may be mounted as the signal line driver circuits 4503*a* and 4503*b* and the scan line driver circuits 4504*a* and 4504*b*. Alternatively, only the signal line driver circuits or part thereof, or only the scan line driver circuits or part thereof may be separately formed and mounted. This embodiment is not limited to the structure illustrated in FIGS. 11A and 11B.

Through the above process, a highly reliable light-emitting display device (display panel) as a semiconductor device can be manufactured.

This embodiment can be implemented in appropriate combination with the structures described in the other embodiments.

(Embodiment 13)

A semiconductor device disclosed in this specification can be applied to electronic paper. Electronic paper can be used for electronic devices in all fields as long as they display data. For example, electronic paper can be applied to an e-book reader (an electronic book), a poster, an advertisement in a vehicle such as a train, or displays of a variety of cards such as a credit card. FIG. 20 illustrates an example of the electronic devices.

FIG. 20 illustrates an example of e-book reader. For example, an e-book reader 2700 includes two housings of a housing 2701 and a housing 2703. The housing 2701 and the housing 2703 are combined with a hinge 2711 so that the e-book reader 2700 can be opened and closed with the hinge 2711 as an axis. Such a structure allows the e-book reader 2700 to operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, operation keys 2723, a speaker 2725, and the like. Pages can be turned with the operation keys 2723. Note that a keyboard, a pointing device, and the like may be provided on the same surface as the display portion of the housing. Moreover, an external connection terminal (e.g., an earphone terminal, a USB terminal, or a terminal connectable to a variety of cables such as an AC adapter and a USB cable), a recording medium insertion portion, and the like may be provided on the back surface or the side surface of the housing. Moreover, the e-book reader 2700 may have a function of an electronic dictionary.

The e-book reader 2700 may be configured to wirelessly transmit and receive data. Through wireless communication, desired book data or the like can be purchased and downloaded from an electronic book server.

(Embodiment 14)

A semiconductor device disclosed in this specification can be applied to a variety of electronic devices (including game machines). Examples of such electronic devices include a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pinball machine, and the like.

Figure 21A:
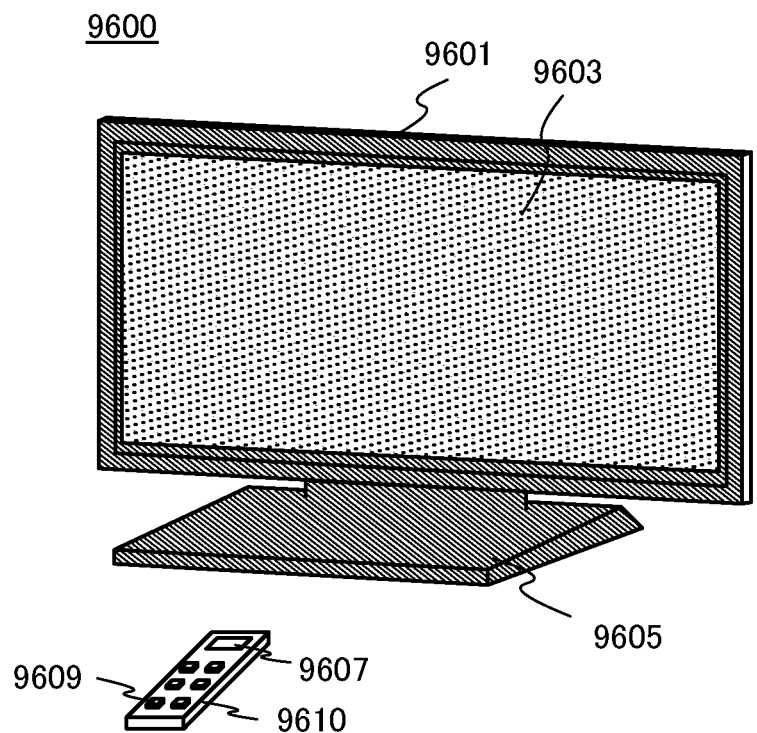
FIGS. 21A and 21B are external views illustrating examples of television device and digital photo frame, respectively.

FIG. 21A illustrates an example of television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610, whereby an image displayed on the display portion 9603 can be controlled. Moreover, the remote controller 9610 may be provided with a display portion 9607 for displaying data outputted from the remote controller 9610.

Note that the television set 9600 is provided with a receiver, a modem, and the like. Moreover, when the display device is connected to a communication network with or without wires via the modem, one-way (from a sender to a receiver) or two-way (between a sender and a receiver or between receivers) information communication can be performed.

Figure 21B:
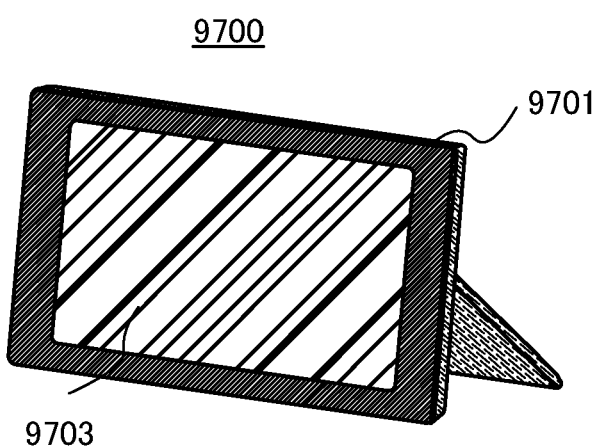

FIG. 21B illustrates an example of digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (a USB terminal or a terminal connectable to a variety of cables such as a USB cable), a recording medium insertion portion, and the like. Although these components may be provided on the same surface as the display portion, it is preferable to provide them on the side surface or the back surface for design aesthetics. For example, a memory storing data of an image taken with a digital camera is inserted in the recording medium insertion portion of the digital photo frame 9700 and the data is loaded, whereby the image can be displayed on the display portion 9703.

The digital photo frame 9700 may be configured to transmit and receive data wirelessly. Through wireless communication, desired image data can be loaded to be displayed.

Figure 22A:
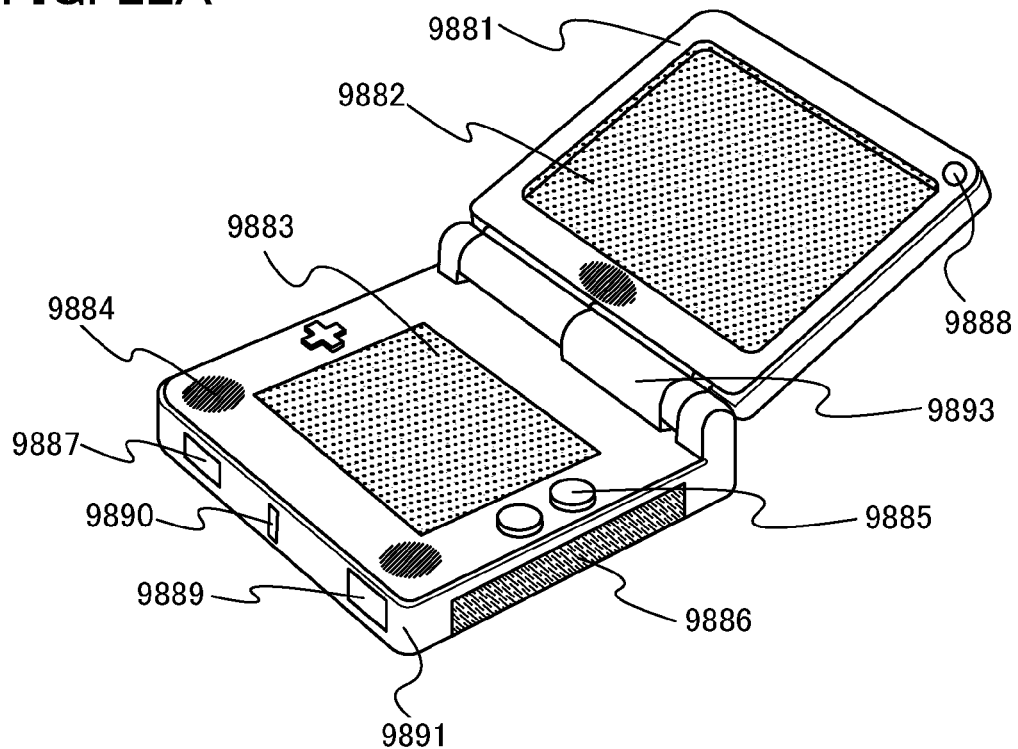
FIGS. 22A and 22B are external views each illustrating an example of game machine.

FIG. 22A is a portable game machine and is constituted by two housings of a housing 9881 and a housing 9891 which are connected to each other with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device disclosed in this specification can be employed. The portable game machine may include other accessory equipment as appropriate. The portable game machine illustrated in FIG. 22A has a function of reading a program or data stored in the recording medium to display it on the display portion, and a function of sharing data with another portable game machine by wireless communication. Note that a function of the portable game machine illustrated in FIG. 22A is not limited to those described above, and the portable game machine can have a variety of functions.

Figure 22B:
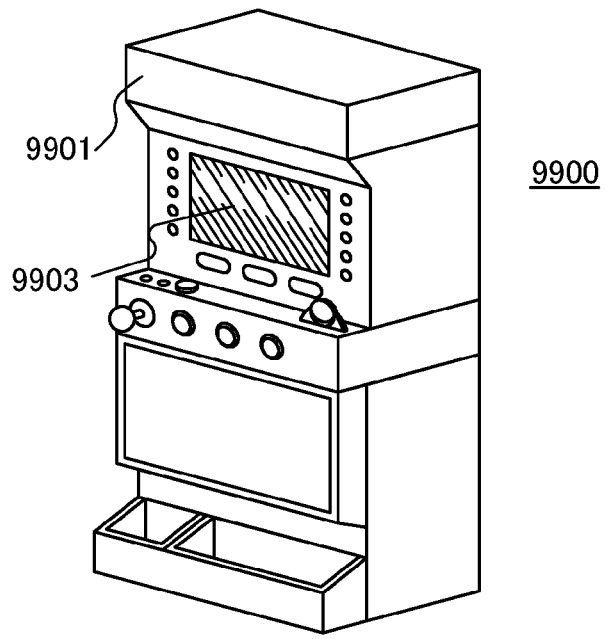

FIG. 22B illustrates an example of slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. Needless to say, the structure of the slot machine 9900 is not limited to the above and other structures provided with at least a semiconductor device disclosed in this specification may be employed. The slot machine 9900 may include an additional accessory as appropriate.

Figure 23A:
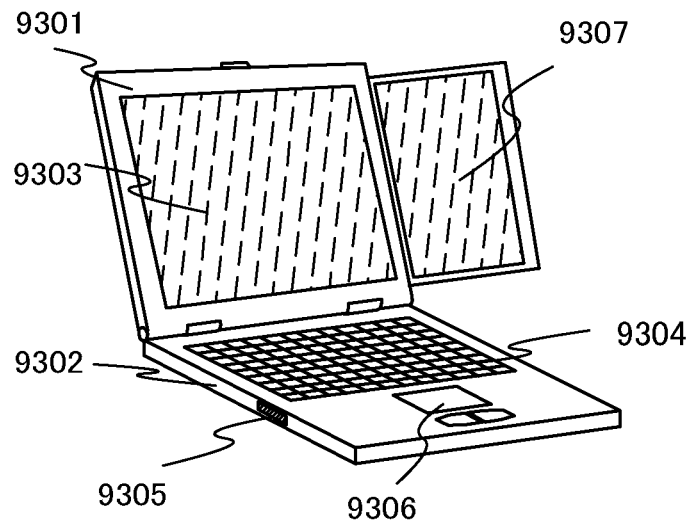
FIGS. 23A and 23B are external views illustrating examples of portable computer and mobile phone, respectively.

FIG. 23A is a perspective view illustrating an example of portable computer.

In the portable computer illustrated in FIG. 23A, a top housing 9301 having a display portion 9303 and a bottom housing 9302 having a keyboard 9304 can overlap with each other by closing a hinge unit which connects the top housing 9301 and the bottom housing 9302. Thus, the portable computer is conveniently carried. Moreover, in the case of using the keyboard for input of data, the hinge unit is opened so that a user can input data looking at the display portion 9303.

The bottom housing 9302 includes a pointing device 9306 with which input can be performed, in addition to the keyboard 9304. When the display portion 9303 is a touch panel, a user can input data by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 further includes a display portion 9307 which can be stowed in the top housing 9301 by being slid therein. With the display portion 9307, a large display screen can be realized. In addition, the user can adjust the angle of a screen of the stowable display portion 9307. If the stowable display portion 9307 is a touch panel, the user can input data by touching part of the display portion 9307.

The display portion 9303 or the stowable display portion 9307 is formed using an image display device such as a liquid crystal display panel or a light-emitting display panel using an organic light-emitting element, an inorganic light-emitting element, or the like.

In addition, the portable computer illustrated in FIG. 23A can be provided with a receiver and the like and can receive a TV broadcast to display an image on the display portion 9303 or the display portion 9307. The user can watch a TV broadcast with the whole screen of the display portion 9307 by sliding and exposing the display portion 9307 and adjusting the angle thereof, with the hinge unit which connects the top housing 9301 and the bottom housing 9302 closed. In this case, the hinge unit is not opened and display is not performed on the display portion 9303. In addition, start up of only a circuit for displaying a TV broadcast is performed. Thus, power consumption can be minimized, which is useful for the portable computer whose battery capacity is limited.

Figure 23B:
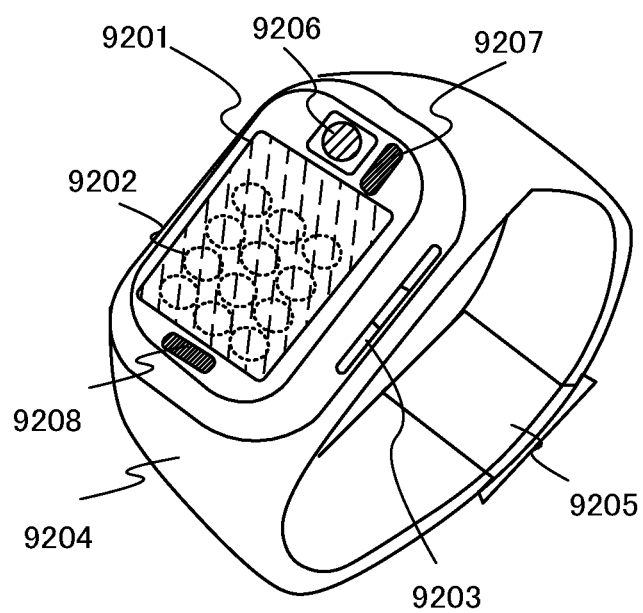

FIG. 23B is a perspective view of an example of mobile phone that the user can wear on the wrist like a wristwatch.

This mobile phone is formed with a main body which includes a communication device including at least a telephone function, and a battery; a band portion 9204 which enables the main body to be worn on the wrist; an adjusting portion 9205 for adjusting the band portion 9204 to fit the wrist; a display portion 9201; a speaker 9207; and a microphone 9208.

In addition, the main body includes operation switches 9203. The operation switches 9203 can serve, for example, as a button for starting a program for the Internet when pushed, as well as a power switch, a switch for switching displays, a switch for instruction to start taking images, or the like, and can be configured to have respective functions.

A user can input data into this mobile phone by touching the display portion 9201 with a finger or an input pen, operating the operation switches 9203, or inputting voice into the microphone 9208. In FIG. 23B, display buttons 9202 are displayed on the display portion 9201. The user can input data by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 23B is provided with a receiver of a TV broadcast and the like, and can display an image on the display portion 9201 by receiving the TV broadcast. In addition, the mobile phone is provided with a memory device such as a memory, and the like, and can record the TV broadcast in the memory. The mobile phone illustrated in FIG. 23B may have a function of collecting location information such as GPS.

An image display device such as a liquid crystal display panel or a light-emitting display panel using an organic light-emitting element, an inorganic light-emitting element, or the like is used as the display portion 9201. The mobile phone illustrated in FIG. 23B is compact and lightweight and the battery capacity is limited. For the above reason, a panel which can be driven with low power consumption is preferably used as a display device for the display portion 9201.

Note that although FIG. 23B illustrates the electronic device which is worn on the wrist, this embodiment is not limited thereto as long as an electronic is portable.

(Embodiment 15)

In this embodiment, as one mode of a semiconductor device, examples of display devices each including the thin film transistor described in any of Embodiments 1 to 5 will be described with reference to FIGS. 24 to 37. In this embodiment, examples of liquid crystal display devices in each of which a liquid crystal element is used as a display element will be described with reference to FIGS. 24 to 37. The thin film transistor described in any of Embodiments 1 to 5 can be used as each of TFTs 628 and 629. The TFTs 628 and 629 can be manufactured through a process similar to that described in any of Embodiments 1 to 5 and have excellent electrical characteristics and high reliability. In FIGS. 24 to 37, a case where the thin film transistor illustrated in FIG. 4C is used as an example of thin film transistor will be described; however, the present invention is not limited thereto.

First, a vertical alignment (VA) liquid crystal display device is described. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions.

Figure 24:
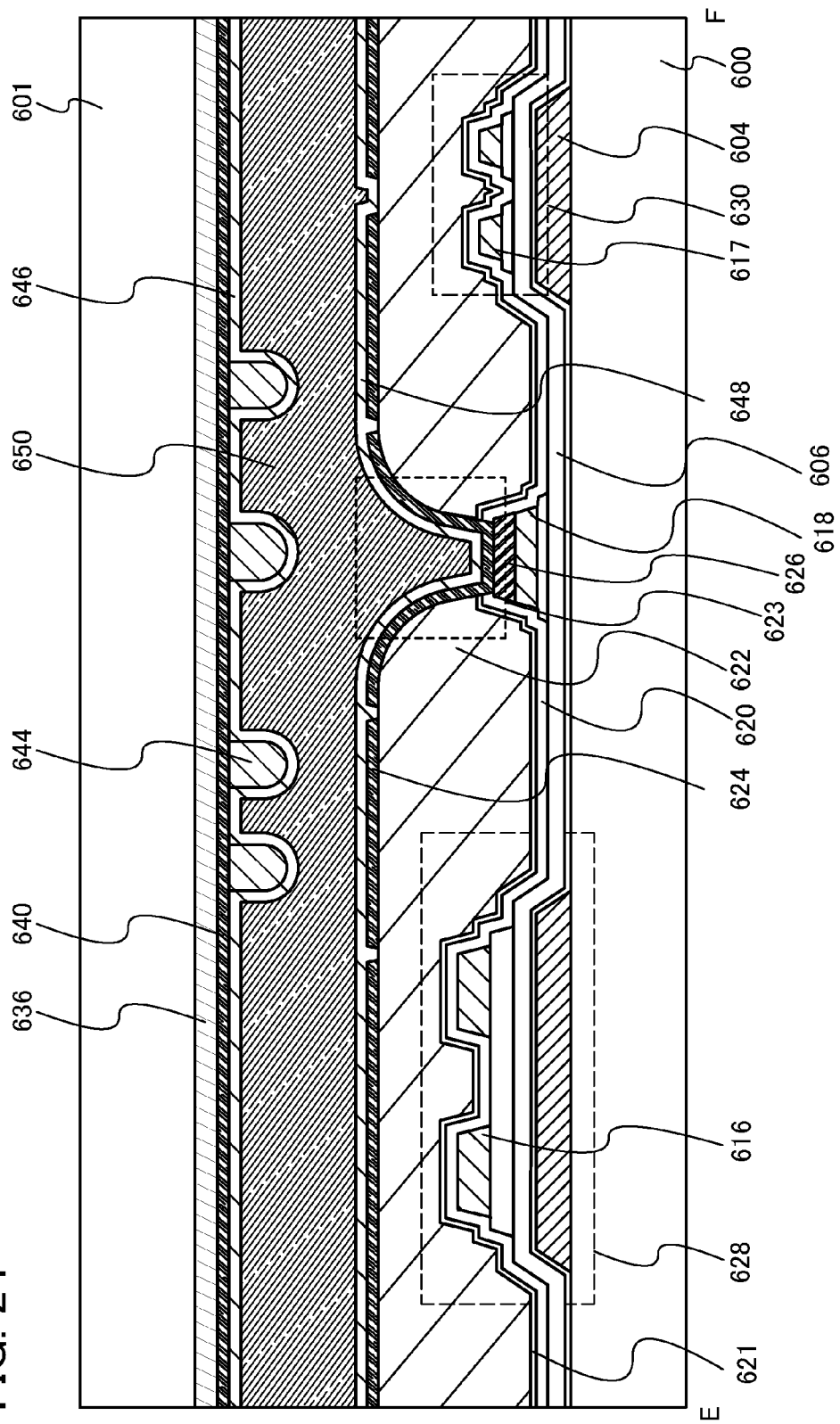
FIG. 24 illustrates a semiconductor device.
Figure 25:
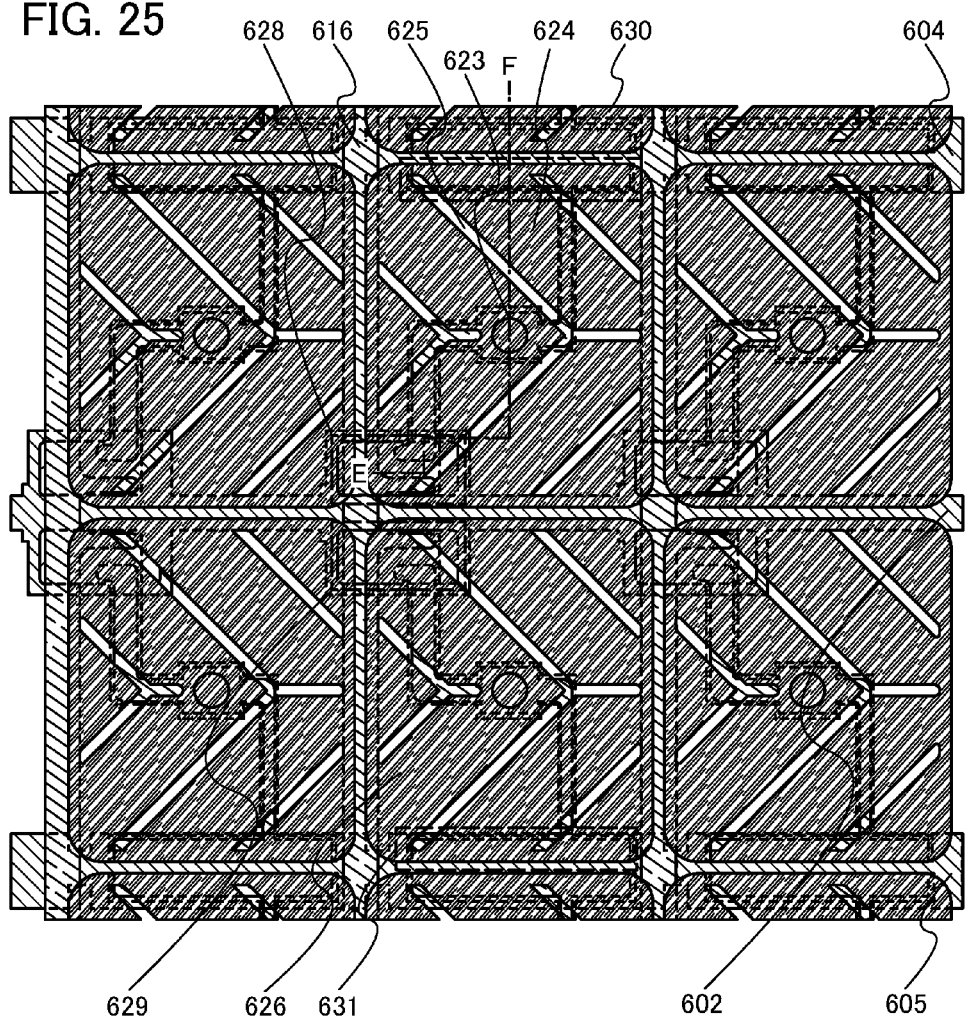
FIG. 25 illustrates a semiconductor device.
Figure 26:
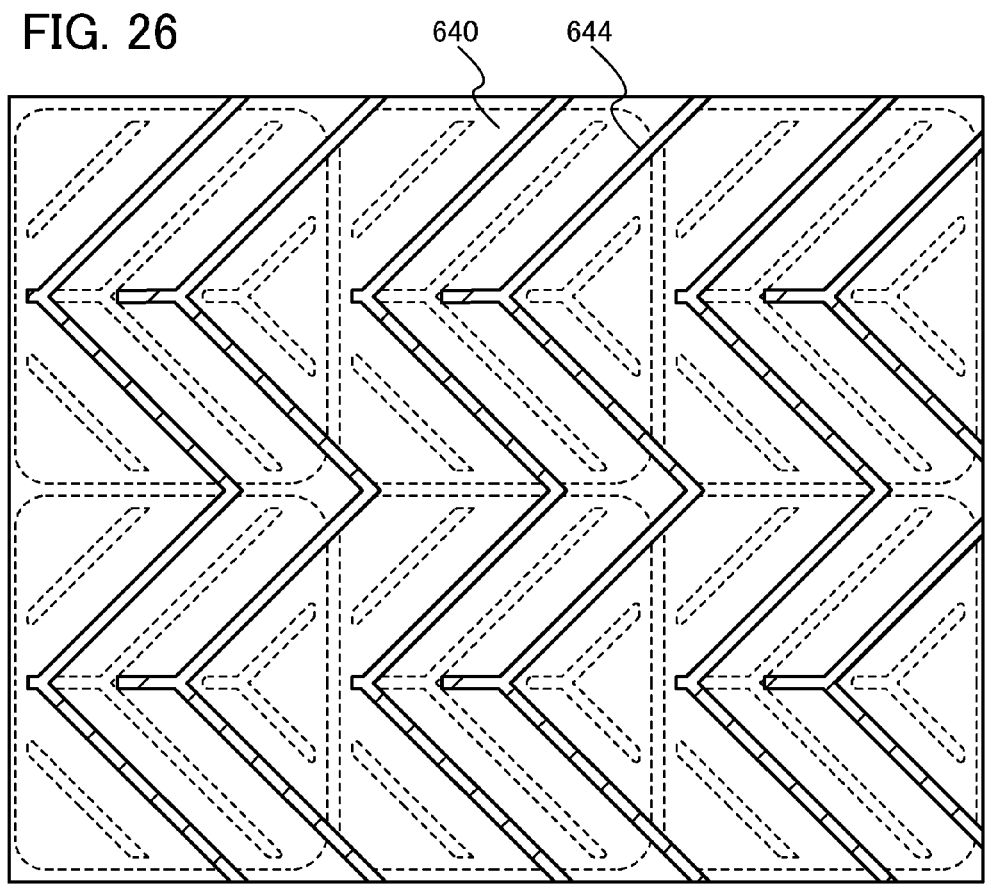
FIG. 26 illustrates a semiconductor device.

FIG. 25 and FIG. 26 illustrate a pixel electrode and a counter electrode, respectively. FIG. 25 is a plan view showing the substrate side where the pixel electrode is formed. FIG. 24 illustrates a cross-sectional structure taken along section line E-F in FIG. 25. FIG. 26 is a plan view showing the substrate side where the counter electrode is formed. Description below is made with reference to those drawings.

In FIG. 24, a substrate 600 over which a TFT 628, a pixel electrode layer 624 connected to the TFT 628, and a storage capacitor portion 630 are formed and a counter substrate 601 provided with a counter electrode layer 640 and the like overlap with each other, and liquid crystals are injected between the substrate 600 and the counter substrate 601.

The counter substrate 601 is provided with a coloring film 636 and the counter electrode layer 640, and protrusions 644 are formed on the counter electrode layer 640. An alignment film 648 is formed over the pixel electrode layer 624, and an alignment film 646 is similarly formed on the counter electrode layer 640 and the protrusions 644. A liquid crystal layer 650 is formed between the substrate 600 and the counter substrate 601.

The TFT 628, the pixel electrode layer 624 connected to the TFT 628, and the storage capacitor portion 630 are formed over the substrate 600. The pixel electrode layer 624 is connected to a wiring 618 through a contact hole 623 which penetrates an insulating film 620 for covering the TFT 628, a wiring 616, and the storage capacitor portion 630, an insulating film 621 for covering the insulating film 620, and an insulating film 622 for covering the insulating film 621. The thin film transistor described in any of Embodiments 1 to 5 can be used as the TFT 628 as appropriate. Further, the storage capacitor portion 630 includes a capacitor wiring 604 that is a first capacitor wiring, which is formed at the same time as a gate wiring 602 of the TFT 628; a first gate insulating film 606a; a second gate insulating film 606b; and a capacitor wiring 617 that is a second capacitor wiring, which is formed at the same time as the wirings 616 and 618.

The pixel electrode layer 624, the liquid crystal layer 650, and the counter electrode layer 640 overlap with each other, whereby a liquid crystal element is formed.

FIG. 25 illustrates a planar structure on the substrate 600. The pixel electrode layer 624 is formed using the material described in any of Embodiments 1 to 5. The pixel electrode layer 624 is provided with slits 625. The slits 625 are provided for controlling the alignment of the liquid crystals.

A TFT 629, a pixel electrode layer 626 connected to the TFT 629, and a storage capacitor portion 631 which are illustrated in FIG. 25 can be formed in a similar manner to the TFT 628, the pixel electrode layer 624, and the storage capacitor portion 630, respectively. Both the TFTs 628 and 629 are connected to the wiring 616. One pixel of this liquid crystal display panel includes the pixel electrode layers 624 and 626. The pixel electrode layers 624 and 626 constitute subpixels.

FIG. 26 illustrates a planar structure of the counter substrate side. The counter electrode layer 640 is preferably formed using a material similar to that of the pixel electrode layer 624. The protrusions 644 which control the alignment of the liquid crystals are formed on the counter electrode layer 640. Note that in FIG. 26, the pixel electrode layers 624 and 626 formed over the substrate 600 are represented by dashed lines, and the counter electrode layer 640 and the pixel electrode layers 624 and 626 overlap with each other.

Figure 27:
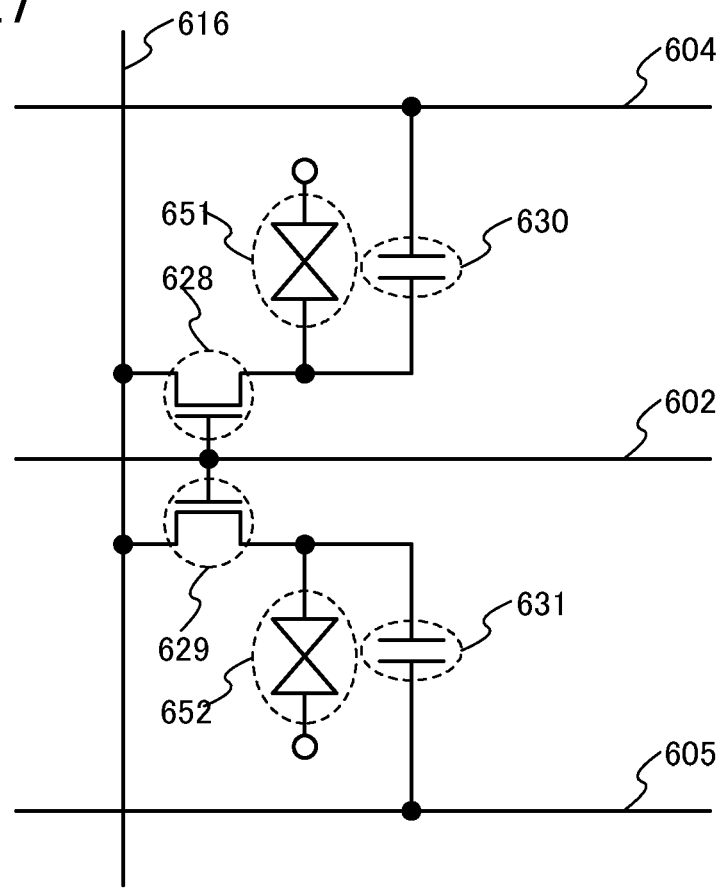
FIG. 27 illustrates a semiconductor device.

FIG. 27 illustrates an equivalent circuit of this pixel structure. Both the TFTs 628 and 629 are connected to the gate wiring 602 and the wiring 616. In that case, when electric potentials of the capacitor wiring 604 and a capacitor wiring 605 are different from each other, operations of liquid crystal elements 651 and 652 can vary. In other words, the alignment of the liquid crystals is precisely controlled and a viewing angle is increased by separate control of the electric potentials of the capacitor wirings 604 and 605.

When a voltage is applied to the pixel electrode layer 624 provided with the slits 625, a distorted electric field (an oblique electric field) is generated in the vicinity of the slits 625. The protrusions 644 on the counter substrate 601 side and the slits 625 are alternately arranged so that the oblique electric field is effectively generated to control the alignment of the liquid crystals, whereby the direction of the alignment of the liquid crystals varies depending on the location. In other words, a viewing angle of the liquid crystal display panel is increased by multi-domain.

Next, a VA liquid crystal display device, which is different from the above-described device, will be described with reference to FIGS. 28 to 31.

Figure 28:
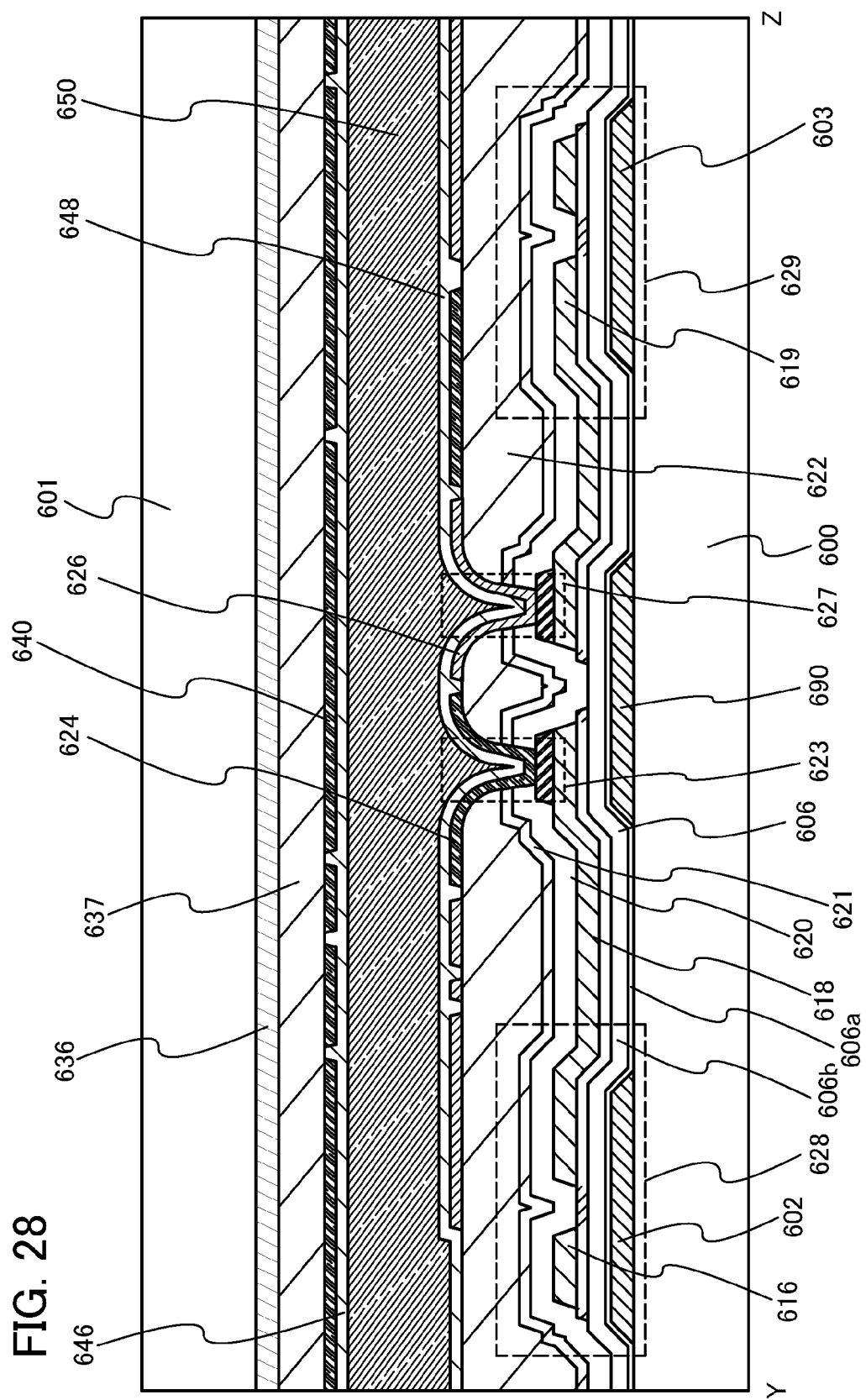
FIG. 28 illustrates a semiconductor device.
Figure 29:
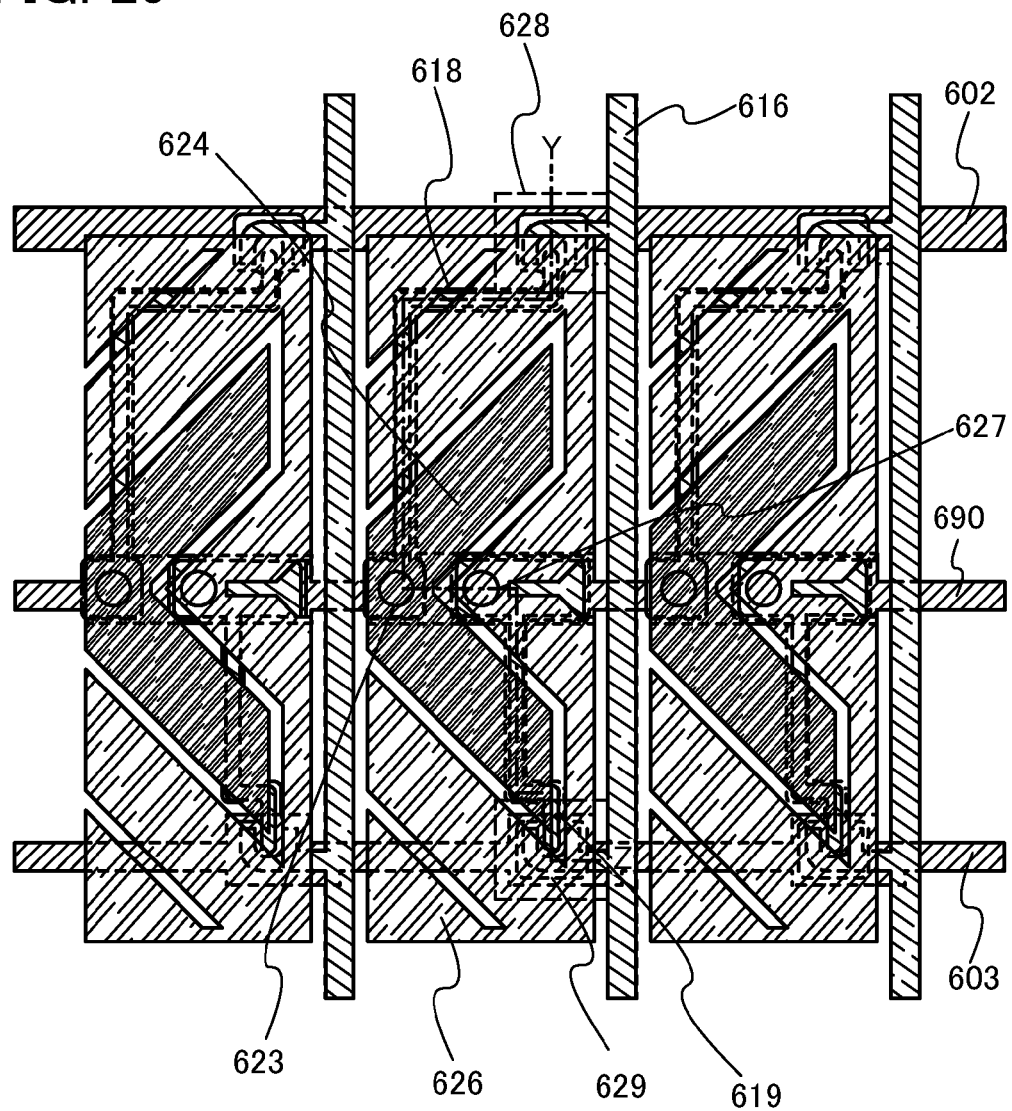
FIG. 29 illustrates a semiconductor device.

FIG. 28 and FIG. 29 illustrate a pixel structure of a VA liquid crystal display panel. FIG. 29 is a plan view of the substrate 600. FIG. 28 illustrates a cross-sectional structure taken along section line Y-Z in FIG. 29.

In this pixel structure, a plurality of pixel electrodes are provided in one pixel, and a TFT is connected to each of the pixel electrodes. The plurality of TFTs are driven by different gate signals. In other words, signals applied to individual pixel electrodes in a multi-domain pixel are controlled independently of each other.

The pixel electrode layer 624 is connected to the TFT 628 through the wiring 618 through the contact hole 623 penetrating insulating films 620, 621, and 622. The pixel electrode layer 626 is connected to a TFT 629 through a wiring 619 through a contact hole 627 penetrating the insulating films 620, 621, and 622. The gate wiring 602 of the TFT 628 is separated from a gate wiring 603 of the TFT 629 so that different gate signals can be supplied. On the other hand, the wiring 616 serving as a data line is shared by the TFTs 628 and 629. The thin film transistor described in any of Embodiments 1 to 5 can be used as appropriate as each of the TFTs 628 and 629. Note that the first gate insulating film 606*a* and the second gate insulating film 606*b* are formed over the gate wiring 602, the gate wiring 603, and a capacitor wiring 690.

Figure 31:
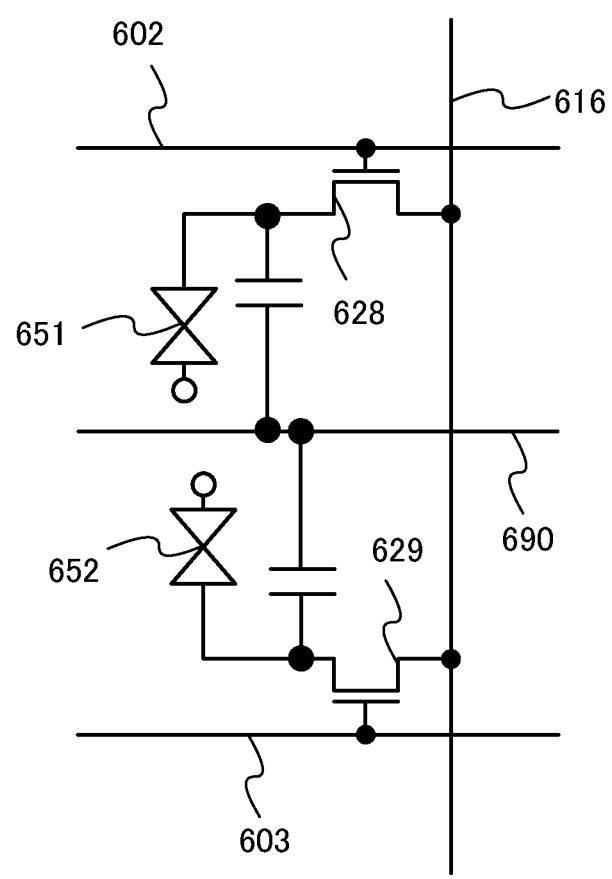
FIG. 31 illustrates a semiconductor device.

The shape of the pixel electrode layer 624 is different from that of the pixel electrode layer 626, and the pixel electrode layers 624 and 626 are separated by slits 625. The pixel electrode layer 626 is formed so as to surround the external side of the pixel electrode layer 624 which spreads into a V shape. A voltage applied to the pixel electrode layer 624 by a TFT 628 is made to be different from a voltage applied to the pixel electrode layer 626 by a TFT 629, whereby alignment of liquid crystals is controlled. FIG. 31 illustrates an equivalent circuit of this pixel structure. The TFT 628 is connected to the gate wiring 602, and the TFT 629 is connected to the gate wiring 603. Both the TFTs 628 and 629 are connected to the wiring 616. When different gate signals are supplied to the gate wirings 602 and 603, operations of liquid crystal elements 651 and 652 can vary. In other words, the operations of the TFTs 628 and 629 are controlled separately to precisely control the alignment of the liquid crystals in the liquid crystal elements 651 and 652, which leads to a wider viewing angle.

Figure 30:
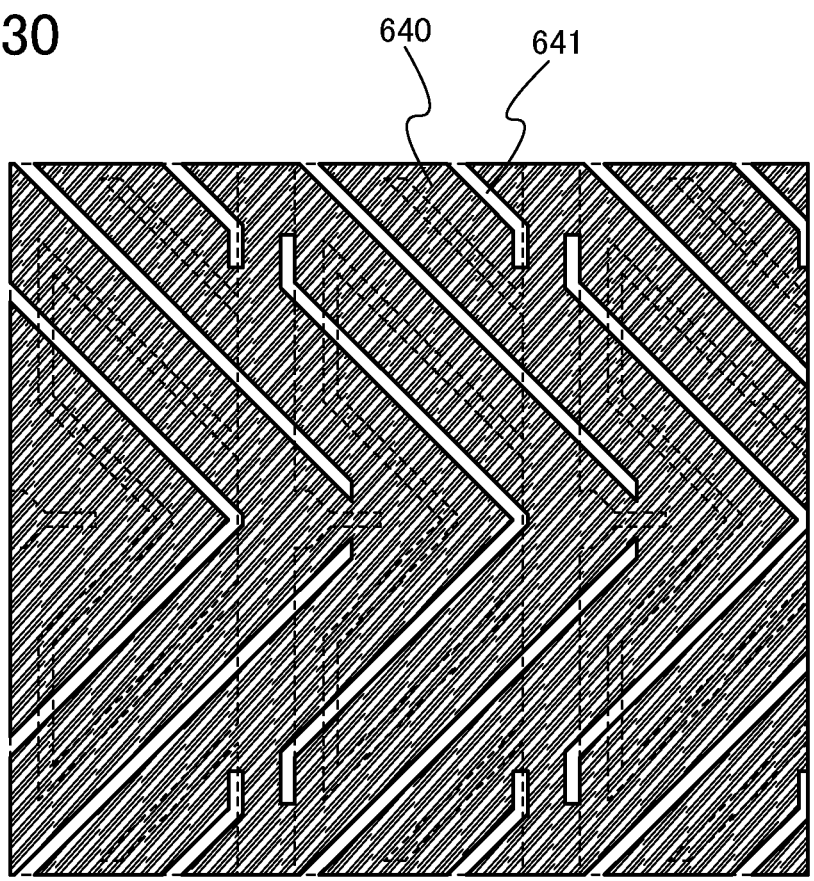
FIG. 30 illustrates a semiconductor device.

The counter substrate 601 is provided with the coloring film 636 and the counter electrode layer 640. A planarization film 637 is formed between the coloring film 636 and the counter electrode layer 640 to prevent alignment disorder of the liquid crystals. FIG. 30 illustrates a planar structure of the counter substrate side. The counter electrode layer 640 is an electrode shared by different pixels and slits 641 are formed. The slits 641 and the slits 625 on the pixel electrode layer 624 and 626 sides are alternately arranged so that an oblique electric field is effectively generated, whereby the alignment of the liquid crystals can be controlled. Accordingly, the alignment of the liquid crystals can vary in different locations, which leads to a wider viewing angle. Note that in FIG. 30, the pixel electrode layers 624 and 626 formed over the substrate 600 are represented by dashed lines and the counter electrode layer 640 and the pixel electrode layers 624 and 626 overlap with each other.

The alignment film 648 is formed over the pixel electrode layer 624 and the pixel electrode layer 626, and the counter electrode layer 640 is similarly provided with the alignment film 646. The liquid crystal layer 650 is formed between the substrate 600 and the counter substrate 601. The pixel electrode layer 624, the liquid crystal layer 650, and the counter electrode layer 640 overlap with each other to form a first liquid crystal element. The pixel electrode layer 626, the liquid crystal layer 650, and the counter electrode layer 640 overlap with each other to form a second liquid crystal element. The pixel structure of the display panel illustrated in FIGS. 30 to 33, and FIG. 31 is a multi-domain structure in which the first liquid crystal element and the second liquid crystal element are provided in one pixel.

Next, a liquid crystal display device in a horizontal electric field mode is described. In the horizontal electric field mode, an electric field is applied in a horizontal direction with respect to liquid crystal molecules in a cell, whereby liquid crystals are driven to express a gray scale. This method allows a viewing angle to be increased to about 180°. A liquid crystal display device in the horizontal electric field mode is described below.

Figure 32:
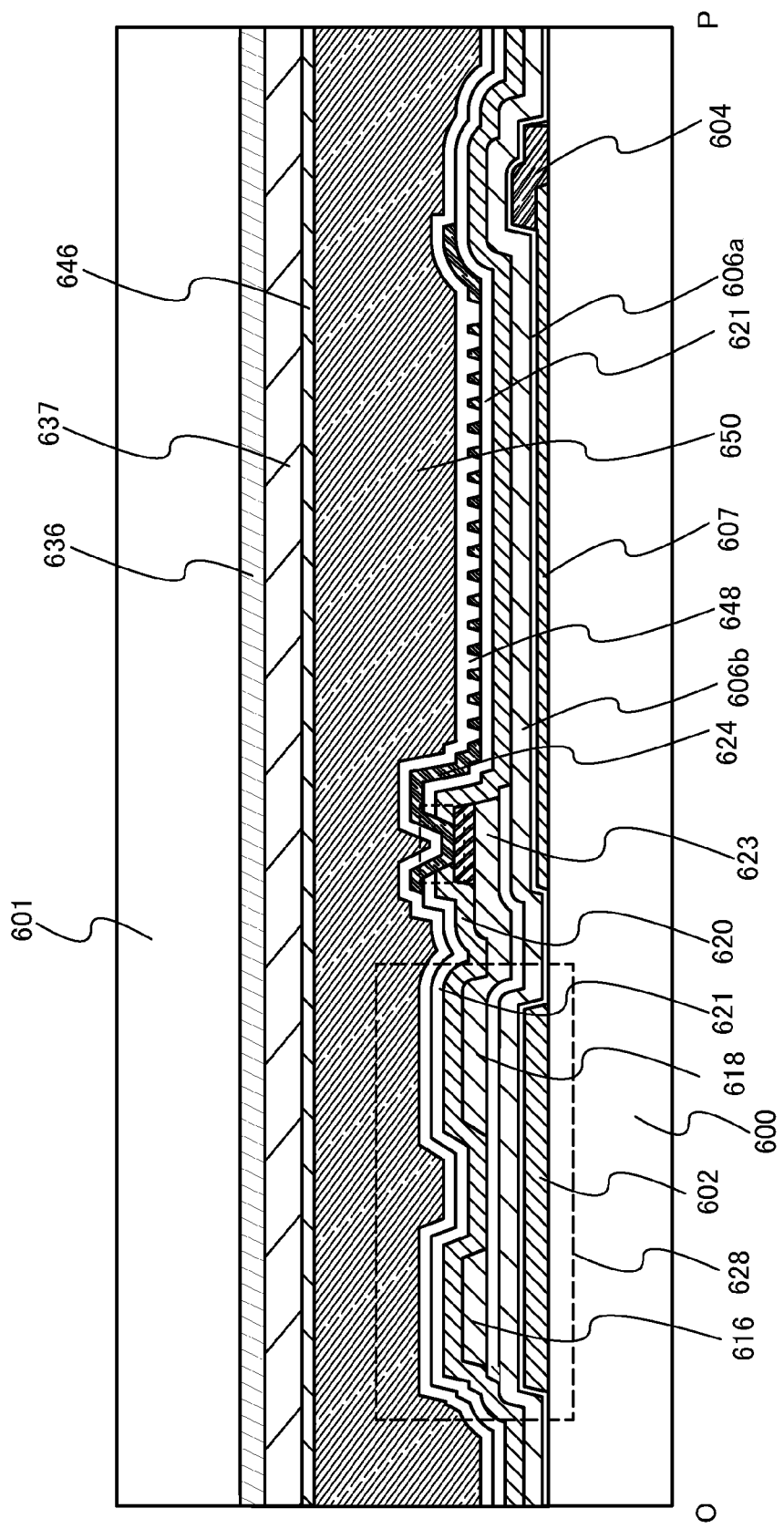
FIG. 32 illustrates a semiconductor device.

In FIG. 32, the substrate 600 over which an electrode layer 607, the TFT 628, and the pixel electrode layer 624 connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that a counter electrode is not provided on the counter substrate 601 side. In addition, the liquid crystal layer 650 is formed between the substrate 600 and the counter substrate 601 with the alignment films 646 and 648 interposed therebetween.

The electrode layer 607 and the capacitor wiring 604 connected to the electrode layer 607, and the TFT 628 are formed over the substrate 600. The capacitor wiring 604 can be formed at the same time as the gate wiring 602 of the TFT 628. The thin film transistor described in any of Embodiments 1 to 5 can be used as the TFT 628. The capacitor wiring 604 can be formed using the same material as the pixel electrode layer 427 described in Embodiments 1 to 5. In addition, the electrode layer 607 is divided almost in a pixel form. Note that the first gate insulating film 606*a* and the second insulating film 606*b* are formed over the electrode layer 607 and the capacitor wiring 604.

The wirings 616 and 618 of the TFT 628 are formed over the first gate insulating film 606*a* and the second gate insulating film 606*b*. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

The insulating film 620 is formed over the wirings 616 and 618, and the insulating film 621 is formed over the insulating film 620. Over the insulating film 621, the pixel electrode layer 624 is formed to be connected to the wiring 618 through a contact hole formed in the insulating films 620 and 621. The pixel electrode layer 624 is formed using a material similar to that of the pixel electrode layer described in any of Embodiments 1 to 5.

In such a manner, the TFT 628 and the pixel electrode layer 624 connected to the TFT 628 are formed over the substrate 600. Note that a storage capacitor is formed with the electrode layer 607, the first gate insulating film 606*a*, the second gate insulating film 606*b*, the insulating films 620 and 621, and the pixel electrode layer 624.

Figure 33:
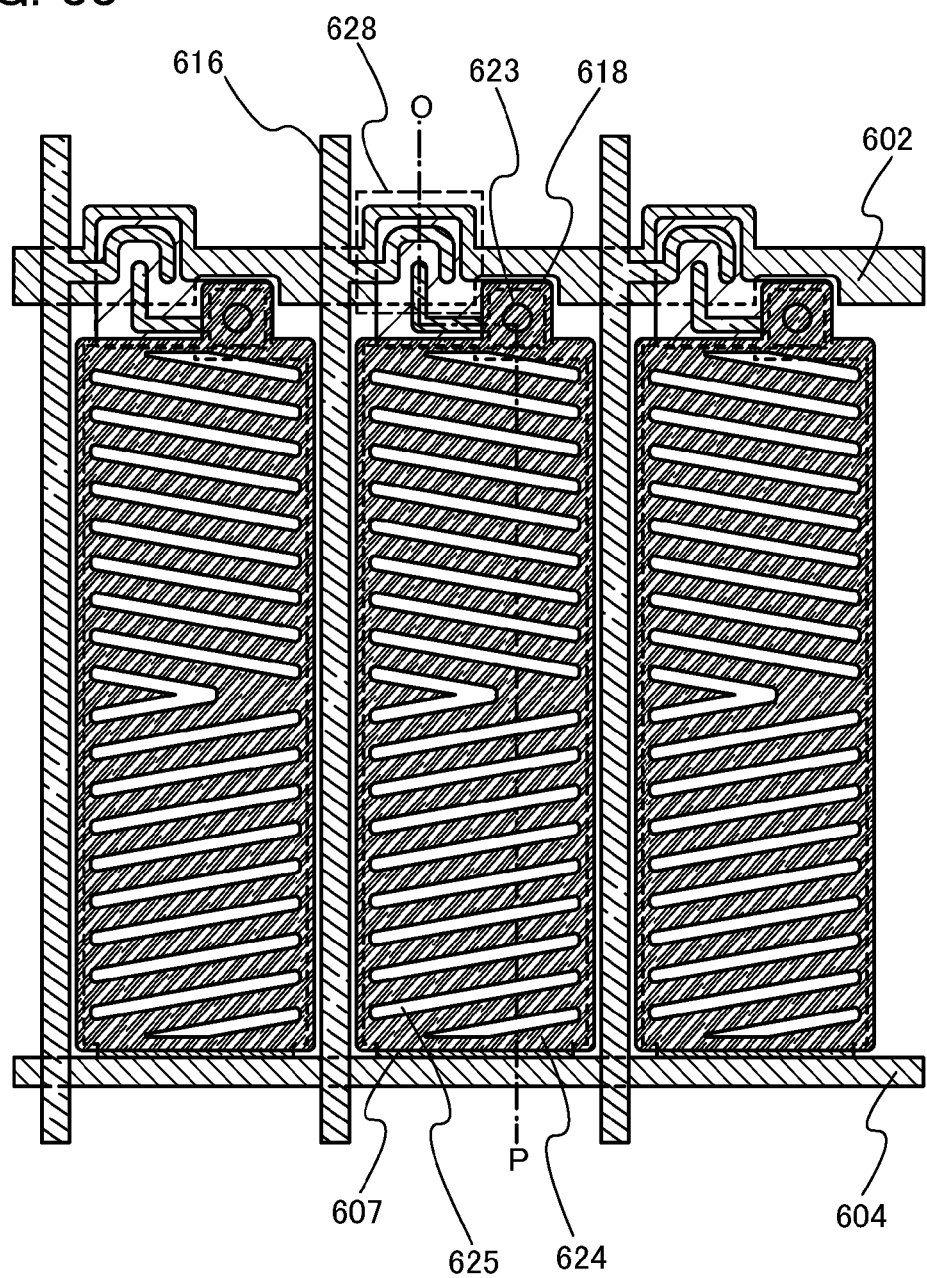
FIG. 33 illustrates a semiconductor device.

FIG. 33 is a plan view illustrating a structure of the pixel electrode. FIG. 32 illustrates a cross-sectional structure taken along section line O-P in FIG. 33. The pixel electrode layer 624 is provided with slits 625. The slits 625 are provided for controlling alignment of liquid crystals. In that case, an electric field is generated between the electrode layer 607 and the pixel electrode layer 624. The thicknesses of the first gate insulating film 606*a* and the second gate insulating film 606*b* formed between the electrode layer 607 and the pixel electrode layer 624 are each 50 nm to 200 nm, which is much smaller than the thickness of the liquid crystal layer of 2 µm to 10 µm. Thus, an electric field is generated substantially in parallel (in a horizontal direction) to the substrate 600. The alignment of the liquid crystals is controlled with this electric field. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle. In addition, since both the electrode layer 607 and the pixel electrode layer 624 are light-transmitting electrodes, an aperture ratio can be increased.

Next, a different example of the liquid crystal display device in the horizontal electric field mode is described.

Figure 34:
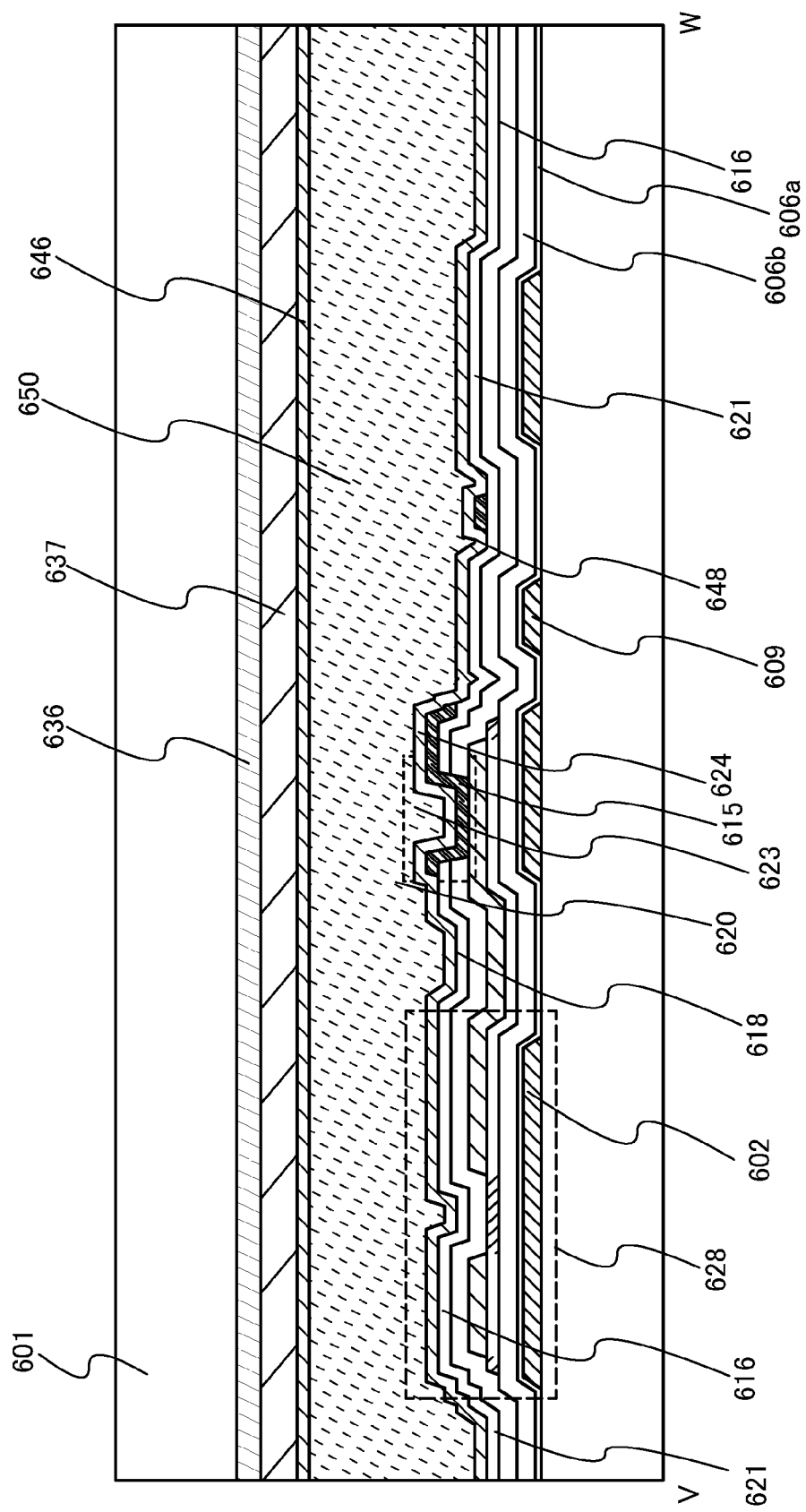
FIG. 34 illustrates a semiconductor device.
Figure 35:
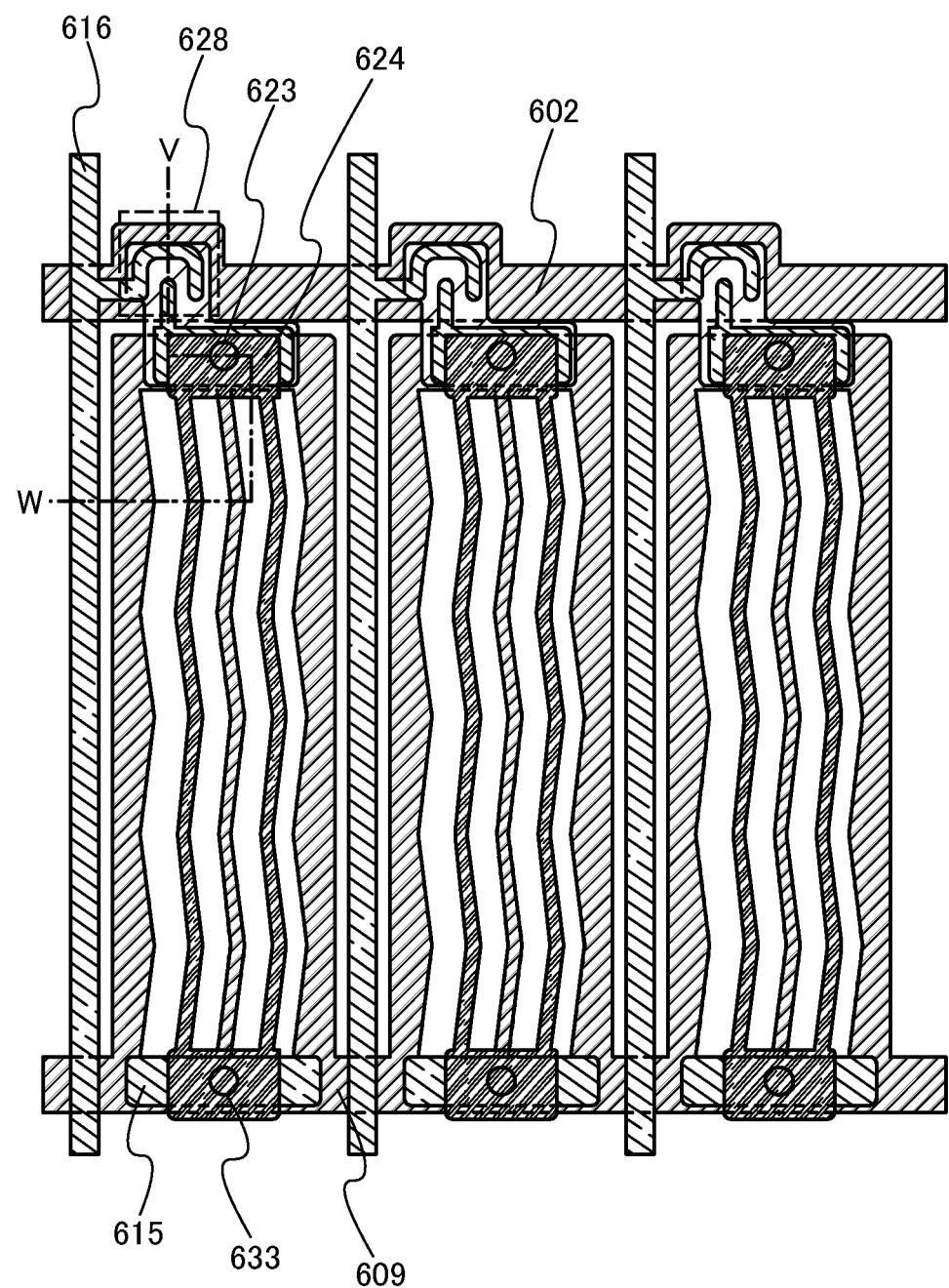
FIG. 35 illustrates a semiconductor device.

FIG. 34 and FIG. 35 illustrate a pixel structure of a liquid crystal display device in an IPS mode. FIG. 35 is a plan view.

FIG. 34 illustrates a cross-sectional structure taken along section line V-W in FIG. 35. Description below is given with reference to both the drawings.

In FIG. 34, the substrate 600 over which the TFT 628 and the pixel electrode layer 624 connected to the TFT 628 are formed overlaps with the counter substrate 601, and liquid crystals are injected between the substrate 600 and the counter substrate 601. The counter substrate 601 is provided with the coloring film 636, the planarization film 637, and the like. Note that a counter electrode is not provided on the counter substrate 601 side. The liquid crystal layer 650 is formed between the substrate 600 and the counter substrate 601 with the alignment films 646 and 648 interposed therebetween.

A common potential line 609 and the TFT 628 are formed over the substrate 600. The common potential line 609 can be formed at the same time as the gate wiring 602 of the TFT 628. The pixel electrode layer 624 is divided almost in a pixel form. The thin film transistor described in any of Embodiments 1 to 6 can be used as the TFT 628.

The wirings 616 and 618 of the TFT 628 are formed over the first gate insulating film 606a and the second gate insulating film 606b. The wiring 616 is a data line through which a video signal travels, extends in one direction in a liquid crystal display panel, is connected to a source or drain region of the TFT 628, and functions as one of source and drain electrodes. The wiring 618 functions as the other of the source and drain electrodes and is connected to the pixel electrode layer 624.

The insulating film 620 is formed over the wirings 616 and 618, and the insulating film 621 is formed over the insulating film 620. In addition, over the insulating film 621, the pixel electrode layer 624 is formed to be connected to the wiring 618 in the contact hole 623 formed in the insulating films 620 and 621. The pixel electrode layer 624 is formed using a material similar to that of the pixel electrode layer 427 described in Embodiment 1. Note that, as illustrated in FIG. 35, the pixel electrode layer 624 is formed such that the pixel electrode layer 624 and a comb-like electrode that is formed at the same time as the common potential line 609 can generate a horizontal electric field. Further, the pixel electrode layer 624 is formed so that comb-teeth portions of the pixel electrode layer 624 and those of the comb-like electrode that is formed at the same time as the common potential line 609 are alternately arranged.

The alignment of the liquid crystals is controlled by an electric field generated between an electric potential applied to the pixel electrode layer 624 and an electric potential of the common potential line 609. Liquid crystal molecules are horizontally rotated with the use of the electric field in the direction substantially parallel to the substrate. In that case, the liquid crystal molecules are horizontally aligned in any state, and thus the contrast or the like is less influenced by the viewing angle, which leads to a wider viewing angle.

In such a manner, the TFT 628 and the pixel electrode layer 624 connected to the TFT 628 are formed over the substrate 600. A storage capacitor is formed with the common potential line 609 and a capacitor electrode layer 615 and the first gate insulating film 606a and the gate insulating film 606b which are provided between the common potential line 609 and the capacitor electrode layer 615. The capacitor electrode layer 615 and the pixel electrode layer 624 are connected to each other in a contact hole 623.

Next, a mode of a liquid crystal display device in a TN mode is described.

Figure 36:
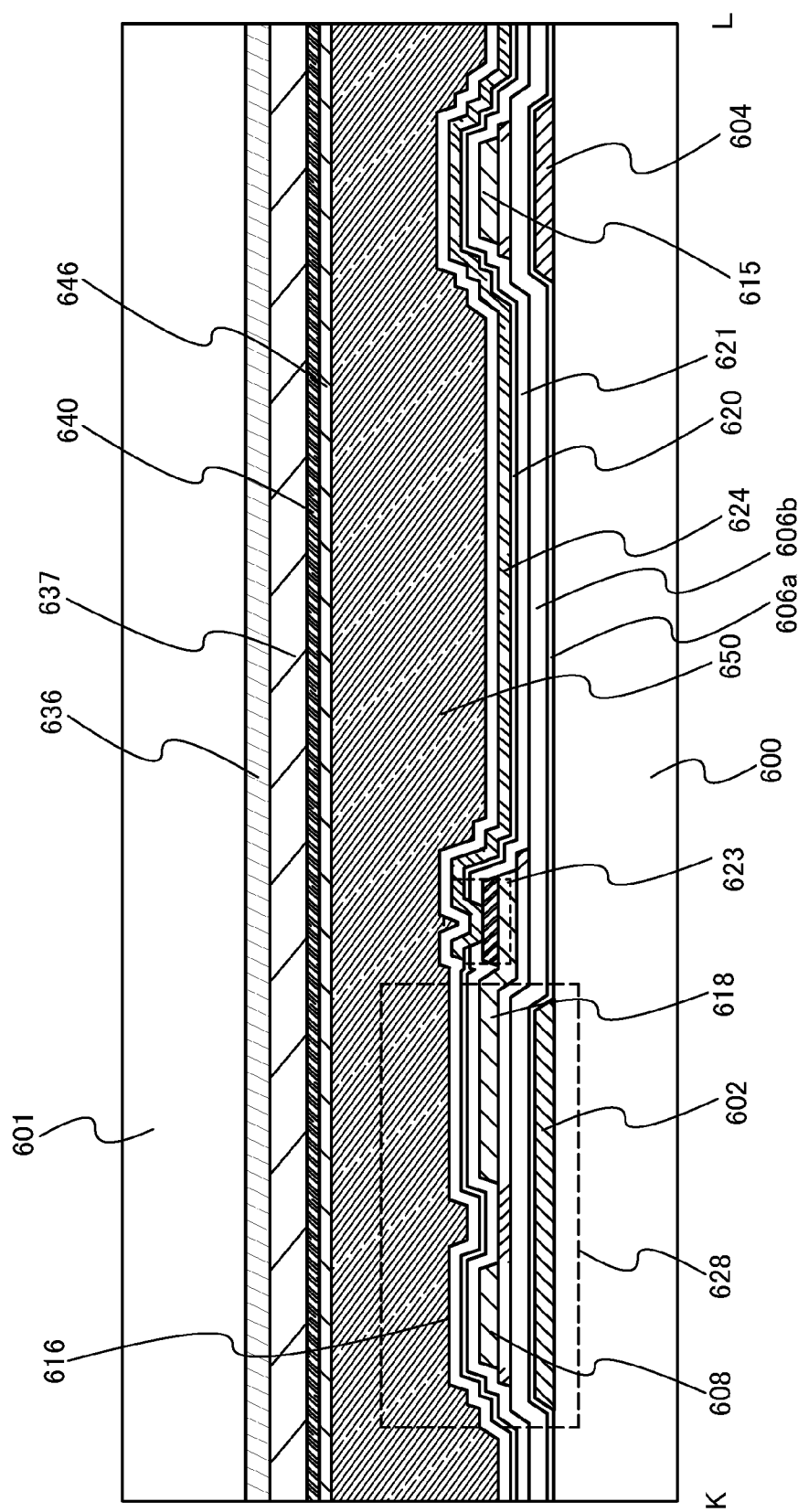
FIG. 36 illustrates a semiconductor device.
Figure 37:
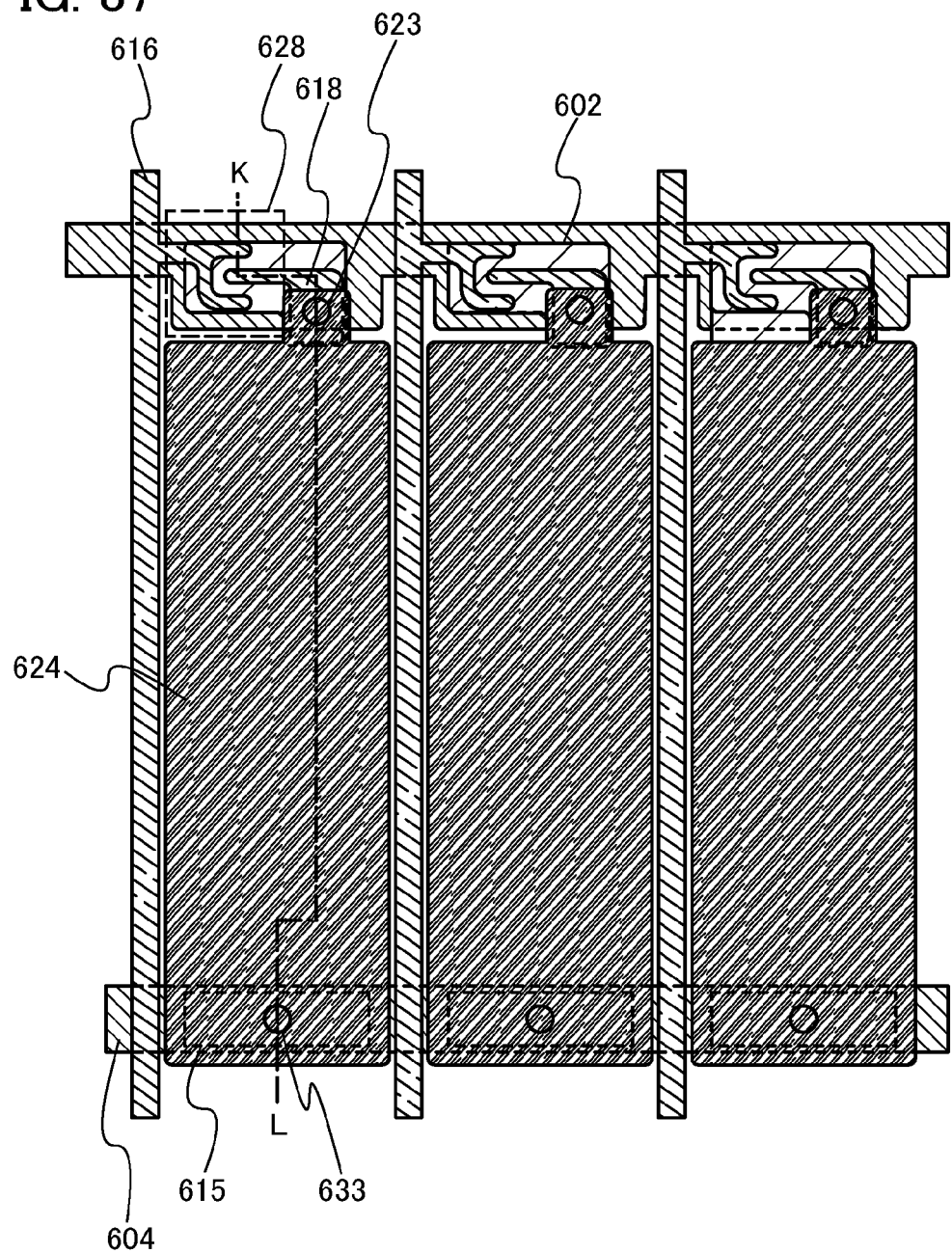
FIG. 37 illustrates a semiconductor device.

FIG. 36 and FIG. 37 illustrate a pixel structure of a liquid crystal display device in a TN mode. FIG. 37 is a plan view. FIG. 36 illustrates a cross-sectional structure taken along section line K-L in FIG. 37. Description below is given with reference to both the drawings.

The pixel electrode layer 624 is connected to the TFT 628 through the wiring 618 through the contact hole 623 formed in the insulating films 620 and 621. The wiring 616 functioning as a data line is connected to the TFT 628. The TFT described in any of Embodiments 1 to 5 can be used as the TFT 628.

The pixel electrode layer 624 is formed using the pixel electrode layer 427 described in Embodiments 1 to 5. The capacitor wiring 604 can be formed at the same time as the gate wiring 602 of the TFT 628. The first gate insulating film 606a and the second gate insulating film 606b are formed over the gate wiring 602 and the capacitor wiring 604. A storage capacitor is formed with the first gate insulating film 606a and the second gate insulating film 606b, the capacitor wiring 604, and the capacitor electrode layer 615. The capacitor electrode layer 615 and the pixel electrode layer 624 are connected to each other through the contact hole 633.

The counter substrate 601 is provided with the coloring film 636 and the counter electrode layer 640. The planarization film 637 is formed between the coloring film 636 and the counter electrode layer 640 to prevent alignment disorder of liquid crystals. The liquid crystal layer 650 is formed between the pixel electrode layer 624 and the counter electrode layer 640 with the alignment films 646 and 648 interposed therebetween.

The pixel electrode layer 624, the liquid crystal layer 650, and the counter electrode layer 640 overlap with each other, whereby a liquid crystal element is formed.

The coloring film 636 may be formed on the substrate 600 side. A polarizing plate is attached to a surface of the substrate 600, which is the reverse of the surface provided with the thin film transistor, and a polarizing plate is attached to a surface of the counter substrate 601, which is the reverse of the surface provided with the counter electrode layer 640.

Through the above-described process, liquid crystal display devices can be manufactured as display devices. The liquid crystal display devices of this embodiment each have a high aperture ratio.

This application is based on Japanese Patent Application serial no. 2009-185315 filed with Japan Patent Office on Aug. 7, 2009, the entire contents of which are hereby incorporated by reference.

What is claimed is:

1. A semiconductor device comprising:
   a pixel portion over a substrate, the pixel portion including a first transistor; and
   a driver circuit portion over the substrate, the driver circuit portion including a second transistor,
   wherein the first transistor includes:
      a first gate electrode layer over the substrate;
      a gate insulating layer over the first gate electrode layer;
      a first oxide semiconductor layer over the gate insulating layer;
      a first source electrode layer and a first drain electrode layer over the first oxide semiconductor layer;
      a first conductive layer on and in contact with a part of the first source electrode layer or a part of the first drain electrode layer;
      a first oxide insulating layer over the gate insulating layer, the first oxide semiconductor layer, the first source electrode layer, and the first drain electrode layer, the first oxide insulating layer being in contact with at least a part of the first oxide semiconductor layer between the first source electrode layer and the first drain electrode layer, and a pixel electrode layer over the first oxide insulating layer, the pixel electrode layer electrically connected to the first conductive layer, wherein the second transistor includes:
  a second gate electrode layer over the substrate;
  the gate insulating layer over the second gate electrode layer;
  a second oxide semiconductor layer over the gate insulating layer;
  a second source electrode layer and a second drain electrode layer over the second oxide semiconductor layer; and
  a second oxide insulating layer over the second oxide semiconductor layer, the second source electrode layer and the second drain electrode layer, the second oxide insulating layer being in contact with the second oxide semiconductor layer, wherein each of the first gate electrode layer, the gate insulating layer, the first oxide semiconductor layer, the first source electrode layer, the first drain electrode layer, the first oxide insulating layer, and the pixel electrode layer includes light-transmitting properties, wherein a material of the second source electrode layer and the second drain electrode layer is different from a material of the first source electrode layer and the first drain electrode layer, and wherein the material of the second source electrode layer and the second drain electrode layer is a conductive material having a lower resistance than the material of the first source electrode layer and the first drain electrode layer.

2. The semiconductor device according to claim 1, wherein the second source electrode layer and the second drain electrode layer comprise a metal film containing an element selected from the group consisting of Al, Cr, Cu, Ta, Ti, Mo, and W, or a stack including an alloy film containing any of the above elements.

3. The semiconductor device according to claim 1, wherein the first conductive layer comprises a material containing an element selected from the group consisting of Al, Cr, Cu, Ta, Ti, Mo, and W, or a stack including an alloy film containing any of the above elements.

4. The semiconductor device according to claim 1, wherein the first source electrode layer, the first drain electrode layer, and the pixel electrode layer comprise an indium oxide, an indium oxide-tin oxide alloy, an indium oxide-zinc oxide alloy, or a zinc oxide.

5. The semiconductor device according to claim 1, further comprising:
  a capacitor portion over the substrate,
  wherein the capacitor portion includes a capacitor wiring and a capacitor electrode layer overlapping with the capacitor wiring, and
  wherein each of the capacitor wiring and the capacitor electrode layer includes light-transmitting properties.

6. The semiconductor device according to claim 1, further comprising:
  a second conductive layer overlapping with the second gate electrode layer, over the second oxide insulating layer.

7. The semiconductor device according to claim 6, wherein the second conductive layer comprises the same material as the pixel electrode layer.

8. The semiconductor device according to claim 7, further comprising:

an oxide conductive layer between the second oxide semiconductor layer and the second source electrode layer, and between the second oxide semiconductor layer and the second drain electrode layer, wherein the oxide conductive layer comprises the same material as the first source electrode layer and the first drain electrode layer of the first transistor.

9. The semiconductor device according to claim 1, wherein each of the first oxide semiconductor layer and the second oxide semiconductor layer comprises indium, zinc, and a metal which is a different metal from indium and zinc.

10. The semiconductor device according to claim 9, wherein the metal is selected from gallium, iron, nickel, manganese, cobalt, tin, and aluminum.

11. The semiconductor device according to claim 1, wherein each of the first oxide semiconductor layer and the second oxide semiconductor layer is amorphous.

12. A semiconductor device comprising:
  a pixel portion over a substrate, the pixel portion comprising a first transistor and a capacitor portion; and
  a driver circuit portion over the substrate, the driver circuit portion comprising a second transistor,
  wherein each of the first transistor and the second transistor comprises:
    a gate electrode layer;
    a gate insulating layer adjacent to the gate electrode layer,
    an oxide semiconductor layer adjacent to the gate electrode layer with the gate insulating layer therebetween, the oxide semiconductor layer comprising a channel region;
    a source electrode layer and a drain electrode layer over the oxide semiconductor layer; and
    an oxide insulating layer over and in contact with the oxide semiconductor layer, the source electrode layer and the drain electrode layer,
  wherein the oxide semiconductor layer is located between the gate insulating layer and the oxide insulating layer,
  wherein a pixel electrode layer is electrically connected to the drain electrode layer of the first transistor via a first conductive layer,
  wherein the source electrode layer and the drain electrode layer of the second transistor comprise the same material as the first conductive layer, and
  wherein each of the gate electrode layer, the source electrode layer, the drain electrode layer, and the capacitor portion in the pixel portion comprises light-transmitting properties.

13. The semiconductor device according to claim 12, wherein each of the oxide semiconductor layer of the first transistor and the oxide semiconductor layer of the second transistor comprises indium, zinc, and a metal which is a different metal from indium and zinc.

14. The semiconductor device according to claim 13, wherein the metal is selected from gallium, iron, nickel, manganese, cobalt, tin, and aluminum.

15. The semiconductor device according to claim 12, wherein the oxide semiconductor layer is over the gate electrode layer.

16. The semiconductor device according to claim 15, further comprising:
  a second conductive layer overlapping with the gate electrode layer of the second transistor, over the oxide insulating layer.

17. The semiconductor device according to claim 12, wherein each of the oxide semiconductor layer of the first transistor and the oxide semiconductor layer of the second transistor is amorphous.

18. The semiconductor device according to claim 12, wherein the first conductive layer comprises a metal material.

19. The semiconductor device according to claim 12, wherein each of the gate insulating layer, the oxide semiconductor layer, and the oxide insulating layer comprises light-transmitting properties.

20. The semiconductor device according to claim 12,
wherein the capacitor portion comprises a capacitor wiring layer and a capacitor electrode layer overlapping with the capacitor wiring, and
wherein each of the capacitor wiring layer and the capacitor electrode layer comprises light-transmitting properties.

* * * * *